(12) United States Patent
Ogata et al.

(10) Patent No.: US 10,481,391 B2
(45) Date of Patent: Nov. 19, 2019

(54) MOVABLE REFLECTIVE ELEMENT AND TWO-DIMENSIONAL SCANNING DEVICE

(71) Applicant: DAI-ICHI SEIKO CO., LTD., Kyoto-shi, Kyoto (JP)

(72) Inventors: Kenji Ogata, Ogori (JP); Shinya Sakamoto, Ogori (JP); Yoshifumi Ikeda, Ogori (JP); Shogo Kurogi, Ogori (JP); Kazuhiro Okada, Ageo (JP); Satoshi Era, Ageo (JP)

(73) Assignee: DAI-ICHI SEIKO CO., LTD., Kyoto (JP)

( * ) Notice: Subject to any disclaimer, the term of this patent is extended or adjusted under 35 U.S.C. 154(b) by 233 days.

(21) Appl. No.: 15/579,547

(22) PCT Filed: Jun. 6, 2016

(86) PCT No.: PCT/JP2016/066791
§ 371 (c)(1),
(2) Date: Dec. 4, 2017

(87) PCT Pub. No.: WO2016/199730
PCT Pub. Date: Dec. 15, 2016

(65) Prior Publication Data
US 2018/0157031 A1 Jun. 7, 2018

(30) Foreign Application Priority Data
Jun. 9, 2015 (JP) .................................. 2015-116270

(51) Int. Cl.
*G02B 26/08* (2006.01)
*G02B 26/10* (2006.01)
(Continued)

(52) U.S. Cl.
CPC .......... *G02B 26/101* (2013.01); *B81B 3/0062* (2013.01); *G02B 7/182* (2013.01); *G02B 26/0858* (2013.01)

(58) Field of Classification Search
CPC .. G02B 26/101; G02B 7/182; G02B 26/0858; G02B 26/08; G02B 26/10; B81B 3/0062;
(Continued)

(56) References Cited

U.S. PATENT DOCUMENTS

2007/0171500 A1  7/2007  Jeong et al.
2012/0099175 A1  4/2012  Conrad et al.
(Continued)

FOREIGN PATENT DOCUMENTS

JP  2007-310196 A  11/2007
JP  2008-102362 A  5/2008
(Continued)

OTHER PUBLICATIONS

The Notice of Preliminary Rejection (KR Patent Application No. 10-2018-700439); dated Feb. 25, 2019; Includes English Translation; 16 pages.
(Continued)

*Primary Examiner* — Euncha P Cherry
(74) *Attorney, Agent, or Firm* — Howard & Howard Attorneys PLLC

(57) ABSTRACT

Actuators (140), which are a pair of members, are disposed one on either side of a movable frame (120) in the X-axis direction, and oscillate the movable frame (120) about the X axis in relation to a fixed frame (110) by deformation caused by stretching and contracting of piezoelectric elements. Actuators (150), which are a pair of members, are disposed one on either side of a mirror (130) in the Y-axis direction, and oscillate the mirror (130) about the Y axis in relation to the movable frame (120) by deformation caused by stretch-
(Continued)

ing and contracting of the piezoelectric elements. The length of each actuator (140) extending in the Y-axis direction is longer than a distance between an inner side of the fixed frame (110) to which the actuator (140) is connected and the middle point of an outer side of the movable frame (120) in the Y-axis direction.

22 Claims, 35 Drawing Sheets

(51) Int. Cl.
*B81B 3/00* (2006.01)
*G02B 7/182* (2006.01)

(58) Field of Classification Search
CPC ........... B81B 2203/058; B81B 3/0045; B81B 2203/0172; B81B 2201/042; B81B 2203/0181; B81B 3/00
USPC ...................................................... 359/212.1
See application file for complete search history.

(56) References Cited

U.S. PATENT DOCUMENTS

| | | | | |
|---|---|---|---|---|
| 2013/0258432 A1* | 10/2013 | Aimono | ............... | G02B 26/10 359/200.8 |
| 2016/0240768 A1 | 8/2016 | Fujii et al. | | |

FOREIGN PATENT DOCUMENTS

| | | | |
|---|---|---|---|
| JP | 4092283 | A | 5/2008 |
| JP | 2010-026147 | A | 2/2010 |
| JP | 2012-532350 | A | 12/2012 |
| JP | 2013-020124 | A | 1/2013 |
| JP | 2013-035081 | A | 2/2013 |
| JP | 2013-214023 | A | 10/2013 |
| JP | 2015-088521 | A | 5/2015 |
| KR | 100695170 | B1 | 3/2007 |

OTHER PUBLICATIONS

Interational Search Report and Written Opinion (International Application No. PCT/JP2016/066791) dated Aug. 9, 2016; 7 pages (Includes English Translation of International Search Report).

* cited by examiner

MOVABLE REFLECTIVE ELEMENT AND TWO-DIMENSIONAL SCANNING DEVICE

CROSS-REFERENCE TO RELATED APPLICATIONS

This application is a U.S. National Phase of International Application No. PCT/JP2016/066791, filed on Jun. 6, 2016, which claims the benefit of Japanese Patent Application No. 2015-116270, filed Jun. 9, 2015, including the specification, claims, and drawings, the entire disclosures of which is incorporated by reference herein.

TECHNICAL FIELD

The present disclosure relates to a movable reflective element and a two-dimensional scanner.

BACKGROUND ART

A movable reflective element capable of tilting a reflective surface is used as an element for controlling the direction of light beams or directional radio waves. Particularly, the movable reflective element capable of tilting the reflective surface with two axes of freedom is used as an installed component of a two-dimensional scanner for two-dimensional scanning of light beams or the like. The two-dimensional scanner for scanning light beams two-dimensionally using the movable reflective element is installed in, for example, a projector for projecting an image. The two-dimensional scanner for scanning directional radio waves two-dimensionally using the movable reflective element is installed in, for example, an onboard radar.

Recently, use of a micro-electro-mechanical system (MEMS) element that can be fabricated using semiconductor fabrication processes has been proposed for the movable reflective element. For example, Patent Literature 1 discloses a movable reflective element including outer actuators extending from inner sides of a fixed frame to a rotation axis of a movable frame, and inner actuators extending from the movable frame to a rotation axis (perpendicular to the rotation axis of the movable frame) of a mirror. The movable frame is oscillated by the outer actuators about one rotation axis at a low frequency (horizontal scanning frequency), while the mirror is oscillated by the inner actuators about the other rotation axis at a high frequency (vertical scanning frequency). Use of such a movable reflective element enables light reflected by the mirror to be scanned two-dimensionally in the horizontal and vertical directions.

CITATION LIST

Patent Literature

Patent Literature 1: Japanese Patent No. 4092283

SUMMARY OF INVENTION

Technical Problem

For the movable reflective element for two-dimensional scanning, a ratio of the vertical scanning frequency to the horizontal scanning frequency may be on the order of one tenth, depending on the device in which the movable reflective element is installed. A desired approach for low-voltage driving of the outer and inner actuators with such a ratio is to set a ratio of a frequency of the inner actuator to a frequency of the outer actuator to be on the order of one tenth. Setting of the frequency ratio to be on the order of one tenth requires the outer actuator to have a length significantly greater than the length of the inner actuator.

In the movable reflective element disclosed in Patent Literature 1, however, the length of the outer actuator is limited to a distance between an inner side of the fixed frame and a middle point of an outer side of the movable frame in which a rotation shaft is provided. This limitation poses difficulties in lowering the frequency ratio between the outer and inner actuators to the desired value.

The present disclosure has been made to overcome the above difficulties, and an objective of the present disclosure is to provide a movable reflective element and a two-dimensional scanner that are capable of achieving miniaturization and the optimal frequency ratio.

Solution to Problem

To achieve the foregoing objective, a movable reflective element according a first aspect of the present disclosure includes:

a plate-like fixed frame;

a plate-like movable frame disposed within the fixed frame to define a gap between the movable frame and the fixed frame;

a plate-like mirror including a reflective surface and disposed within the movable frame to define a gap between the mirror and the movable frame;

first actuators that are a pair of linear flexible members, each first actuator connecting the fixed frame to the movable frame and including piezoelectric elements formed in an extension extending in a first direction from an inner side of the fixed frame, the piezoelectric elements stretching and contracting in the first direction, the first actuators being disposed one on either side of the movable frame in a second direction that intersects the first direction, wherein deformation of the first actuators caused by stretching and contracting of the piezoelectric elements oscillates the movable frame about a first rotation axis in relation to the fixed frame; and second actuators that are a pair of linear flexible members, each second actuator connecting the movable frame to the mirror and including piezoelectric elements formed in an extension extending in the second direction from an inner side of the movable frame, the piezoelectric elements stretching and contracting in the second direction, the second actuators are disposed one on either side of the mirror in the first direction, wherein deformation of the second actuators caused by stretching and contracting of the piezoelectric elements oscillates the mirror about a second rotation axis in relation to the movable frame, the second rotation axis intersecting the first rotation axis, wherein the extension of each first actuator in the first direction has a length that is longer than a distance between the inner side of the fixed frame to which the first actuator is connected and a middle point of an outer side of the movable frame in the first direction.

Each first actuator may include:

a first arm including the piezoelectric elements and having one end connected to the inner side of the fixed frame, the first arm linearly extending in the first direction in the gap between the fixed frame and the movable frame from the one end beyond the middle point of the outer side of the movable frame;

a second arm having one end connected to another end of the first arm, the second arm extending in the second direction; and a third arm having one end connected to another end of the second arm and another end connected to the middle point of the outer side of the movable frame, the third arm extending along the first arm from the other end of the second arm in a direction opposite to a direction extending from the one end to the other end of the first arm.

Each second actuator may include:

a fourth arm including the piezoelectric elements and having one end connected to the inner side of the movable frame, the fourth arm linearly extending in the second direction in the gap between the movable frame and the mirror from the one end beyond a middle point of an outer side of the mirror;

a fifth arm having one end connected to another end of the fourth arm, the fifth arm extending in the first direction; and a sixth arm having one end connected to another end of the fifth arm and another end connected to the middle point of the outer side of the mirror in the second direction, the sixth arm extending along the fourth arm from the other end of the fifth arm in a direction opposite to a direction extending from the one end to the other end of the fourth arm.

The first actuators that are the pair of members may be disposed with two-fold rotational symmetry around the mirror, the second actuators that are the pair of members may be disposed with two-fold rotational symmetry around the mirror, and an orientation of the first arm from the one end to the other end and an orientation of the fourth arm from the one end to the other end may be the same with respect to a rotational direction about the mirror.

The first actuators that are the pair of members may be disposed with two-fold rotational symmetry around the mirror, the second actuators that are the pair of members may be disposed with two-fold rotational symmetry around the mirror, and an orientation of the first arm from the one end to the other end and an orientation of the fourth arm from the one end to the other end may be opposite with respect to a rotational direction about the mirror.

Each second actuator may include a seventh arm including the piezoelectric elements and having one end connected to the inner side of the movable frame and another end connected to a corner portion of the mirror, the seventh arm extending linearly in the second direction in the gap between the movable frame and the mirror from the one end beyond a middle point of an outer side of the mirror.

Each first actuator may include an eighth arm including the piezoelectric elements and having one end connected to the inner side of the fixed frame and extending linearly in the first direction in the gap between the fixed frame and the movable frame from the one end beyond the middle point of the outer side of the movable frame, and each first actuator may be connected to the movable frame at a portion other than the middle point of the outer side of the movable frame without turning back at another end of the eighth arm.

Each first actuator may include a ninth arm extending in the second direction in the gap between the fixed frame and the movable frame from the other end of the eighth arm beyond the middle point of the outer side of the movable frame in the second direction and connected to a corner portion of the movable frame.

Each second actuator may include a tenth arm including the piezoelectric elements and having one end connected to the inner side of the movable frame and extending linearly in the second direction in the gap between the movable frame and the mirror from the one end beyond the middle point of the outer side of the mirror, and each second actuator may be connected to the mirror at a portion other than the middle point of the outer side of the mirror along the second direction without turning back at another end of the tenth arm.

Each second actuator may include an eleventh arm extending in the first direction from the other end of the tenth arm beyond a middle point of the outer side of the mirror in the first direction and connected to a corner portion of the mirror.

The movable frame may include recessed portions provided on two outer sides in the second direction, and each first actuator may include:

a twelfth arm including the piezoelectric elements and having one end connected to the inner side of the fixed frame, the twelfth arm extending linearly in the first direction in the gap between the fixed frame and the movable frame from the one end beyond the middle point of the outer side of the movable frame;

a thirteenth arm extending in the second direction from an other end of the twelfth arm to a middle point of the outer side of the movable frame; and a fourteenth arm having one end connected to the other end of the twelfth arm and an other end connected to the recessed portion.

Each second actuator may include:

a fifteenth arm including the piezoelectric elements and having one end connected to the movable frame, the fifteenth arm extending linearly in the second direction in the gap between the movable frame and the mirror from the one end beyond the middle point of the outer side of the mirror;

a sixteenth arm extending in the first direction in the gap between the movable frame and the mirror from an other end of the fifteenth arm to the middle point of the outer side of the movable frame; and a seventeenth arm having one end connected to another end of the sixteenth arm and another end connected to the middle point of the outer side of the mirror.

The movable reflective element may further include at least one of:

a first wide portion provided in a portion connecting each first actuator to the fixed frame, the first wide portion having a width larger than a width of the first actuator; or a second wide portion provided in a portion connecting each second actuator to the movable frame, the second wide portion having a width larger than a width of the second actuator.

Independently driven sets of the piezoelectric elements may be included in at least one of the first actuator or the second actuator.

The movable reflective element may include at least one of:

first detection electrodes each having a width smaller than a width of the first actuator, the first detection electrodes detecting displacement of the respective first actuators; or second detection electrodes each having a width smaller than a width of the second actuator, the second detection electrodes detecting displacement of the respective second actuators Each first detection electrode may be provided in a portion connecting the corresponding first actuator to the fixed frame, and each second detection electrode may be provided in a portion connecting the corresponding second actuator to the movable frame.

The movable frame may be formed thicker than the mirror.

At least one of the first actuator or the second actuator may have a width that varies from the fixed frame toward the movable frame or from the movable frame toward the mirror.

The movable frame may further include a weight attached thereto.

The movable reflective element may include at least one of:

a first restriction extending from the inner side of the movable frame and disposed in the gap between the movable frame and the mirror, the first restriction restricting movement of the mirror to the movable frame; or a second restriction extending from the inner side of the fixed frame and disposed in the gap between the fixed frame and the movable frame, the second restriction restricting movement of the movable frame to the fixed frame.

The mirror may have an outer periphery formed to avoid the first restriction and to have the center of gravity of the mirror in a stationary state to be the center of the mirror, and the movable frame may have an outer periphery formed to avoid the second restriction and to have the center of gravity of the movable frame in a stationary state to be the center of the movable frame.

A two-dimensional scanner according to a second aspect of the present disclosure includes:

the movable reflective element according to the present disclosure; and a controller for causing the movable reflective element to be driven two-dimensionally to perform two-dimensional scanning.

Advantageous Effects of Invention

According to the present disclosure, the length of the first actuator that extends in the first direction is longer than the distance between the inner side of the fixed frame to which the first actuator is connected and the middle point of the outer side of the movable frame in the first direction. In this way, the length of the first actuator can be significantly greater than the length of the second actuator. This enables the movable frame and the mirror to have a desired ratio of drive frequencies thereof while allowing for a compact size of the entire movable reflective element, which achieves miniaturization and the optimal frequency ratio.

BRIEF DESCRIPTION OF DRAWINGS

FIG. 1(A) is a top view of the main structure, and FIG. 1(B) is a side view of the main structure of FIG. 1(A);

FIG. 3(A) is a top view illustrating functions of components of the main structure, and FIG. 3(B) is a side cross-sectional view thereof taken along the XZ plane;

FIG. 4(A) is a top view of the main structure, and FIG. 4(B) is a side cross-sectional view of the main structure of FIG. 4(A), taken along the XZ plane;

FIG. 8(A) is a top view illustrating functions of components of the main structure, and FIG. 8(B) is a side cross-sectional view of the main structure taken along the XZ plane;

FIG. 9(A) is a top view of the main structure, and FIG. 9(B) is a side cross-sectional view of the main structure taken along the XZ plane;

FIG. 10(A) is a top view illustrating functions of components of the main structure, and FIG. 10(B) is a side cross-sectional view of the main structure (including a layer D) taken along the XZ plane;

FIG. 11(A) is a top view of the main structure, and FIG. 11(B) is a side cross-sectional view of the main structure taken along the XZ plane;

FIG. 12(A) is a top view illustrating functions of components of the main structure, and FIG. 12(B) is a side cross-sectional view of the main structure (including a layer D) taken along the XZ plane;

FIG. 13(A) is a top view of the main structure, and FIG. 13(B) is a side cross-sectional view of the main structure taken along the XZ plane;

FIG. 14(A) is a top view of the main structure, and FIG. 14(B) is a side view of the main structure taken along the XZ plane;

FIG. 16(A) is a top view illustrating functions of components of the main structure, and FIG. 16(B) is a side cross-sectional view of the main structure taken along the XZ plane;

FIG. 17(A) is a top view of the main structure, and FIG. 17(B) is a side cross-sectional view of the main structure taken along the XZ plane;

FIG. 19(A) is a top view illustrating functions of components of the main structure, and FIG. 19(B) is a side cross-sectional view of the main structure taken along the XZ plane;

FIG. 20(A) is a top view of the main structure, and FIG. 20(B) is side cross-sectional view of the main structure taken along the XZ plane;

FIG. 22(A) is a top view of the main structure, and FIG. 22(B) is a side view of the main structure;

FIG. 24(A) is a top view illustrating functions of component of the main structure, and FIG. 24(B) is a side cross-sectional view of the main structure taken along the XZ plane;

FIG. 25(A) is a top view of the main structure, and FIG. 25(B) is a side cross-sectional view of the main structure taken along the XZ plane;

FIG. 26(A) is a top view illustrating functions of component of the main structure, and FIG. 26(B) is a side cross-sectional view of the main structure taken along the XZ plane;

FIG. 27(A) is a top view of the variation, and FIG. 27(B) is a side cross-sectional view of the main structure of the movable reflective element of FIG. 27(A), taken along the XZ plane;

FIG. 32(A) is a top view of the main structure, and FIG. 32(B) is a side cross-sectional view of the main structure taken along the XZ plane.

DESCRIPTION OF EMBODIMENTS

Embodiments of the present disclosure are described in detail below with reference to the drawings.

Embodiment 1

First, Embodiment 1 of the present disclosure is described. In Embodiment 1, a basic structure of a movable reflective element 100 and the operation thereof are described. Movable reflective elements 100 of Embodiment 1 and below-described Embodiments 2-4 are designed based on similar ideas, and belong to the same group.

Figure 1:
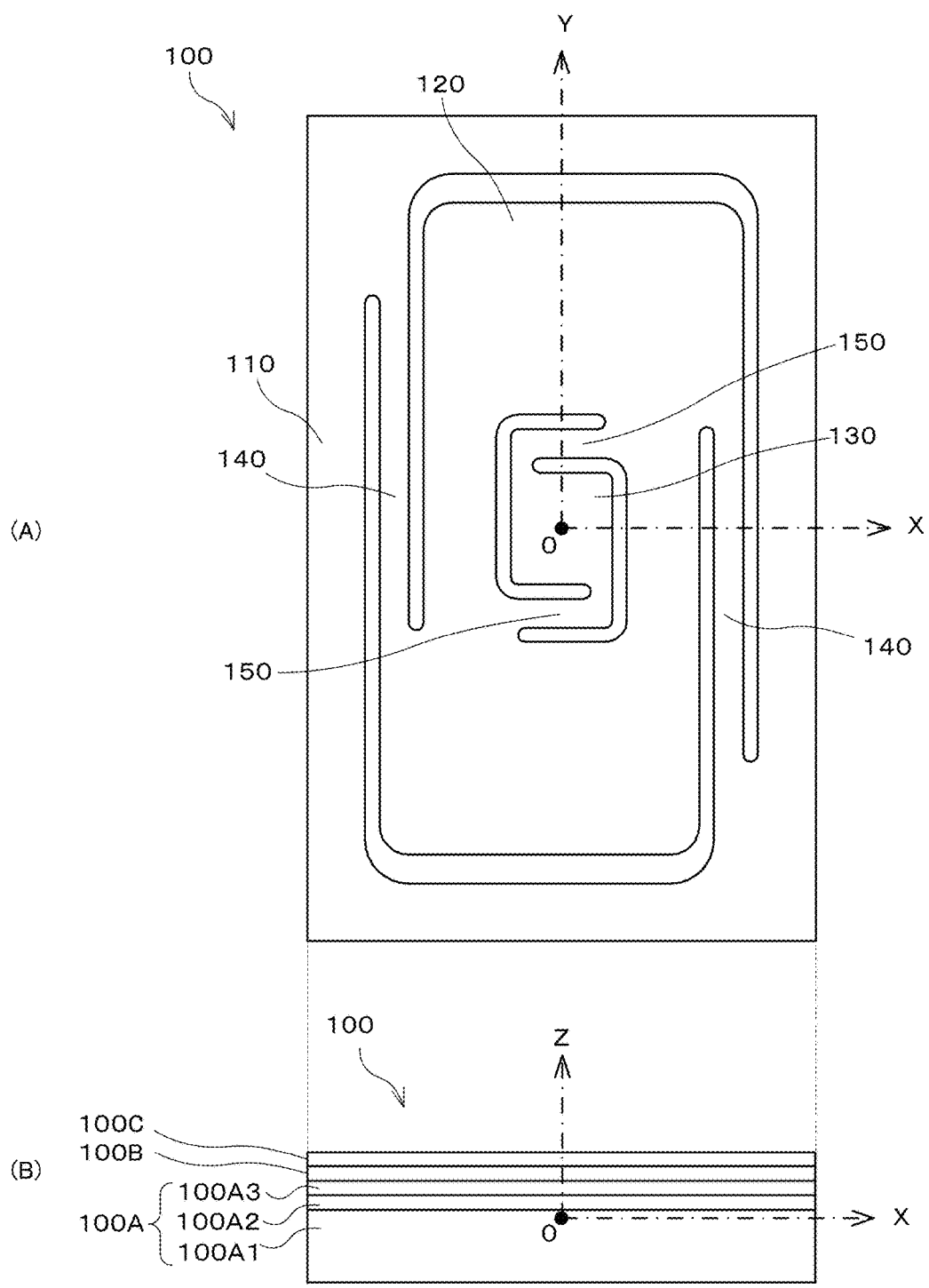
FIG. 1 illustrates a main structure (excluding a layer D described below) of a movable reflective element according to Embodiment 1 of the present disclosure.

Configuration of a Movable Reflective Element Excluding a Layer D Featuring a Reflective Surface and an Electrode Layer FIG. 1(A) is a top view of a main structure (excluding the layer D) of the movable reflective element 100 according to the present embodiment, and FIG. 1(B) is a side view of the main structure of the movable reflective element 100.

As illustrated in FIG. 1(A), the movable reflective element 100 is a generally rectangular plate-like element and has slits formed in the plate, and the following components, that is, a fixed frame 110, a movable frame 120, a mirror 130, and actuators 140 and 150, are formed in the movable reflective element 100.

The fixed frame 110 is a plate-like frame disposed at the outermost periphery. The movable frame 120 is a rectangular plate-like frame disposed inside the fixed frame 110. The mirror 130 is a rectangular plate-like member disposed inside the movable frame 120. The actuators 140 are a pair of members each connecting the fixed frame 110 to the movable frame 120. The actuators 150 are a pair of members each connecting the movable frame 120 to the mirror 130.

Here, an XYZ three-dimensional orthogonal coordinate system is defined with the origin O at the center of gravity of the mirror 130. In this XYZ coordinate system, in the drawing sheet of FIG. 1(A) as viewed from the front side, the left/right direction is defined as the X axis, the up/down direction as the Y axis, and the direction perpendicular to the drawing sheet as the Z axis.

The fixed frame 110 is fixed to an external object. The movable frame 120 and the mirror 130 are used without being fixed directly to the external object. The actuators 140 are disposed at both sides of the movable frame 120 in the X-axis direction between the fixed frame 110 and the movable frame 120 to connect the fixed frame 110 to the movable frame 120. The actuators 150 are disposed at both sides of the mirror 130 in the Y-axis direction between the movable frame 120 and the mirror 130 to connect the movable frame 120 to the mirror 130.

As illustrated in FIG. 1(B), the movable reflective element 100 has a laminated structure including, in order, an A layer 100A, a B layer 100B, and a C layer 100C arranged one above another. The A layer 100A is actually divided into three separate layers (100A1, 100A2, and 100A3). These three layers are described below.

Figure 2A:
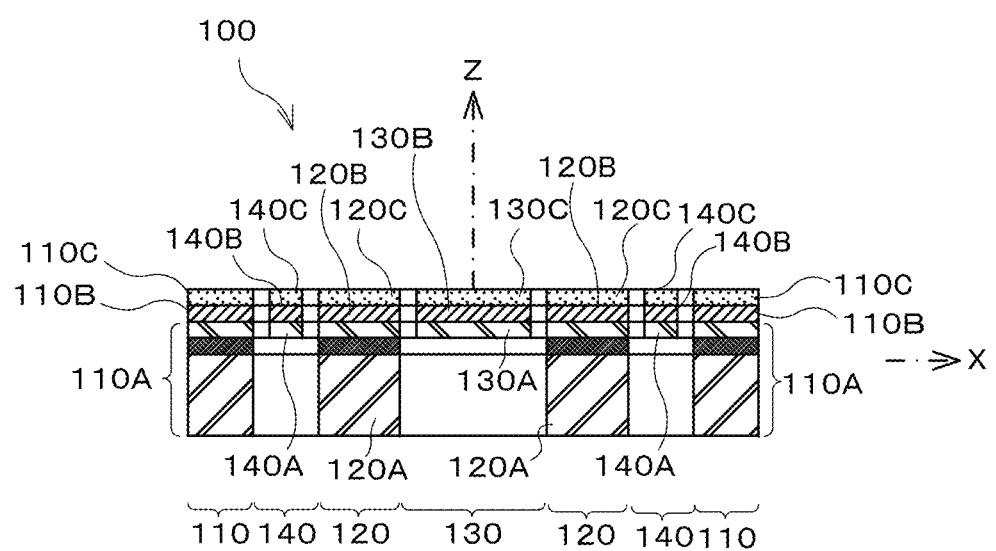
FIG. 2A is a side cross-sectional view of the main structure of the movable reflective element according to Embodiment 1 of the present disclosure, taken along the XZ plane.
Figure 2B:
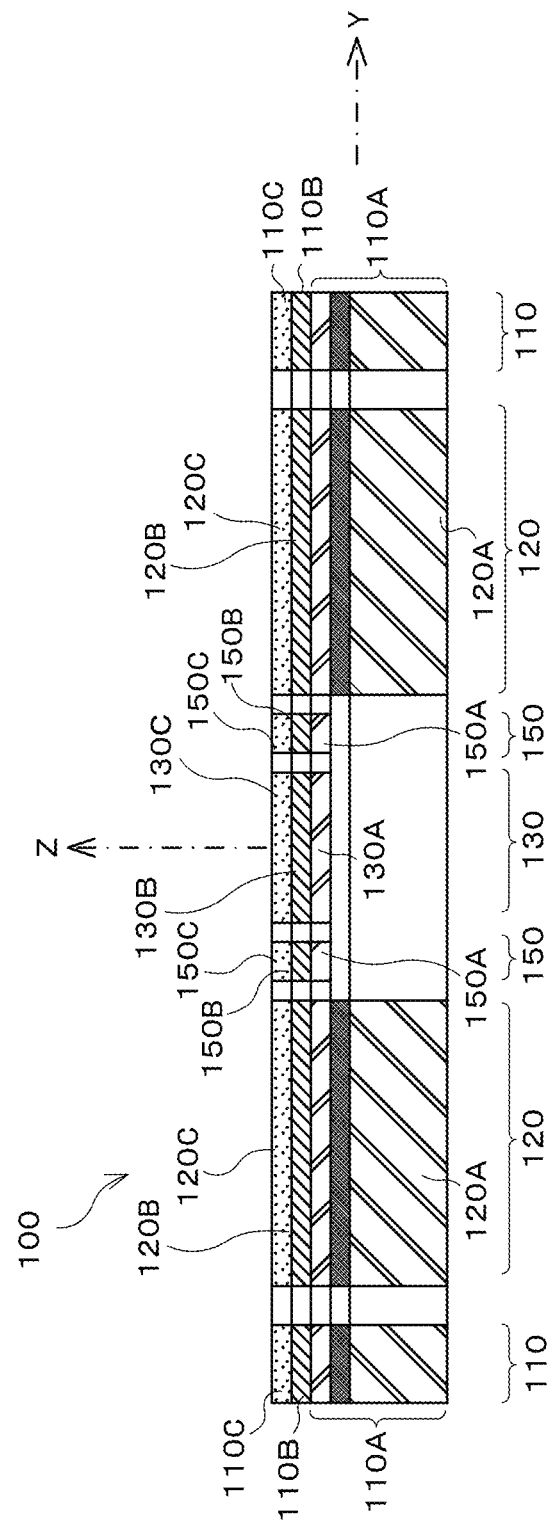
FIG. 2B is a side cross-sectional view of the main structure of the movable reflective element according to Embodiment 1 of the present disclosure, taken along the YZ plane.

FIG. 2A illustrates a cross section of a main structure of the movable reflective element 100, taken along the XZ plane. FIG. 2B illustrates a cross section of the main structure of the movable reflective element 100, taken along the YZ plane. As illustrated in FIGS. 2A and 2B, the fixed frame 110 includes a three-layer structure of an A layer 110A, a B layer 110B, and a C layer 110C. The movable frame 120 includes a three-layer structure of an A layer 120A, a B layer 120B, and a C layer 120C. The mirror 130 includes a three-layer structure of an A layer 130A, a B layer 130B, and a C layer 130C. The actuators 140 each include a three-layer structure of an A layer 140A, a B layer 140B, and a C layer 140C. The actuators 150 each include a three-layer structure of an A layer 150A, a B layer 150B, and a C layer 150C.

Inclusion of the A layers 130A, 140A, and 150A described above in the movable reflective element 100 is not essential. Specifically, the mirror 130 and the actuators 140 and 150 may have a two-layer structure of the B layers 130B, 140B, and 150B and the C layers 130C, 140C, and 150C, respectively.

As illustrated in FIGS. 2A and 2B, the mirror 130 and the actuators 140 and 150 are designed to have thicknesses smaller than the thicknesses of the fixed frame 110 and movable frame 120, and spaces are formed below the mirror 130 and the actuators 140 and 150. In addition, the increase in thickness of the movable frame 120 or the increase in lengths of the movable frame 120 along the X and Y axes enables the movable frame 120 to have a reduced drive frequency.

Figure 3:
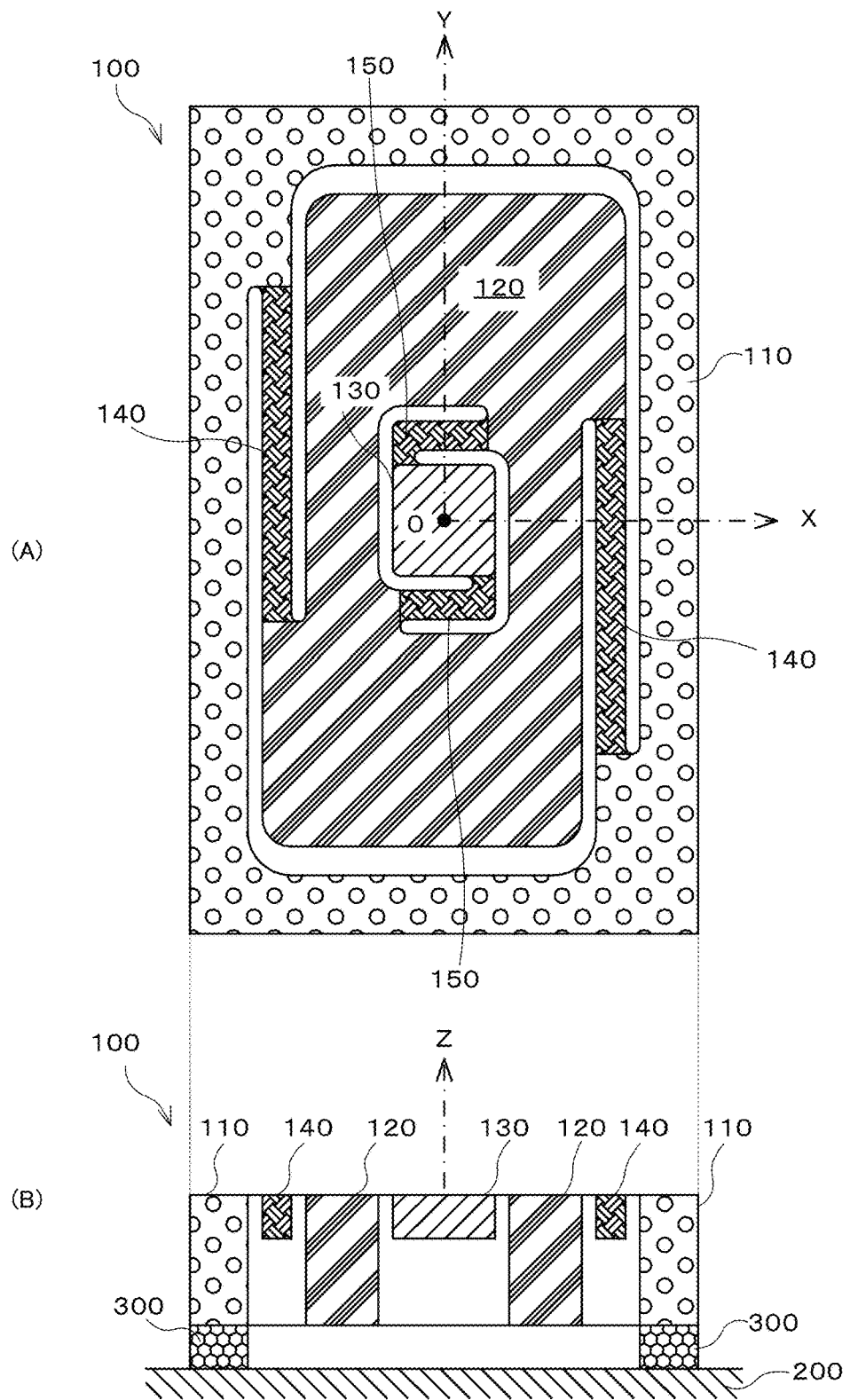
FIG. 3 illustrates the main structure of the movable reflective element according to Embodiment 1 of the present disclosure.

FIG. 3(A) is a top view illustrating functions of components of the main structure of the movable reflective element 100, and FIG. 3(B) is a side cross-sectional view of the main structure of the movable reflective element 100, taken along the XZ plane. The hatches in FIGS. 3(A) and 3(B) are not intended to indicate the cross-sections but rather functions of components.

The fixed frame 110 is depicted with a dot hatch pattern in FIG. 3(A). As illustrated in FIG. 3(B), the lower surface of the fixed frame 110 is fastened through a spacer 300 to the upper surface of a base plate 200. Rather than fastening the fixed frame 110 via the spacer 300 to the upper surface of the base plate 200 at the entire surface of the lower surface of the fixed frame 110, the fastening at the portions of the lower surface thereof may be sufficient.

In FIG. 3(A), the movable frame 120 is depicted with a hatch pattern of sets of four oblique lines with the sets spaced apart. As illustrated in FIG. 3(B), the movable frame 120 is suspended above the base plate 200 in a space surrounded by the fixed frame 110.

The actuators 140 are depicted with a basket-weave hatch pattern in FIG. 3(A). As illustrated in FIG. 3(B), the actuators 140 are suspended above the base plate 200 between the fixed frame 110 and the movable frame 120. The movable frame 120 is supported via the actuators 140 by the fixed frame 110. The actuators 140 have flexibility at least in the up/down direction (Z-axis direction), thereby enabling upward and downward bowing. This enables the actuators 140 to displace the movable frame 120 with respect to the fixed frame 110 within a predetermined degree of freedom.

The mirror 130 is depicted with a hatch pattern of equally spaced oblique lines in FIG. 3(A). A reflective surface (D layer 100D not illustrated) is formed at a +Z side on the upper surface of the mirror 130 as described below, and beams such as incident light, electromagnetic waves, or the like are reflected by the reflective surface.

The actuators 150 are depicted with a basket-weave hatch pattern in FIG. 3(A). The actuators 150 are suspended above the base plate 200 between the movable frame 120 and the mirror 130. The mirror 130 is supported via the actuators 150 by the movable frame 120. The actuators 150 have flexibility at least in the up/down direction (Z-axis direction) and are thus allowed to bow upwardly or downwardly. This enables the actuators 150 to displace the mirror 130 with respect to the movable frame 120 within a predetermined degree of freedom.

Figure 4:
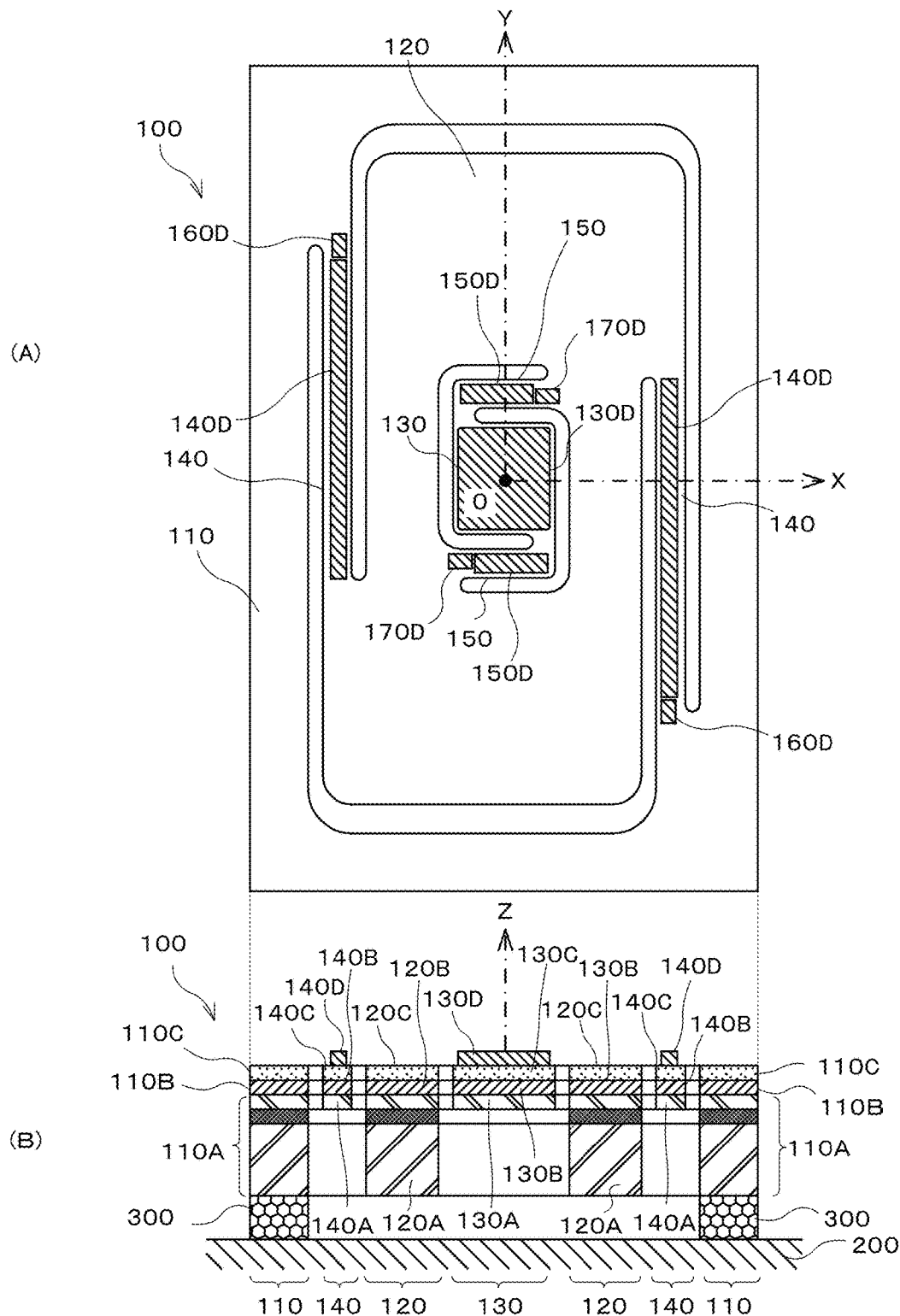
FIG. 4 illustrates a main structure (including the layer D) of the movable reflective element according to Embodiment 1 of the present disclosure.

Next, the overall configuration of the movable reflective element 100 is described. FIG. 4(A) is a top view of the main structure of the movable reflective element 100 according to the present embodiment, and FIG. 4(B) is a side cross-sectional view of the main structure of the movable reflective element 100, taken along the XZ plane. FIGS. 4(A) and 4(B) illustrate the movable reflective element 100 with the D layer 100D, which is not illustrated in FIGS. 1(A) and 1(B), added on the upper surface of the movable reflective element 100 illustrated in FIGS. 1(A) and 1(B).

As described above, the three layers of the A layer 100A, the B layer 100B, and the C layer 100C have the same planar view shapes (shapes indicated in the top view of FIG. 1(A)), but the planar view shape of the D layer 100D is different from those of the A layer 100A, the B layer 100B, and the C layer 100C. Portions (specifically, portions 140D, 150D, 160D, and 170D) of the D layer 100D are hatched in FIG. 4(A). The hatches of FIG. 4(A) are not intended to indicate the cross-sections but a pattern of planar view shape of the D layer.

The D layer 100D includes upper electrode layers 140D formed on the actuators 140, upper electrode layers 150D formed on the actuators 150, a reflective layer 130D formed on the mirror 130, and detection electrodes 160D and 170D. The D layer, other than wiring, is not formed in the fixed frame 110 or the movable frame 120. The wiring, however, is not depicted for the fixed frame 110 or the movable frame 120 illustrated in FIG. 4(A). The upper electrode layers 140D and 150D form electrodes for piezoelectric elements, and the reflective layer 130D forms a reflective surface of the mirror 130. There is no need for forming the D layer in the other areas.

As described above, the D layer serving as wiring is formed on the fixed frame 110. However, since the upper electrode layers 140D and 150D need to be electrically isolated to form discrete piezoelectric elements, forming the D layer having the same planar view shape over the entire upper surface of the C layer is not desirable.

Next, materials of the A layer 100A, the B layer 100B, the C layer 100C, and the D layer 100D included in the movable reflective element 100 are described. First, the A layer 100A is a substrate layer that is a support substrate for other layers, and is made of a material that allows for support of the B layer 100B, the C layer 100C, and the D layer 100D, which are formed on the upper surface of the A layer 100A. However, the actuators 140 and 150 need to have flexibility at least in the up/down direction (Z-axis direction). Specifically, the A layer 100A serving as the substrate layer is made of a material having some degree of flexibility so as to cause each of the actuators 140 and 150 to flex within a necessary range (the range necessary for tilting the mirror 130 at a required angle). In the present embodiment, a silicon substrate forms the A layer 100A. Specifically, as illustrated in FIG. 1(B), the A layer 100A has a three-layer structure of a support layer 100A1 of silicon, a buried oxide (BOX) layer (silicon dioxide insulation film) 100A2 formed on the support layer 100A1, an active layer 100A3 of silicon formed on the BOX layer 100A2.

The BOX layer 100A2 in the A layer 100A is not necessarily included, and the A layer 100A may have a two-layer structure of the support layer 100A1 and the active layer 100A3. That is, the A layer 100A may be a single silicon substrate.

The B layer 100B forms a lower electrode of the piezoelectric element. The D layer 100D forms an upper electrode of the piezoelectric element. Thus both of the layers are made of electrically conductive materials.

The C layer 100C forms a piezoelectric element, and is made of a piezoelectric material that exhibits a piezoelectric effect. For example, the C layer 100C is formed of a thin film of lead zirconate titanate (PZT) or potassium sodium niobate (KNN). In the present embodiment, the piezoelectric element has a sandwich structure including the piezoelectric material layer (C layer 100C) sandwiched between the electrically conductive material layers (B layer 100B and D layer 100D).

In the D layer 100D, the portions 140D formed in the actuators 140 and the portions 150D formed in the actuators 150 form the upper electrode layers for the respective piezoelectric elements, as described above. The D layer 130D formed in the mirror 130 serves as a reflective surface of the mirror 130. Thus, it suffices that the upper electrode layers 140D and 150D of the actuators 140 and 150 are electrically conductive, which means thus the surfaces of the upper electrode layers 140D and 150D do not need to be reflective. In contrast, it suffices that the surface of the D layer 130D formed in the mirror 130 is reflective, which means that the D layer 130D does not need to be electrically conductive.

However, in mass production of the movable reflective element 100, the upper electrode layers 140D and 150D and the reflective layer 130D are formed as the D layer 100D made of the same material. In this case, the material having functions of both the electrode layer and the reflective layer is used as the material of the D layer 100D.

Specifically, since the D layer 100D is required to have an upper surface serving as a reflective surface (mirror), the upper portion of the D layer 100D is desirably formed by a thin-film layer of material having high reflectivity and excellent resistance to corrosion, for example, gold (Au). The thin-film layer of gold (Au), which has a good resistivity to light and electromagnetic waves as well as an excellent resistance to corrosion, is able to retain stable reflective performance over a long period of time. The B layer 100B may be made of any metal layer since it suffices that the B layer 100B serves as the lower electrode (electrically conductive layer).

The movable reflective element 100 illustrated in FIG. 4(B) has a structure suitable for mass production. In particular, a method for fabricating a MEMS element using a semiconductor fabrication process is applicable to fabrication of the movable reflective element 100. The movable reflective element 100 illustrated in FIG. 4(B) includes, sequentially deposited on the upper surface of the silicon substrate 100A (A layer: substrate layer), a platinum layer 100B (B layer: lower electrode layer), a PZT layer 100C (C layer: piezoelectric material layer), and a platinum/gold layer 100D (D layer: layer having a two-layer structure of a platinum lower layer portion and a gold upper layer portion). Platinum is used for the upper electrode layer and the lower electrode layer because the use of platinum forms a good interface between the electrode layer and the PZT layer that is the piezoelectric material layer. In contrast, use of gold as the reflective layer is preferable as described above, and thus platinum suitable for the upper electrode layer is used for the lower layer portion of the D layer, and gold suitable for the reflective layer is used for the upper layer portion.

After formation of a four-layer laminated structure, the D layer 100D is patterned to leave only hatch areas illustrated in FIG. 4(A), and slits are formed through portions of the three-layer main structure of the A, B, and C layers in the up/down direction by etching or other process. Removal of portions of the actuators 140 and 150 and the mirror 130 at the lower surface side thereof by etching or the like provides a structure of the actuators 140 and 150 and the mirror 130 that are suspended above the base plate 200, as illustrated in FIG. 4(B).

Next, example dimensions of components of the movable reflective element 100 are described. The A layer 100A is a 5 mm×5 mm square×0.3 mm thick silicon substrate. The B layer 100B is an approximately 300 nm thick thin-film layer of platinum. The C layer 100C is an approximately 2 μm thick PZT layer. The D layer 100D is an approximately 300 nm thick thin-film layer of platinum/gold. Here, the thickness of the actuators 140 and 150 and the mirror 130 is 0.10 mm by etching of the silicon substrate 100A (A layer) at the lower surface thereof. This etching results in formation of a 0.20 mm gap between the lower surfaces of the actuators 140 and 150 and the mirror 130 and the upper surface of the base plate 200. In the top view of FIG. 4(A), the slit widths between the fixed frame 110 and the movable frame 120, between the fixed frame 110 and the actuator 140, and between the movable frame 120 and the actuator 150 are 0.3 mm, and the widths of the actuators 140 and 150 are 0.5 mm.

The dimension of each component can be optionally changed. The thickness, the width, and the length of each of the actuators 140 and 150 may be changed to any dimension that allows the mirror 130 to be flexible enough to tilt in a predetermined angular range (range satisfying performance necessary for a movable mirror). The thickness of the fixed frame 110 may be set to any dimension that allows the movable reflective element 100 to be firmly fixed on the base plate 200.

Movement of Actuators

Next, the movement of the actuators 140 and 150 is described. As illustrated in FIG. 4(B), the actuator 140 includes the A layer (substrate layer) 140A, the B layer (lower electrode layer) 140B, the C layer (piezoelectric material layer) 140C, and the D layer (upper electrode layer) 140D. The A layer (substrate layer) 140A is referred to as an "actuator body 140A". Portions having the three-layer structure of the B layer (lower electrode layer) 140B, the C layer (piezoelectric material layer) 140C, the D layer (upper electrode layer) 140D are referred to as "piezoelectric elements (140A, 140B, and 140C)". From this point of view, the actuator 140 can be regarded as including the flexible actuator body 140A and piezoelectric elements (140B, 140C, and 140D) fixed on the upper surface of the actuator body 140A.

Similarly, the actuator 150 includes the A layer (substrate layer) 150A, the B layer (lower electrode layer) 150B, the C layer (piezoelectric material layer) 150C, and the D layer (upper electrode layer) 150D, as illustrated in FIGS. 2B and 4(A). A portion of the A layer (substrate layer) 150A is referred to as an "actuator body 150A". Portions having the three-layer structure of the B layer (lower electrode layer) 150B, the C layer (piezoelectric material layer) 150C, the D layer (upper electrode layer) 150D are referred to as "piezoelectric elements". From this point of view, the actuator 150 is regarded as the actuator 150A having flexibility and piezoelectric elements (150B, 150C, and 150D) fixed on the upper surface of the actuator body 150A.

Figure 5A:
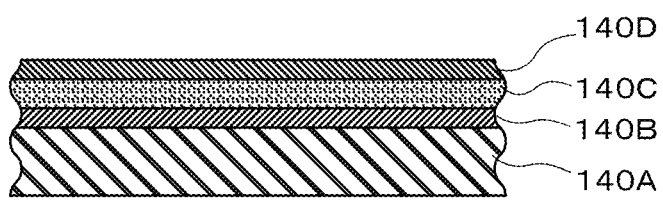
FIG. 5A is a first diagram illustrating a movement of an actuator in the movable reflective element.
Figure 5B:
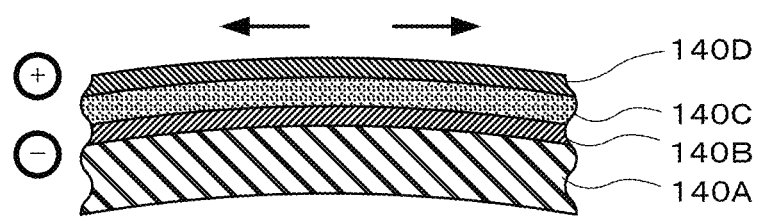
FIG. 5B is a second diagram illustrating a movement of the actuator in the movable reflective element.
Figure 5C:
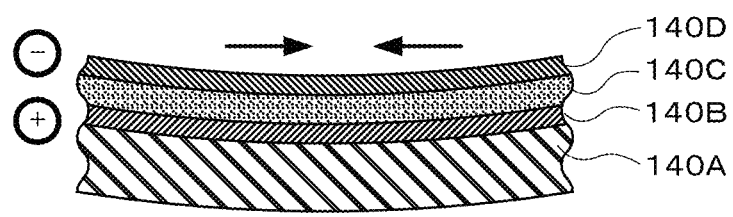
FIG. 5C is a third diagram illustrating a movement of the actuator in the movable reflective element.

FIGS. 5A, 5B, and 5C are cross-sectional views illustrating a movement of the actuator 140. As illustrated in FIG. 5A, the A layer 140A is the actuator body including a silicon substrate or the like, and the piezoelectric element is the three-layer structure of the B layer 140B, the C layer 140C, and the D layer 140D. The C layer (piezoelectric material layer) 140C has a property of stretching and contracting in a longitudinal direction (direction perpendicular to the thickness direction) upon application of a voltage having a predetermined polarity in the thickness direction.

When the voltage is applied across the electrode layers so that the D layer (upper electrode layer) 140D is positive and the B layer (lower electrode layer) 140B is negative, the C layer (piezoelectric material layer) 140C stretches in the longitudinal direction (direction perpendicular to the thickness direction). Conversely, the C layer (piezoelectric material layer) 140C has a property of contracting in the longitudinal direction when a voltage is applied across the electrode layers so that the D layer (upper electrode layer) 140D is negative and the B layer (lower electrode layer) 140B is positive. The degree of stretching and contracting depends on the applied voltage.

Thus, as illustrated in FIG. 5B, when the voltage is applied with such polarity that the D layer (upper electrode layer) 140D is positive and the B layer (lower electrode layer) 140B is negative, which polarity is hereinafter referred to as a positive polarity, the piezoelectric elements including the three layers of the B layer 140B, the C layer 140C, and the D layer 140D stretch in the longitudinal direction to cause the flexible A layer 140A to be stressed on the upper surface side in a direction of stretching in the plane (direction along the Y axis). As a result, the actuator 140 bows to become upwardly convex.

In contrast, as illustrated in FIG. 5C, when the voltage is applied with such polarity that the D layer (upper electrode layer) 140D is negative and the B layer (lower electrode layer) 140B is positive, which polarity is hereinafter referred to as a negative or reverse polarity, the piezoelectric elements including the three layers of the B layer, the C layer, and the D layer contract in the longitudinal direction to cause the flexible A layer 140A to be stressed on the upper surface side in a direction of contracting in the plane. As a result, the actuator 140 bows to become downwardly convex.

It is of course possible that the C layer (piezoelectric material layer) 140C has a property of contracting in the longitudinal direction when the voltage is applied across the electrode layers so that the D layer (upper electrode layer) 140D is positive and the B layer (lower electrode layer) 140B is negative, while the C layer 140C has a property of stretching in the longitudinal direction when the voltage is applied across the electrode layers so that the D layer (upper electrode layer) 140D is negative and the B layer (lower electrode layer) 140B is positive. In this case, the actuator 140 bows to become downwardly convex upon application of the voltage with the positive polarity, and bows to become upwardly convex upon application of the voltage with the negative polarity.

In either case, application of the voltage having the predetermined polarity across the D layer (upper electrode layer) 140D and the B layer (lower electrode layer) 140B causes deformation illustrated in FIG. 5B or 5C. The degree of deformation depends on the applied voltage. Since the piezoelectric element exhibits different polarization effects depending on the material thereof (e.g., bulk or thin film), the relationship between the polarity of the voltage and the stretching and contracting may be reversed.

The above-described movements also apply to the actuator 150.

Returning to FIG. 4(A), the detection electrodes 160D of the non-illustrated D layer 100D are provided for detection of displacement of the actuators 140. Each detection electrode 160D is formed to have a width smaller than the width of the actuator 140. The detection electrodes 170D are provided for detection of displacement of the actuators 150. Each detection electrode 170D is formed to have a width smaller than the width of the actuator 150. It suffices that at least one of the detection electrode 160D or the detection electrode 170D has a width smaller than the width of the corresponding actuator.

The detection electrode 160D is provided at a portion connecting the actuator 140 to the fixed frame 110, and the detection electrode 170D is provided at a portion connecting the actuator 150 to the movable frame 120. These portions are places where the actuators 140 and 150 deform greatly. Thus arrangement of the detection electrode 160D and 170D in such places enables stable detection of the displacement of the actuators 140 and 150.

As illustrated in FIG. 4(A), the mirror 130 is connected via the actuator 140, the movable frame 120, and the actuator 150 to the fixed frame 110, and is supported by suspension above the base plate 200 by the actuators 140 and 150. Thus, when the actuator 140 bows upwardly or downwardly, the mirror 130 supported in the suspended state tilts with the movable frame 120 about the X axis, that is, relative to the Y-axis direction. In contrast, when the actuator 150 bows upwardly or downwardly, the mirror 130 supported in the suspended state tilts about the Y axis, that is, relative to the X-axis direction.

Figure 6A:
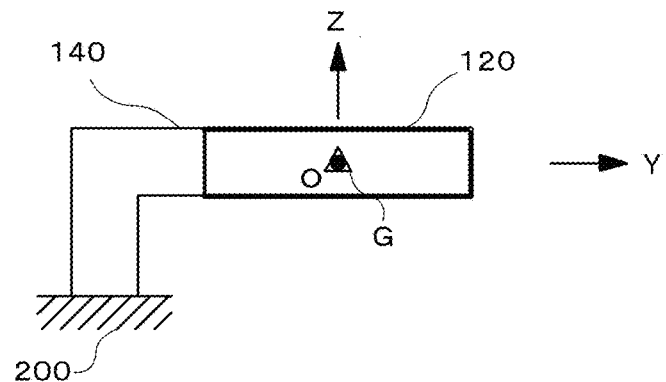
FIG. 6A is a first side view illustrating a state of the movable frame tilting relative to a Y-axis direction (rotating about the X axis) in the movable reflective element according to Embodiment 1 of the present disclosure.
Figure 6B:
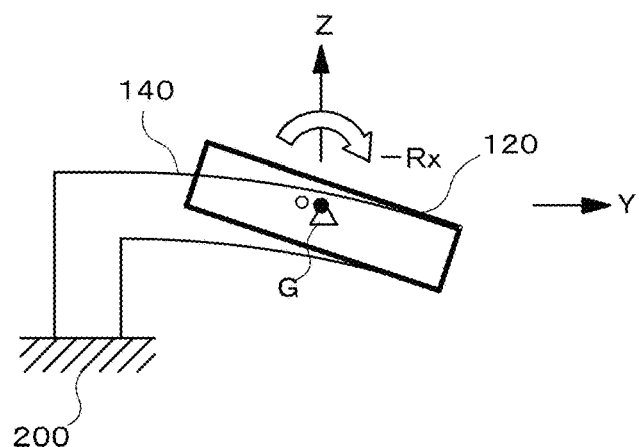
FIG. 6B is a second side view illustrating a state of the movable frame tilting relative to the Y-axis direction (rotating about the X axis) in the movable reflective element according to Embodiment 1 of the present disclosure.
Figure 6C:
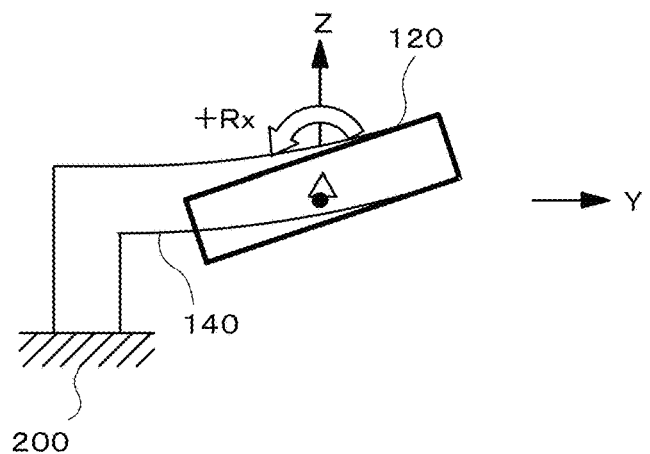
FIG. 6C is a third side view illustrating a state of the movable frame tilting relative to the Y-axis direction (rotating about the X axis) in the movable reflective element according to Embodiment 1 of the present disclosure.

FIGS. 6A, 6B, and 6C are side views illustrating a state of the movable frame 120 tilting relative to the Y-axis direction (rotating about the X axis) in the movable reflective element 100 illustrated in FIGS. 4(A) and 4(B). In FIGS. 6A to 6C, the movable frame 120 is depicted in bold, and the base plate 200 in the fixed state is hatched. The deformation of the actuator 140 is exaggerated relative to the actual state.

FIG. 6A illustrates a positional relationship between the actuator 140 and the movable frame 120 in a normal state in which no tilt occurs, that is, a state in which no voltage is applied to each piezoelectric element. The actuator 140 extends from the fixed frame 110 fixed on the base plate 200 toward the movable frame 120. The movable frame 120 is supported and kept horizontally above the base plate 200 via the actuator 140. A white triangle indicates the center of gravity G of the movable frame 120 (mirror 130). The center of gravity G coincides with the origin O of the coordinate system.

FIG. 6B illustrates a state in which the actuator 140 is caused to deform to become upwardly convex by application of the voltage with the positive polarity (see FIG. 5B) to the piezoelectric elements of the actuator 140. Since the actuator 140 is fixed to the fixed frame 110 on the −Y side, the upwardly convex deformation displaces the +Y side of the actuator 140 downwardly. This displacement causes rotation about the X axis of all the components in a connection path from the −Y end of the actuator 140 toward the mirror 130, and rotation −Rx about the X axis occurs in the mirror 130. Since the rotation direction in which a right-handed screw advances in the positive X direction is set to a positive direction here, the rotation direction in this case is a negative direction. During the rotation in the negative direction, the centers of gravity G of the movable frame 120 and the mirror 130 move downwardly.

FIG. 6C illustrates a state in which the actuator 140 is caused to deform to become downwardly convex by application of the voltage with the negative polarity (see FIG. 5C) to the piezoelectric elements of the actuator 140. Since the actuator 140 is fixed to the fixed frame 110 on the Y side, the downwardly convex deformation displaces the +Y end of the actuator 140 upwardly. This displacement causes rotation about the X axis of all the components in a connection path from the −Y end of the actuator 140 toward the mirror 130, and rotation +Rx about the X axis occurs in the movable frame 120. Thus, the centers of gravity G of the movable frame 120 and the mirror 130 move upwardly.

As described above, when the voltage of such polarity that the D layer (upper electrode layer) 140D side is positive is applied across the B layer (lower electrode layer) 140B and the D layer (upper electrode layer) 140D of the piezoelectric elements of the actuator 140, the +Y side of the movable frame 120 is enabled to move downwardly to tilt relative to the Y-axis direction, as illustrated in FIG. 6B. In contrast, application of the voltage with the reverse polarity enables the −Y side of the movable frame 120 to move downwardly to tilt relative to the Y-axis direction, as illustrated in FIG. 6C. The degree of tilt depends on the applied voltage. Thus adjusting the polarity and value of the applied voltage enables any adjustment of tilt angles of the movable frame 120 and the mirror 130 relative to the Y-axis direction.

Figure 7A:
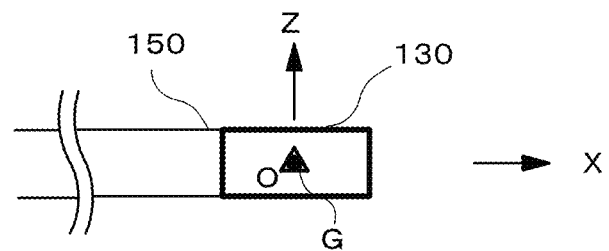
FIG. 7A is a first side view illustrating a state of a mirror tilting relative to the X-axis direction (rotating about the Y axis) in the movable reflective element according to Embodiment 1 of the present disclosure.
Figure 7B:
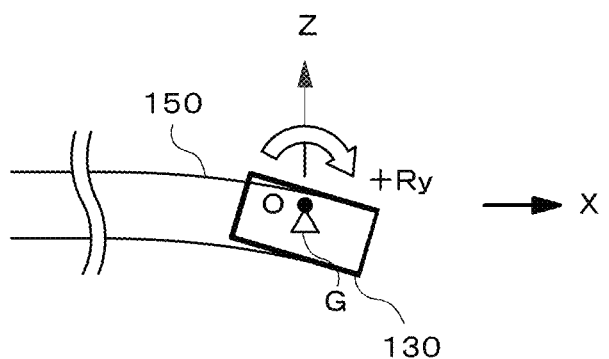
FIG. 7B is a second side view illustrating a state of the mirror tilting relative to the X-axis direction (rotating about the Y axis) in the movable reflective element according to Embodiment 1 of the present disclosure.
Figure 7C:
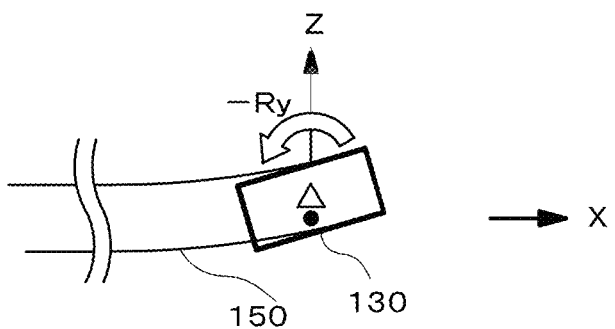
FIG. 7C is a third side view illustrating a state of the mirror tilting relative to the X-axis direction (rotating about the Y axis) in the movable reflective element according to Embodiment 1 of the present disclosure.

FIGS. 7A to 7C are side views illustrating a state of the mirror 130 tilting relative to the X-axis direction (rotating about the Y axis) in the movable reflective element 100. In FIGS. 7A to 7C, the mirror 130 is depicted in bold. The deformation is exaggerated relative to that of the actual state.

FIG. 7A illustrates a positional relationship between the actuator 150 and the mirror 130 in a normal state in which no tilt occurs, that is, a state in which no voltage is applied to the piezoelectric elements. The −X end of the actuator 150 is connected to the movable frame 120 and is indirectly supported by the base plate 200. The mirror 130 is connected to the +X end of the actuator 150. In FIG. 7A, the mirror 130 is supported by the movable frame 120 and is kept horizontal. A white triangle indicates the center of gravity G of the mirror 130. The center of gravity G coincides with the origin O of the coordinate system.

FIG. 7B illustrates a state in which the actuator 150 is caused to deform to become upwardly convex by application of the voltage with the positive polarity, as illustrated in FIG. 5B, to the piezoelectric elements of the actuator 150. Since the actuator 150 is fixed to the movable frame 120, the upwardly convex deformation displaces the +X end of the actuator 150 downwardly. As a result, the mirror 130 connected to the +X end of the actuator 150 rotates about the Y axis, and rotation +Ry (the rotation direction of a right-handed screw with respect to the Y axis is positive) about the Y axis occurs. During this rotation in the positive direction, the center of gravity G moves downwardly.

In contrast, FIG. 7C illustrates a state in which the actuator 150 is caused to deform to become downwardly convex by application of the voltage with the negative polarity, as illustrated in FIG. 5C, to the piezoelectric elements of the actuator 150. Since the actuator 150 is fixed to the movable frame 120, the downwardly convex deformation displaces the +X end of the actuator 150 upwardly. As a result, the mirror 130 connected to the +X end of the actuator 150 rotates about the Y axis, and rotation −Ry about the Y axis occurs. During this rotation in the negative direction, the center of gravity G moves upwardly.

As described above, when the voltage of such polarity that the D layer (upper electrode layer) 150D side is positive is applied across the B layer (lower electrode layer) 150B and the D layer (upper electrode layer) 150D of the piezoelectric elements of the actuator 150, the +X end of the mirror 130 is enabled to move downwardly to tilt, as illustrated in FIG. 7B. In contrast, application of the voltage with the reverse polarity enables the +X side of the mirror 130 to move upwardly to tilt, as illustrated in FIG. 7C. The degree of tilt depends on the applied voltage. Thus adjusting the polarity and value of the applied voltage enables any adjustment of tilt angles of the mirror 130 relative to the X-axis direction.

Arrangement of the piezoelectric elements can be reversed. For example, the actuator 140 may have piezoelectric elements on the upper side thereof, while the actuator 150 may have piezoelectric elements on the lower side thereof. Alternatively, each of the actuators 140 and 150 may have piezoelectric elements on both the upper and lower sides of each actuator body 140A and 150A. In practice, however, forming the piezoelectric elements on the upper side of each actuator body 140A and 150A is preferable for simplification of the fabrication process.

In the movable reflective element 100 according to Embodiment 1, the mirror 130 having the reflective surface is connected via the flexible actuator 150 to the movable frame 120, which in turn is connected via the actuator 140 to the fixed frame 110. Compared with a traditional supporting technique with a gimbal structure, this simple configuration provides a sufficient range of displacement angle. Implementation of the gimbal structure in mechanical rotating mechanism may increase the number of parts and the complexity of the structure. Implementation of the gimbal structure with a torsion bar simplifies the structure, but may limit the range of the maximum displacement angle to the range of the maximum torsion angle of the torsion bar, which results in difficulties in ensuring a sufficient displacement angle. The present embodiment provides the mirror 130 supported by the actuators 140 and 150, and thus ensures a sufficient displacement angle with a simple configuration.

The movable reflective element 100 having a configuration illustrated in FIG. 4(B) can be mass produced as a MEMS element by a fabrication method using a semiconductor fabrication process, and is suitable for miniaturization. In addition, the movable reflective element 100 is also suitable for low current consumption since the piezoelectric element is used as a drive element.

The movable reflective element 100 has actuators 140 extending in the Y axis and actuators 150 extending in the X axis. The actuators 140 and 150 each have the piezoelectric elements fixed on the upper or lower side, and the piezoelectric elements stretch or contract in the longitudinal direction upon application of the voltage with the respective polarities. Thus, when the voltage is applied to the piezoelectric elements of the actuator 140 to cause the piezoelectric elements to contract, the mirror 130 tilts relative to the Y-axis direction (rotates about the X axis) as illustrated in FIGS. 6B and 6C, and when the voltage is applied to the piezoelectric elements of the actuator 150 to cause the piezoelectric elements to contract, the mirror 130 tilts relative to the X-axis direction (rotates about the Y axis) as illustrated in FIGS. 7B and 7C. This ensures a sufficient displacement angle for implementing the two-dimensional scanner in relation to biaxial directions (about two axes) of the X and Y axes.

The present embodiment provides a structure in which the actuator 140, the movable frame 120, the actuator 150, and the mirror 130 are disposed on the fixed frame 110. However, the fixed frame 110 is not necessarily a frame body, but may be, for example, any other non-frame structure to which one end of the actuator 140 can be fixed.

However, since the actuators 140 and 150 and the mirror 130 are movable components for which displacement occurs, contact with an external object is to be avoided. In this regard, the frame shape like the fixed frame 110 enables surrounding of the movable components inside the frame, which protects the movable components against contact with the external object.

The shapes of the fixed frame 110, the movable frame 120, and the mirror 130 are not limited to the rectangle-like shape, but may be oval or polygonal.

The present embodiment provides the base plate 200 that supports the fixed frame 110. Providing the base plate 200 and fixing the lower surface of the fixed frame 110 to the upper surface of the base plate 200 leave the actuator 140, the movable frame 120, the actuator 150 and the mirror 130 suspended above the base plate 200, and enable tilting of the mirror 130 within a range of freedom defined by the size of the gap formed above the base plate 200. In addition, excess displacement in the mirror 130 can be prevented, which prevents the actuators 140 and 150 from overly flexing and being damaged. In the present embodiment, the small thicknesses of the actuators 140 and 150 and the mirror 130 compared with the fixed frame 110 allows the suspended structure, but the same thicknesses of such components can also allow a suspended structure by providing a so-called spacer 300 on the lower surface of the fixed frame 110.

According to the movable reflective element 100 of Embodiment 1 as described above, the length of the actuator 140 in the Y-axis direction is longer than a distance between the inner side of the fixed frame 110 and the middle point of the outer side of the movable frame 120 in the Y-axis direction. This further increases a ratio of the length of the actuator 140 to the length of the actuator 150. This enables the movable frame 120 and the mirror 130 to have a desired ratio of drive frequencies. In addition, the mirror 130 can be oscillated within a range that is sufficient in practice, for example without multiple folding of the actuators 140 and 150. Thus the movable reflective element 100 of Embodiment 1 can achieve optimization of the drive frequencies and miniaturization.

Provided that the base plate 200 is a device enclosure for the movable reflective element 100, the base plate 200 can be regarded as a component incorporated into the product itself of the movable reflective element 100. However, the product itself of the movable reflective element 100 can take a form not to include the base plate 200. In this case, a mount surface of some device, on which the movable reflective element is mounted as a component, functions as the base plate 200.

Embodiment 2

Next, Embodiment 2 of the present disclosure is described.

The actuators 140 in the above-described Embodiment 1 are linear, while the actuators 140 in Embodiment 2 are substantially L-shaped. This L-shaped configuration allows increased lengths of the actuators 140 in the Y-axis direction.

Figure 8:
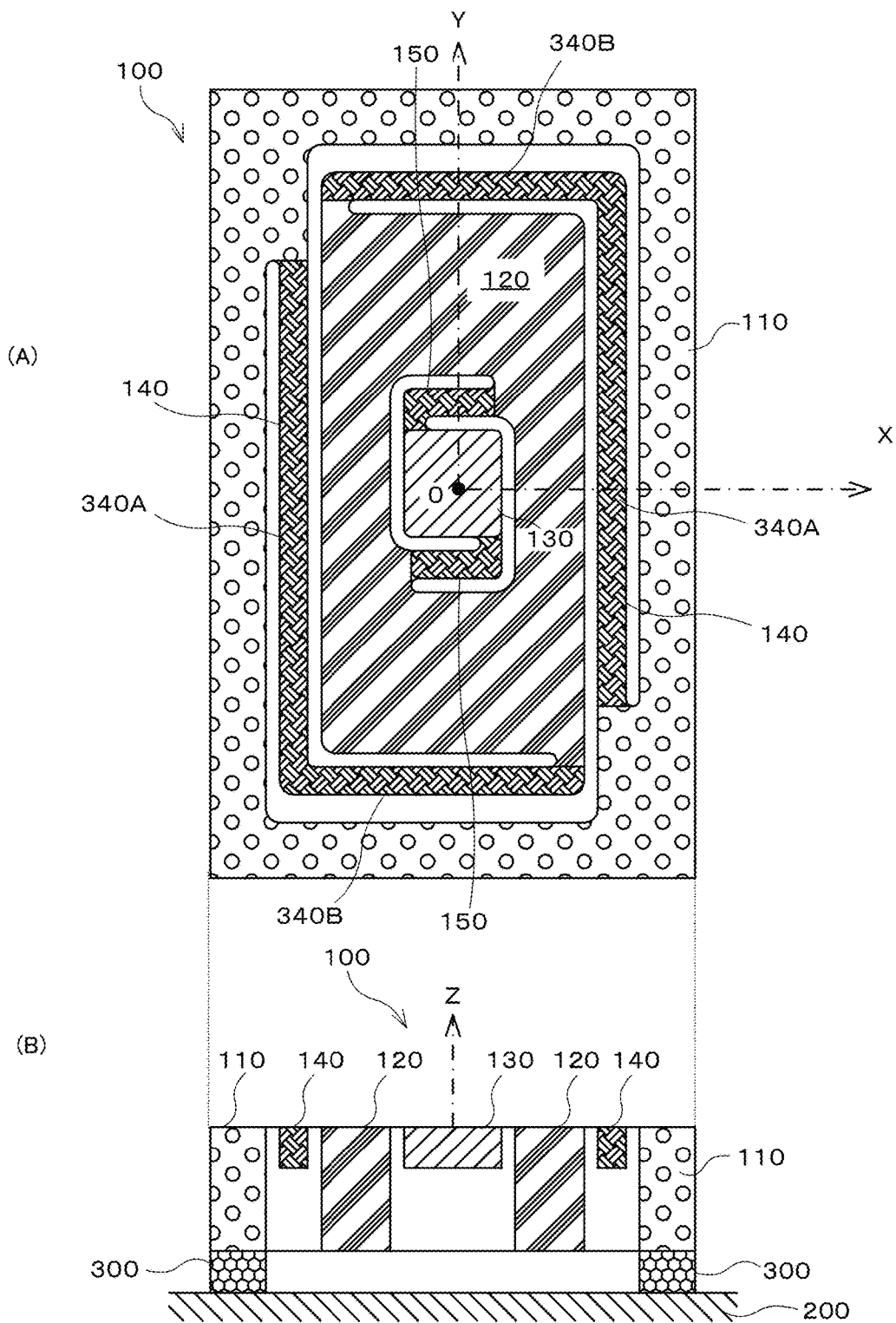
FIG. 8 illustrates a main structure of a movable reflective element according to Embodiment 2 of the present disclosure.

As illustrated in FIG. 8(A), the actuators 140 are a pair of members disposed on both sides of the movable frame 120 in the X-axis direction. The actuators 140 each include an arm 340A (the eighth arm) and an arm 340B (the ninth arm).

One end of the arm 340A is connected to the inner side of the fixed frame 110. The arm 340A extends linearly in the Y-axis direction in a gap between the fixed frame 110 and the movable frame 120 from the one end of the arm 340A beyond the middle point of the outer side of the movable frame 120, that is, beyond the X axis. The arm 340B of the actuator 140 extends from the other end of the arm 340A in the X axis without turning back, and is connected to a corner portion of the movable frame 120, which is a portion other than the middle point (on the Y axis) of the outer side of the movable frame 120.

One end of each actuator 150 is connected to the inner side of the movable frame 120. The actuator 150 includes an arm (the tenth arm) extending linearly in the X-axis direction in a gap between the movable frame 120 and the mirror 130 from the one end of the arm beyond the middle point of the outer side of the mirror 130, that is, beyond the Y axis. The actuator 150 extends from the other end of the arm in the X-axis direction without turning back, and is connected to a corner portion of the mirror 130, which is a portion other than the middle point of the outer side of the mirror 130.

Figure 9:
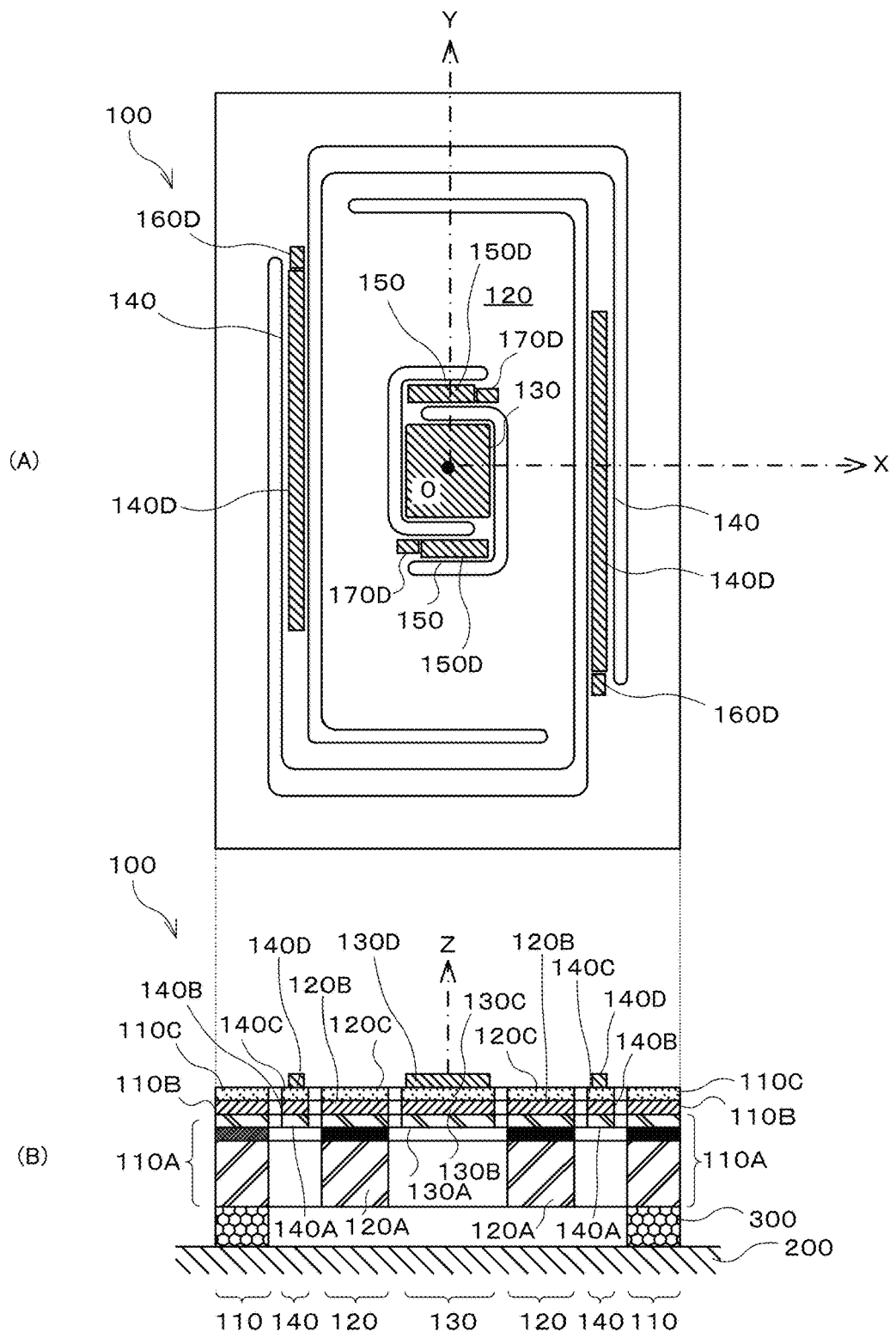
FIG. 9 illustrates the main structure (including a layer D) of the movable reflective element according to Embodiment 2 of the present disclosure.

The arm 340A of the actuator 140 as illustrated in FIG. 8(A) includes piezoelectric elements (140B, 140C, and 140D) formed therein, as illustrated in FIGS. 9(A) and 9(B). Application of the voltage with the positive polarity or the negative polarity to the piezoelectric elements causes the arm 340A to bow upwardly or downwardly, as illustrated in FIGS. 5B and 5C. The movable frame 120 and the mirror 130 thereby oscillate about the X-axis, similarly to motions illustrated in FIGS. 6A to 6C.

The actuators 150 each also include piezoelectric elements (150B, 150C, and 150D), as illustrated in FIGS. 9(A) and 9(B). Application of the voltage with the positive polarity or the negative polarity to the piezoelectric elements causes the arm to bow upwardly or downwardly, as illustrated in FIGS. 5B and 5C. The mirror 130 is thereby driven around the Y axis, similarly to motions illustrated in FIGS. 7A, 7B, and 7C.

According to the movable reflective element 100 of Embodiment 2 as described above, the length of the actuator 140 in the Y-axis direction is longer than a distance between the inner side of the fixed frame 110 and the middle point of the outer side of the movable frame 120 in the Y-axis direction. This further increases a ratio of the length of the actuator 140 to the length of the actuator 150. This enables the movable frame 120 and the mirror 130 to have a desired ratio of drive frequencies. In addition, the mirror 130 can be oscillated within a range that is sufficient in practice, for example without multiple folding of the actuators 140 and 150. Thus the movable reflective element 100 of Embodiment 2 achieves optimization of the drive frequencies and miniaturization.

Embodiment 3

Next, Embodiment 3 of the present disclosure is described. Embodiment 3 differs from Embodiment 1 in that the actuators 150 in Embodiment 3 are substantially L-shaped.

Figure 10:
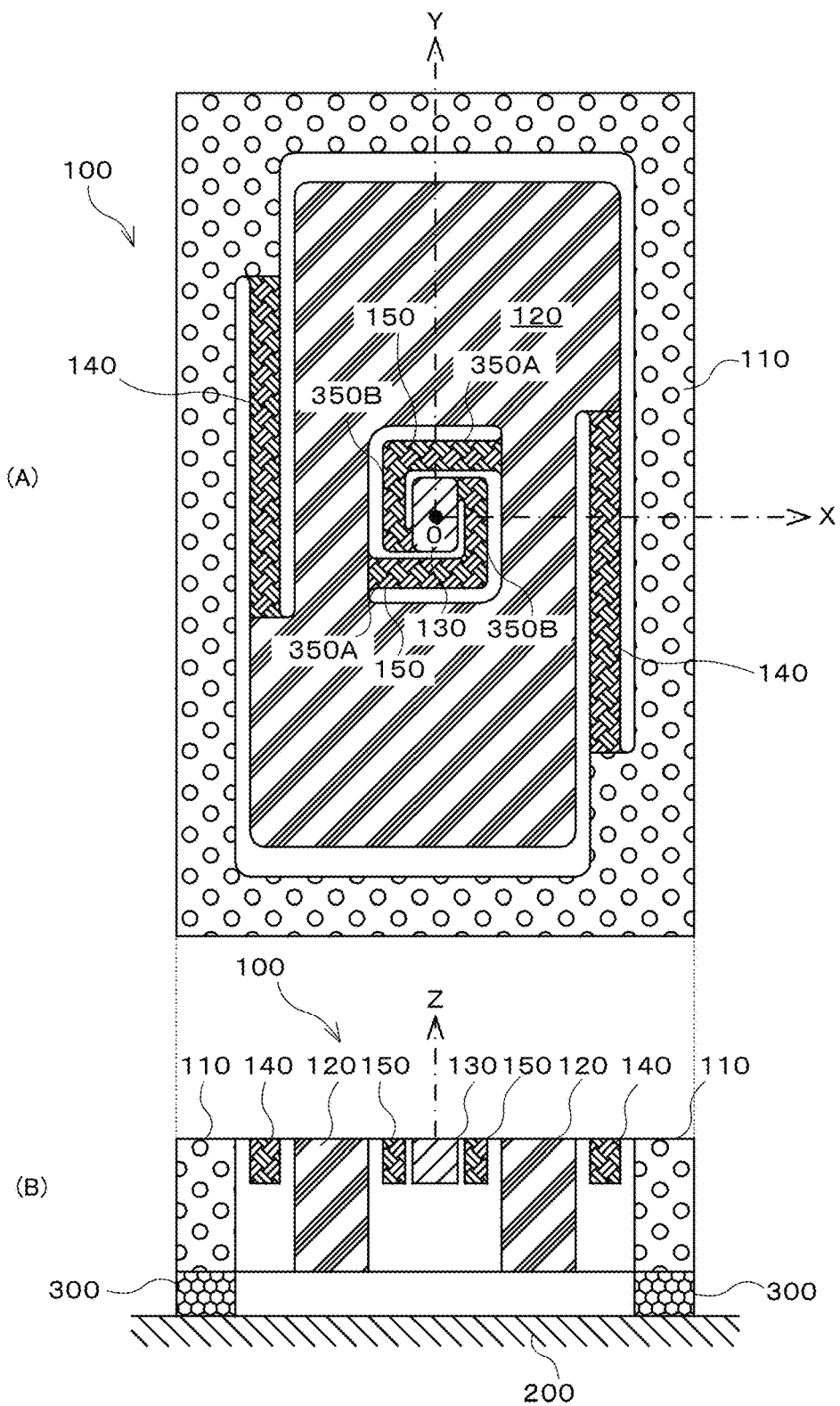
FIG. 10 illustrates a main structure of a movable reflective element according to Embodiment 3 of the present disclosure.

As illustrated in FIGS. 10(A) and 10(B), the actuator 150 includes an arm 350A (the tenth arm) and an arm 350B (the eleventh arm). The arm 350A is connected to an inner side of the movable frame 120. The arm 350A extends linearly in the X-axis direction in a gap between the movable frame 120 and the mirror 130 from one end of the arm 350A beyond the middle point of the outer side of the mirror 130.

The arm 350B extends in the Y-axis direction in a gap between the movable frame 120 and the mirror 130 from the other end of the arm 350A, and is connected to a corner portion of the mirror 130 beyond the middle point of the outer side of the movable frame 120 in the Y-axis direction.

Figure 11:
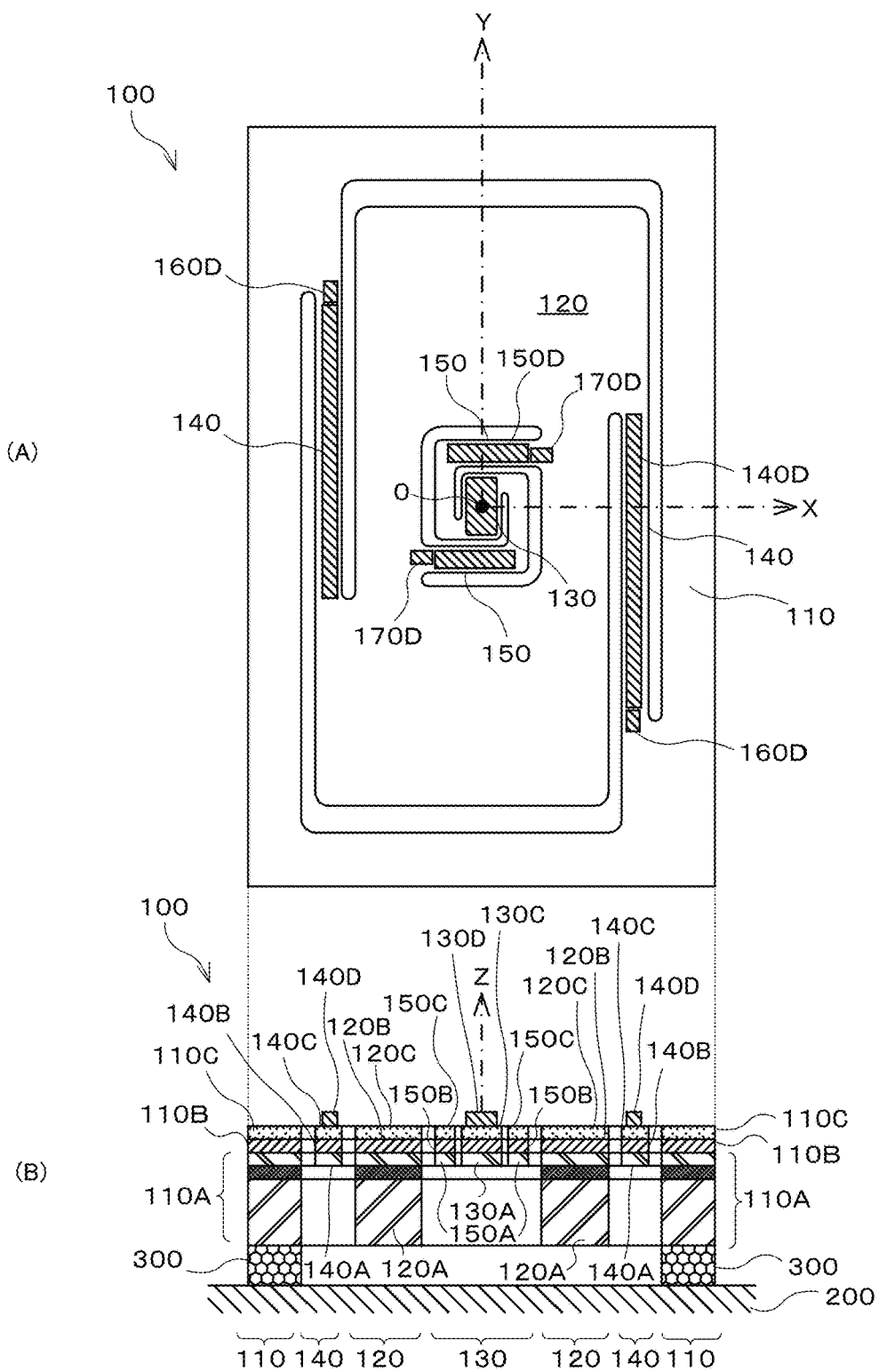
FIG. 11 illustrates a main structure (including the layer D) of the movable reflective element according to Embodiment 3 of the present disclosure.

As illustrated in FIGS. 10(A) and 11(B), the arm 350A include piezoelectric elements (150B, 150C, and 150D) formed therein. Application of the voltage with the positive polarity or the negative polarity to the piezoelectric elements causes the arm 350A to bow upwardly or downwardly, as illustrated in FIGS. 5B and 5C. The mirror 130 thereby oscillates about the Y axis, similarly to motions illustrated in FIGS. 7A, 7B, and 7C.

As described above, according to the present embodiment, the length of the actuator 150 is not limited to a distance between the inner side of the movable frame 120 and the middle point of the outer side of the mirror 130. This enables the movable frame 120 and the mirror 130 to have a desired ratio of drive frequencies thereof. In addition, the mirror 130 can be oscillated within a range that is sufficient in practice, for example without multiple folding of the actuators 140 and 150. Thus the movable reflective element 100 of Embodiment 3 achieves optimization of the drive frequencies and miniaturization.

Embodiment 4

Next, Embodiment 4 of the present disclosure is described. The actuators 140 and 150 of the movable reflective element 100 of Embodiment 4 are both substantially L-shaped.

Figure 12:
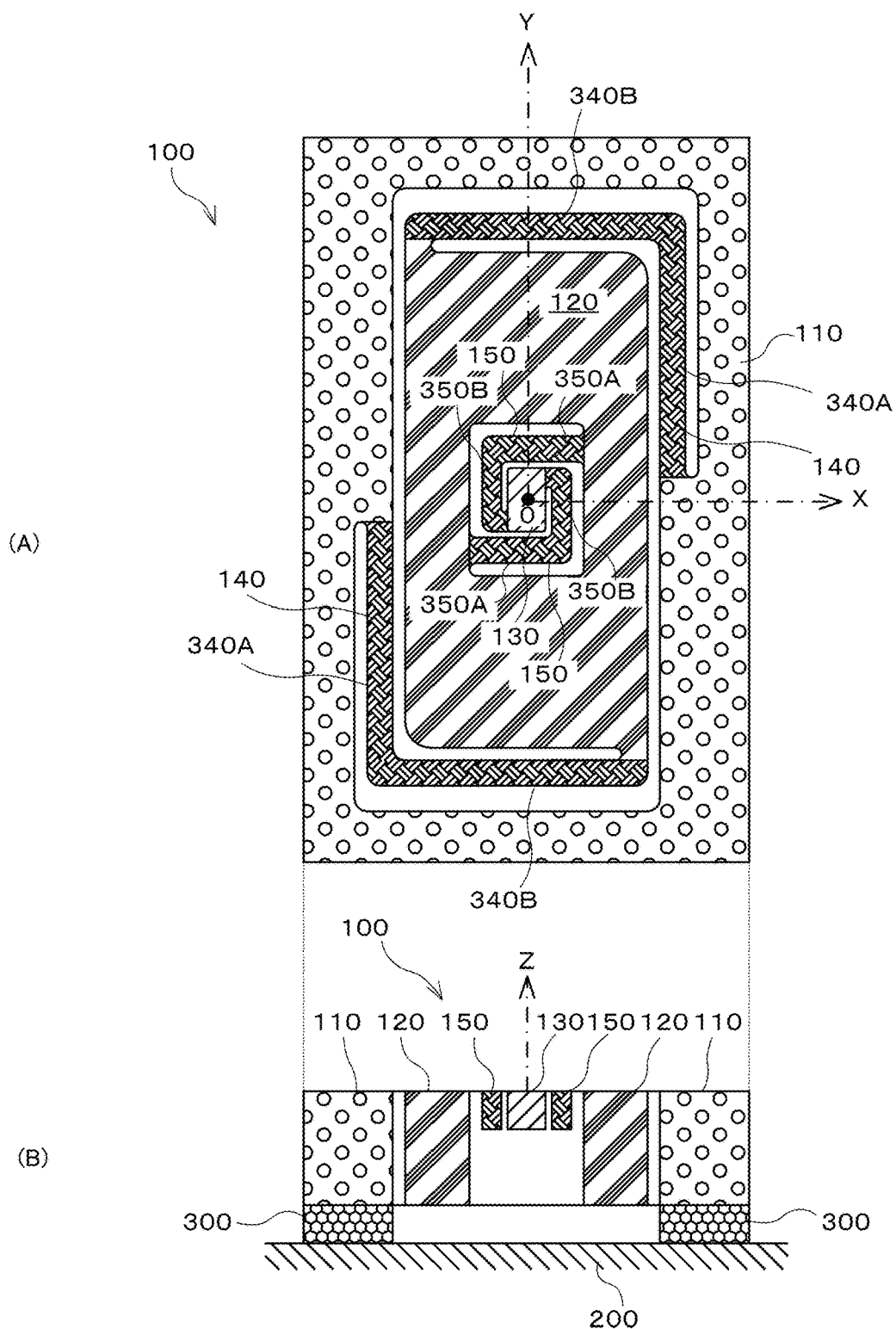
FIG. 12 illustrates a main structure of a movable reflective element according to Embodiment 4 of the present disclosure.

As illustrated in FIGS. 12(A) and 12(B), the actuator 140 includes arms 340A and 340B. One end of the arm 340A is connected to the inner side of the fixed frame 110. The arm 340A extends linearly in the Y-axis direction in a gap between the fixed frame 110 and the movable frame 120 from the one end of the arm 340A beyond the middle point of the outer side of the movable frame 120. The arm 340B extends in the X-axis direction from the other end of the arm 340A, and is connected to a corner portion of the movable frame 120 beyond the middle point of the outer side of the movable frame 120.

The actuator 150 has arms 350A and 350B. One end of the arm 350A is connected to the inner side of the movable frame 120, and extends linearly in the X-axis direction in a gap between the movable frame 120 and the mirror 130 from the one end of the arm 350A beyond the middle point of the outer side of the mirror 130. The arm 350B extends in the Y-axis direction from the other end of the arm 350A, and is connected to a corner portion of the mirror 130 beyond the middle point of the outer side of the mirror 130.

Figure 13:
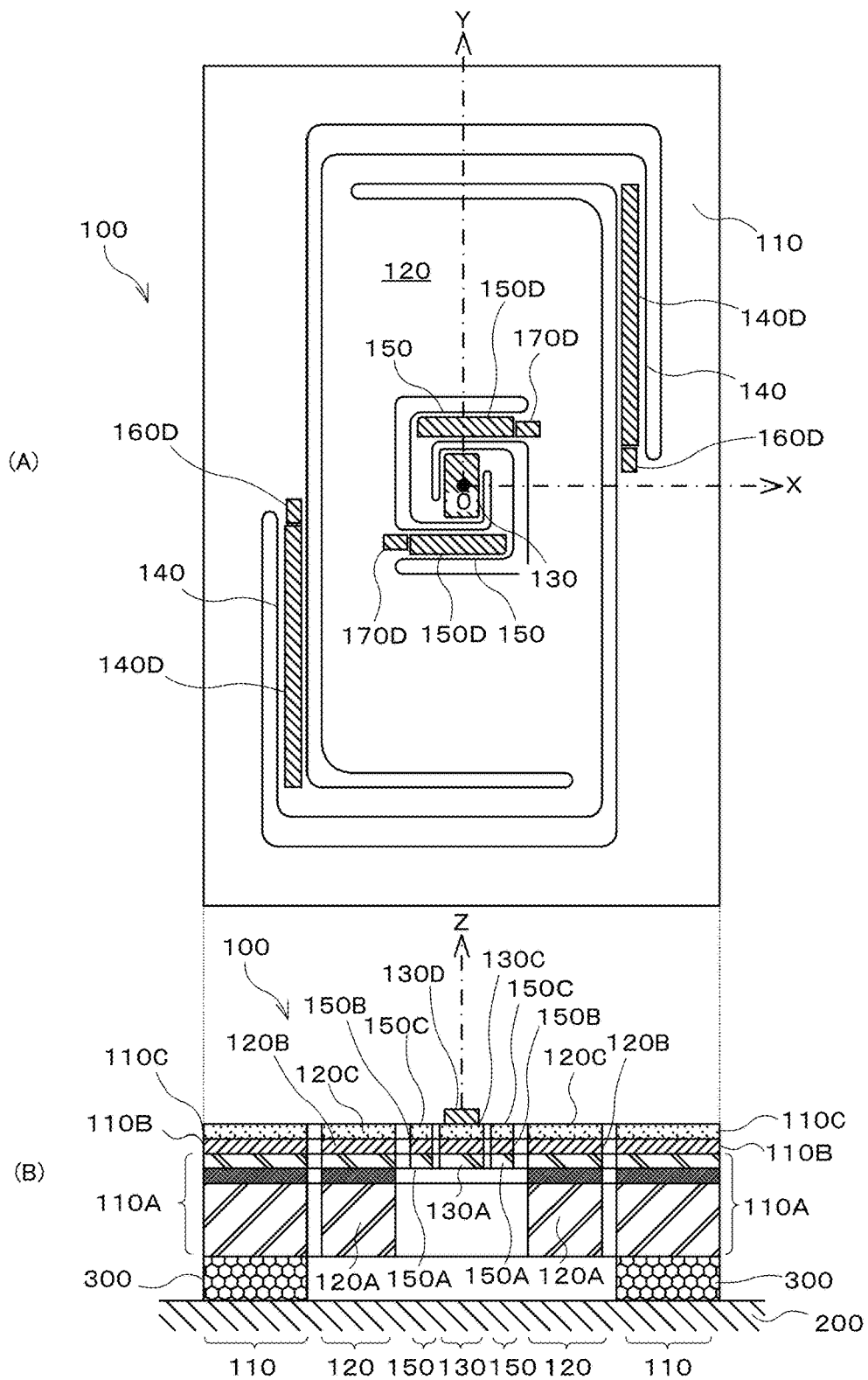
FIG. 13 illustrates a main structure (including the layer D) of the movable reflective element according to Embodiment 4 of the present disclosure.

The arm 340A illustrated in FIG. 13(A) includes piezoelectric elements (140B, 140C, and 140D) formed therein. Application of the voltage with the positive polarity or the negative polarity to the piezoelectric elements causes the arm 340A to bow upwardly or downwardly, similarly to motions illustrated in FIGS. 5B and 5C. This enables the movable frame 120 to oscillate about the X axis, as illustrated in FIGS. 6A to 6C.

The arm 350A illustrated in FIG. 13(A) includes piezoelectric elements (150B, 150C, and 150D) formed therein. Application of the voltage with the positive polarity or the negative polarity to the piezoelectric elements causes the arm 350A to bow upwardly or downwardly, similarly to motions illustrated in FIGS. 5A to 5C. This enables the mirror 130 to oscillate about the Y axis, as illustrated in FIGS. 7A to 7C.

According to the movable reflective element 100 of Embodiment 4 as described above, the length of the actuator 140 is not limited to a distance between the inner side of the fixed frame 110 and the middle point of the outer side of the movable frame 120, and the length of the actuator 150 is not limited to a distance between the inner side of the movable frame 120 and the middle point of the outer side of the mirror 130. This enables the movable frame 120 and the mirror 130 to have a desired ratio of drive frequencies thereof. In addition, the mirror 130 can be oscillated within a range that is sufficient in practice, for example without multiple folding of the actuators 140 and 150. Thus the movable reflective element 100 of Embodiment 4 achieves optimization of the drive frequencies and miniaturization.

Embodiment 5

Next, Embodiment 5 of the present disclosure is described. Movable reflective elements 100 of Embodiment 5 and Embodiments 6 and 7, which are described below, are designed based on similar ideas and belong to the same group.

Figure 14:
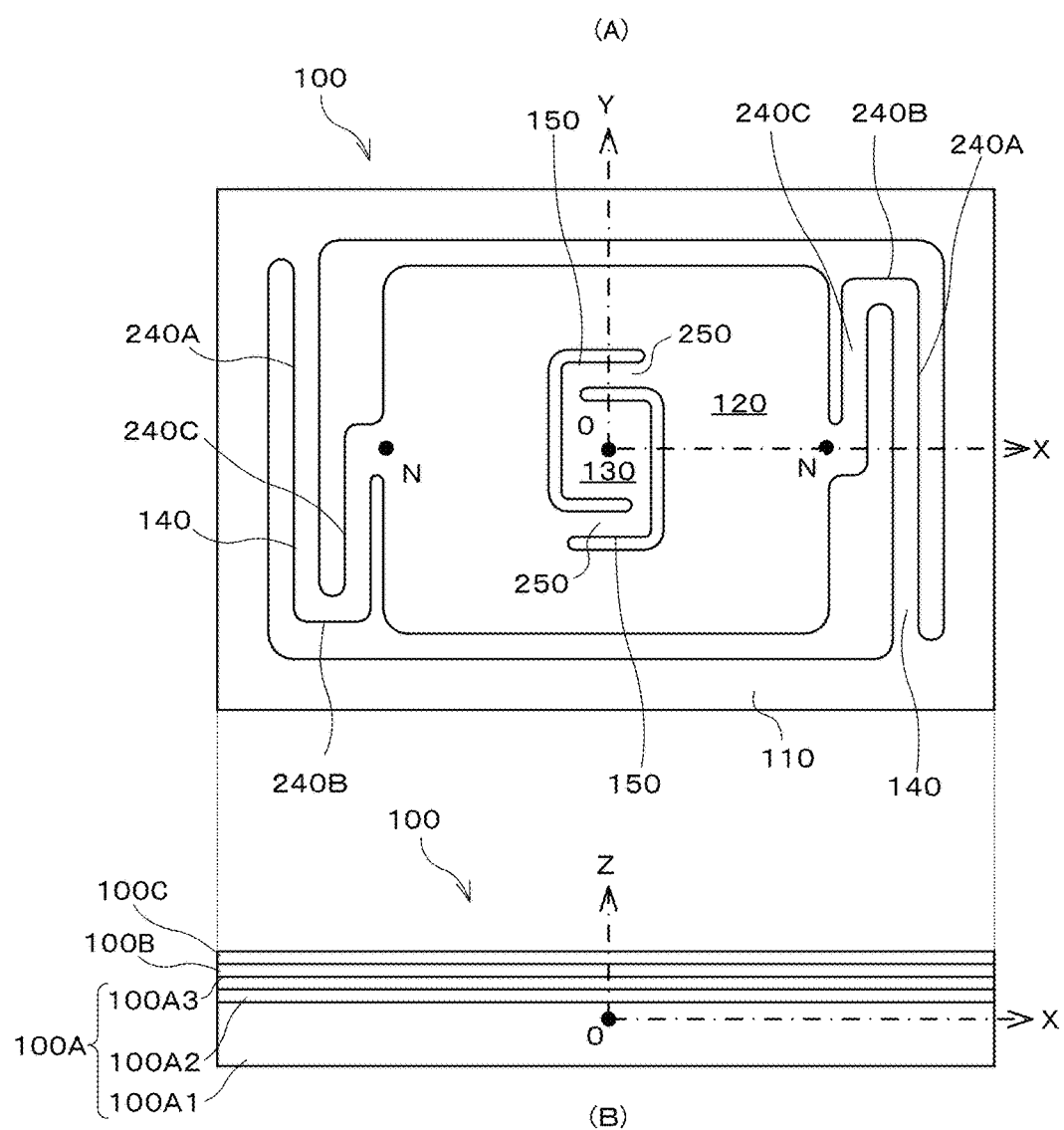
FIG. 14 illustrates a main structure of a movable reflective element (excluding a layer D) according to Embodiment 5 of the present disclosure.

As illustrated in FIG. 14(A), a movable reflective element 100 according to Embodiment 5 includes, similarly to the movable reflective elements 100 of Embodiments 1 to 4 described above, a fixed frame 110 fixed to an external object, a movable frame 120 disposed inside the fixed frame 110, and a mirror 130 disposed inside the movable frame 120. The movable reflective element 100 further includes actuators 140 that are a pair of members connecting the fixed frame 110 to the movable frame 120, and actuators 150 that are a pair of members connecting the movable frame 120 to the mirror 130. As illustrated in FIG. 14(B), similarly to the movable reflective element 100 of Embodiments 1 to 4, an A layer 100A (100A1, 100A2, and 100A3), a B layer 100B, and a C layer 100C are laminated in the movable reflective element 100 according to the present embodiment.

The actuators 140 are disposed on both sides of the movable frame 120 in the X-axis direction between the fixed frame 110 and the movable frame 120. The actuators 150 are disposed on both sides of the mirror 130 in the Y-axis direction between the movable frame 120 and the mirror 130.

Figure 15A:
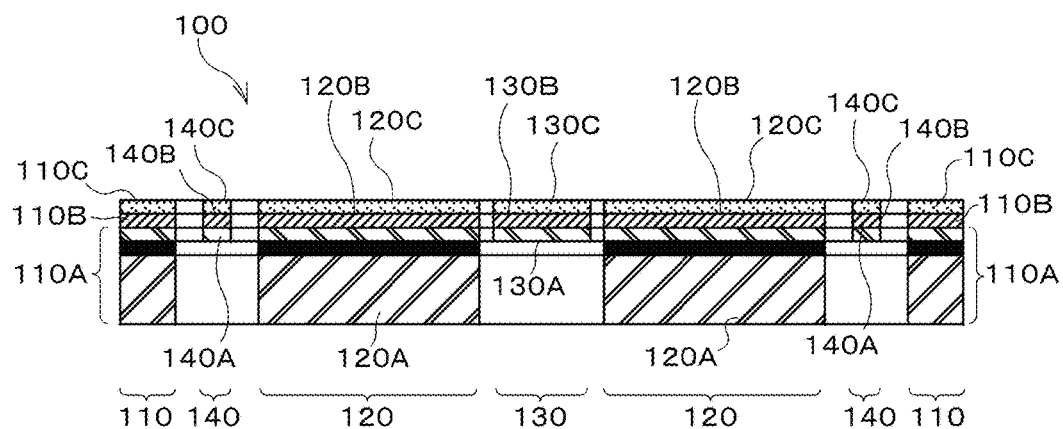
FIG. 15A is a side cross-sectional view of the main structure of the movable reflective element according to Embodiment 5 of the present disclosure, taken along the XZ plane.
Figure 15B:
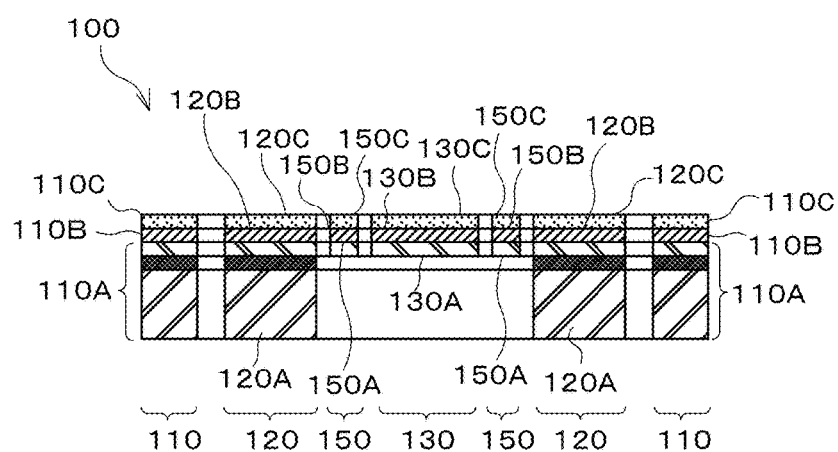
FIG. 15B is a side cross-sectional view of the main structure of the movable reflective element according to Embodiment 5 of the present disclosure, taken along the YZ plane.

As illustrated in FIGS. 15A and 15B, the fixed frame 110, the movable frame 120, the mirror 130, and the actuators 140 and 150 of the movable reflective element 100 according to Embodiment 5 also each includes a three-layer structure of the A layer 100A, the B layer 100B, and the C layer 100C. The mirror 130 and the actuators 140 and 150 are designed to have thicknesses smaller than the thicknesses of the fixed frame 110 and the movable frame 120, and spaces are formed below the mirror 130 and the actuators 140 and 150.

Figure 16:
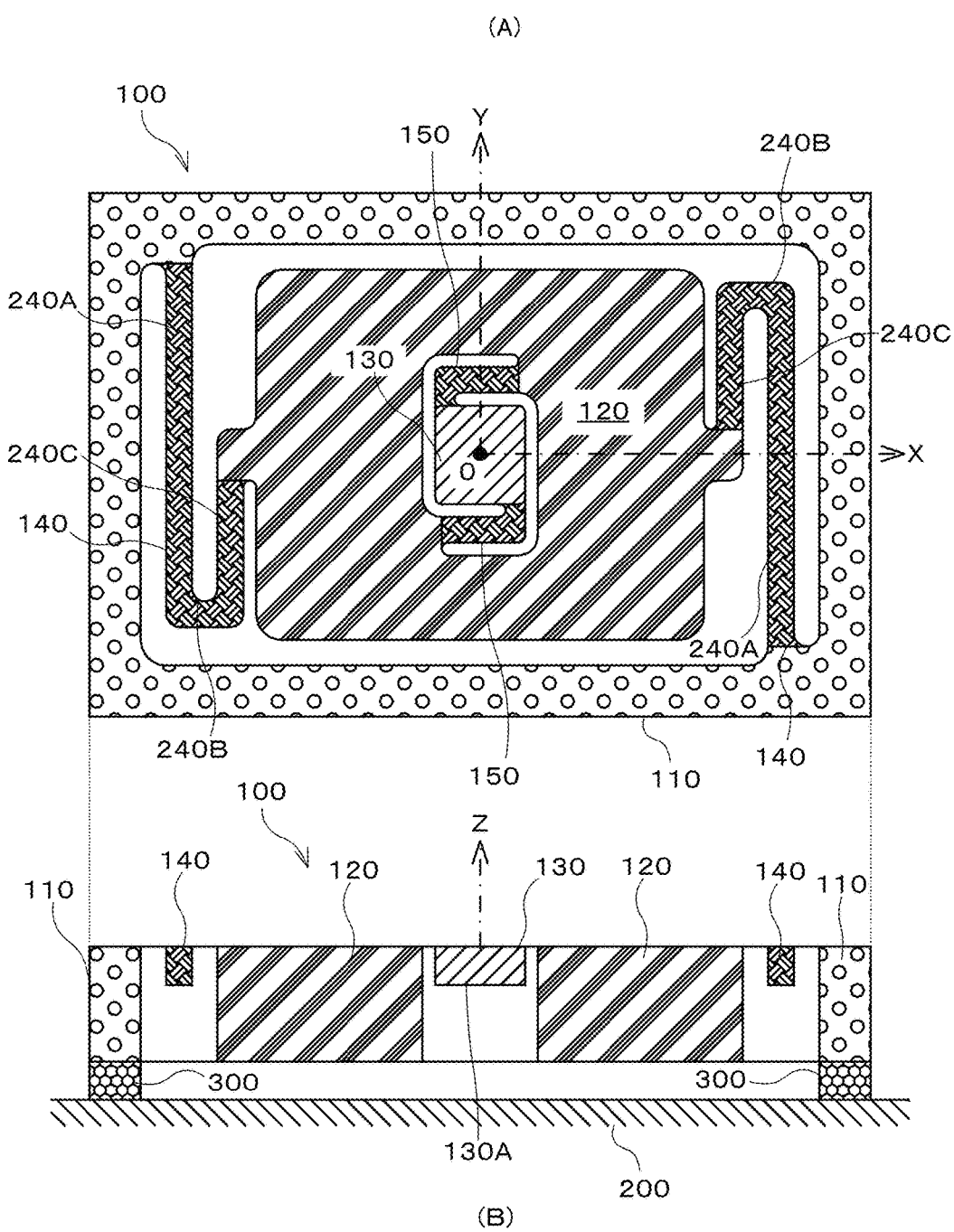
FIG. 16 illustrates the main structure of the movable reflective element according to Embodiment 5 of the present disclosure.

As illustrated in FIGS. 16(A) and 16(B), the movable reflective element 100 according to Embodiment 5 differs from the movable reflective elements 100 according to Embodiments 1 to 4 in the profiles of the actuators 140. In the present embodiment, the actuator 140 is substantially S-shaped.

The actuator 140 includes three parts, each being specified as an arm 240A (the first arm), an arm 240B (the second arm), and an arm 240C (the third arm). That is, the actuator 140 includes the arms 240A, 240B, and 240C.

First, the configuration of the +X-side actuator 140 (240A, 240B, and 240C) is described.

The −Y-side end of the arm 240A is connected to the inner side (portion around the +X-side corner of the inner side facing toward the +Y side) of the fixed frame 110. The arm 240A extends in the Y-axis direction in a gap between the fixed frame 110 and the movable frame 120 from the −Y-side end toward the +Y side. The arm 240A has a width that allows the arm 240A to extend along the arm 240C in a gap between the fixed frame 110 and the movable frame 120. The arm 240A extends linearly beyond the middle point N (see FIG. 14(A)) of the outer side of the movable frame 120 in the Y-axis direction, that is, the X axis.

The +X-side end of the arm 240B is connected to the +Y-side end of the arm 240A. The width and thickness of the arms 240B are substantially the same as those of the arm 240A. The arm 240B extends in the X-axis direction from the +X-side end toward the movable frame 120.

The +Y-side end of the arm 240C is connected to the −X-side end of the arm 240B. The arm 240C turns around at the −X end of the arm 240B and extends along the arm 240A. The width and thickness of the arm 240C are substantially the same as those of the arm 240A. The arm 240C is connected at the −Y end thereof to the middle point (on the X axis) N of the outer side of the movable frame 120.

Figure 17:
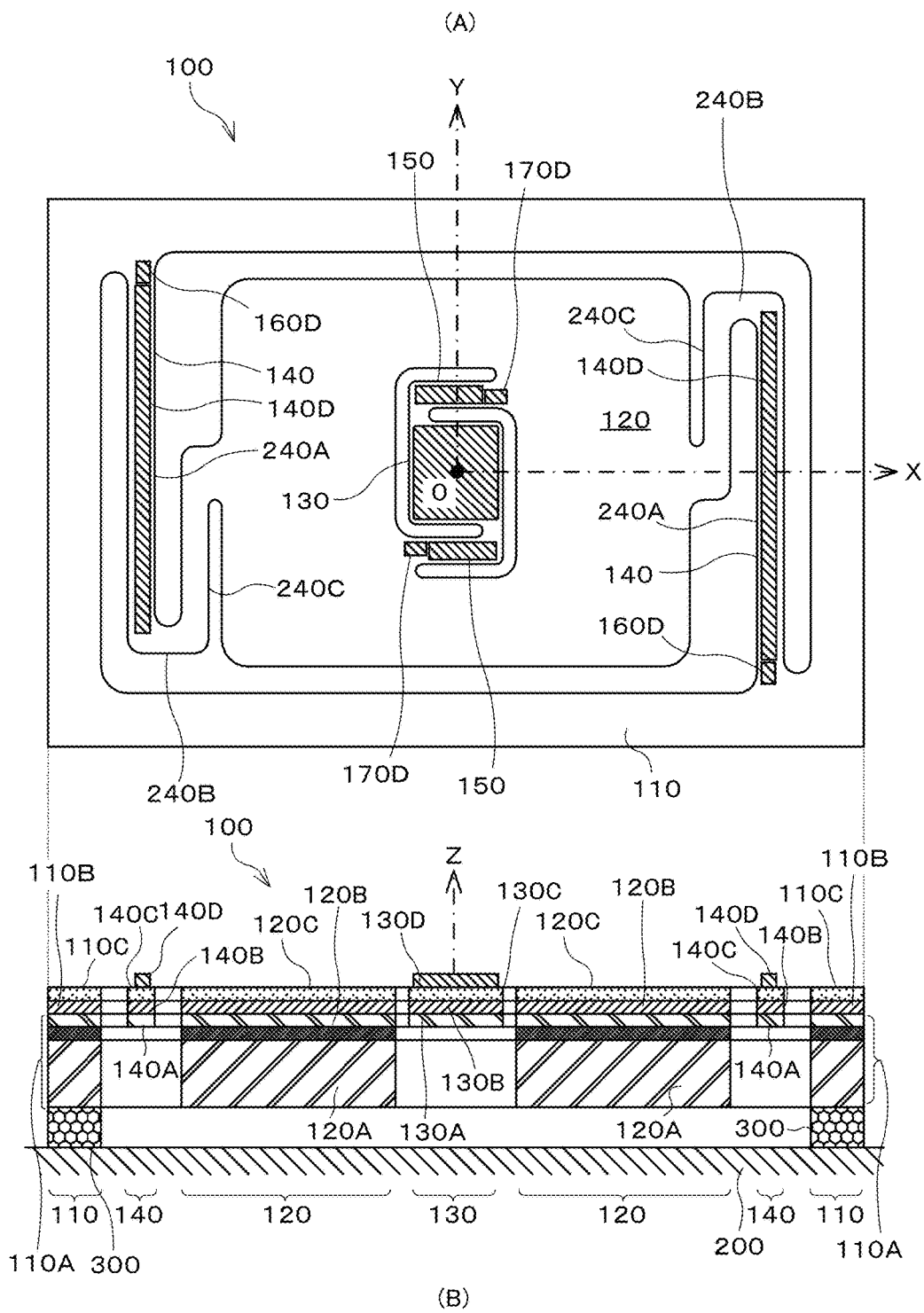
FIG. 17 illustrates a main structure (including the layer D) of the movable reflective element according to Embodiment 5 of the present disclosure.

As illustrated in FIGS. 17(A) and 17(B), the arm 240A includes piezoelectric elements (140B, 140C, and 140D) formed therein. The piezoelectric elements are formed of the B layer (lower electrode layer) 140B, the C layer (piezoelectric material layer) 140C, and the D layer (upper electrode layer) 140D.

The −X-side actuator 140 also includes the arms 240A, 240B, and 240C. In the −X-side actuator 140, the arm 240A extends in the −Y direction from the +Y-side inner side of the fixed frame 110 beyond the middle point N of the outer side of the movable frame 120, the arm 240B extends in the +X direction from the −Y-side end of the arm 240A, and the arm 240C extends in the +Y direction from the +X-side end of the arm 240B and is connected to the middle point N of the outer side of the movable frame 120. That is, the actuators 140, the pair of members, are disposed with two-fold rotational symmetry around the center of gravity of the mirror 130. Similarly, the actuators 150, the pair of members, are disposed with two-fold rotational symmetry around the mirror 130.

Figure 18A:
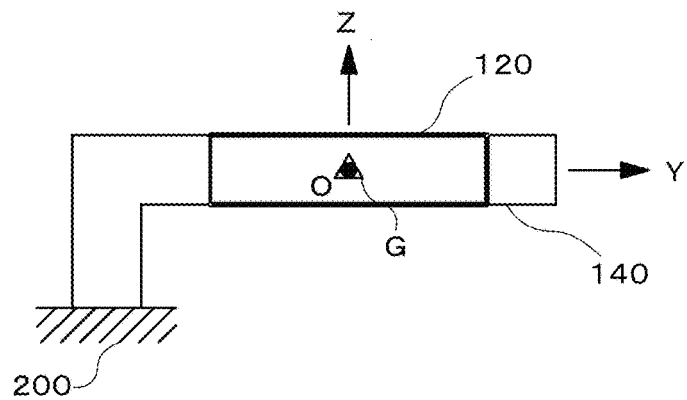
FIG. 18A is a first side view illustrating a state of a movable frame tilting relative to the Y-axis direction (rotating about the X axis) in the movable reflective element according to Embodiment 5 of the present disclosure.

As illustrated in FIG. 18A, when the voltage is not applied across the B layer (lower electrode layer) 140B and the D layer (upper electrode layer) 140D of the piezoelectric elements (140B, 140C, and 140D) of the actuator 140, the movable frame 120 and the mirror 130 is supported and kept horizontally above the base plate 200 via the actuator 140. A white triangle indicates the center of gravity G of the mirror 130. The center of gravity G coincides with the origin O of the coordinate system.

Figure 18B:
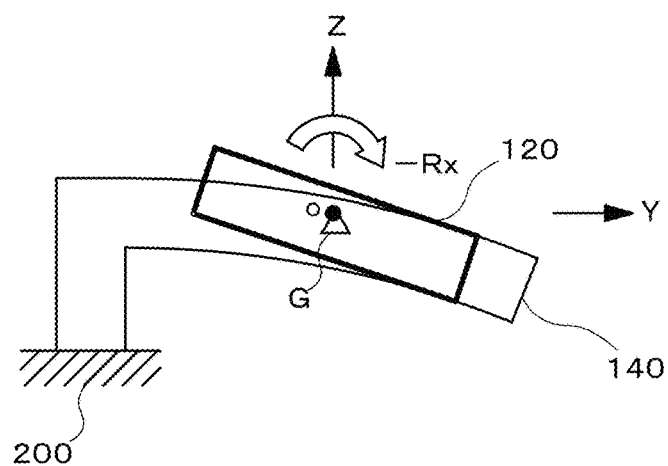
FIG. 18B is a second side view illustrating a state of the movable frame tilting relative to the Y-axis direction (rotating about the X axis) in the movable reflective element according to Embodiment 5 of the present disclosure.

The voltage of such polarity that the D layer (upper electrode layer) 140D side is positive is applied across the B layer (lower electrode layer) 140B and the D layer (upper electrode layer) 140D. In this case, as illustrated in FIG. 5B, the piezoelectric elements having a three-layer structure of the B layer 140B, the C layer 140C, and the D layer 140D of the arm 240A stretch in the longitudinal direction to cause the flexible A layer 140A to be stressed on the upper surface side in a direction of stretching in the plane. As a result, the arm 240 bows to become upwardly convex. The upwardly convex bow of the arm 240 causes, via the arm 240B, the +Y end of the arm 240C to move downwardly to tilt, and thus the entire actuator 140 tilts with the +Y end moving downwardly. This enables the movable frame 120 and the mirror 130 to tilt with the +Y ends thereof moving downwardly, as illustrated in FIG. 18B.

Figure 18C:
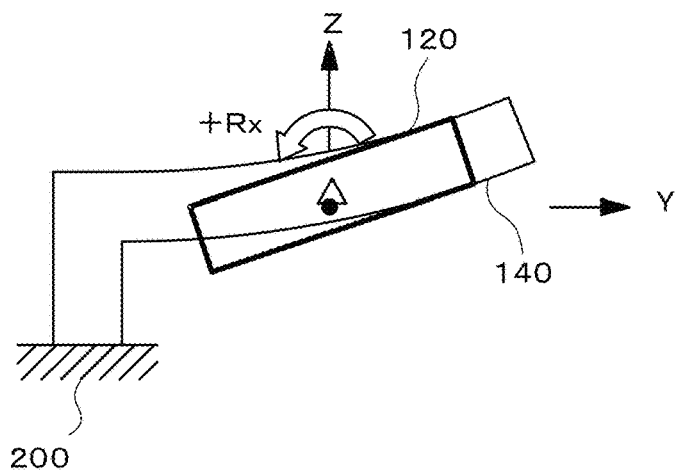
FIG. 18C is a third side view illustrating a state of the movable frame tilting relative to the Y-axis direction (rotating about the X axis) in the movable reflective element according to Embodiment 5 of the present disclosure.

Application of the voltage with the reverse polarity across the B layer (lower electrode layer) 140B and the D layer (upper electrode layer) 140D causes the piezoelectric elements (140B, 140C, and 140D) having the three-layer structure of the B layer 100B, the C layer 100C, and the D layer 100D to contract in the longitudinal direction, which causes the A layer 100A of the flexible arm 240A to be stressed on the upper surface side in a direction of contracting in the plane. As a result, the arm 240A bows to become downwardly convex. The downwardly convex bow of the arm 240A causes, via the arm 240B, the +Y end of the arm 240C to move upwardly to tilt, and the entire actuator 140 tilts with the +Y end moving upwardly. This enables the movable frame 120 and the mirror 130 to tilt with the +Y ends thereof moving upwardly, as illustrated in FIG. 18C.

For the pair of actuators 140, the polarity of the voltage applied to the +X-side piezoelectric element is opposite to the polarity of the voltage applied to the −X-side piezoelectric element. This enables the movable frame 120 to oscillate about the X axis to the fixed frame 110.

The degree of tilt depends on the applied voltage. Thus adjusting the polarity and value of the applied voltage enables freely-selected adjustment of tilt angles of the mirror 130 relative to the X-axis direction.

Referring back to FIG. 14(A), the actuator 150 has a single arm 250 (the seventh arm). One end of the arm 250 is connected to the inner side of the movable frame 120. The arm 250 extends linearly in the X-axis direction in a gap between the movable frame 120 and the mirror 130 from one end of the arm 250 beyond the middle point of the outer side of the mirror 130, that is, the Y axis. The other end of the arm 250 is connected to a corner portion of the mirror 130. The actuator 150 includes the piezoelectric elements (150B, 150C, and 150D) formed therein. Application of the voltage with the positive polarity or the negative polarity to the piezoelectric elements causes the piezoelectric elements to bow upwardly or downwardly, as illustrated in FIGS. 7B and 7C.

For the pair of actuators 150, the polarity of the voltage applied to the +Y-side piezoelectric element is opposite to the polarity of the voltage applied to the −Y-side piezoelectric element. This enables the mirror 130 to oscillate about the Y axis relative to the movable frame 120.

According to the movable reflective element 100 of Embodiment 5 as described above, the length of the actuator 140 in the Y-axis direction is longer than a distance between the inner side of the fixed frame 110 and the middle point of the outer side of the movable frame 120 in the Y-axis direction. This further increases a ratio of the length of the actuator 140 to the length of the actuator 150. This enables the movable frame 120 and the mirror 130 to have a desired ratio of drive frequencies. In addition, the mirror 130 can be oscillated within a range that is sufficient in practice, for example without multiple folding of the actuators 140 and 150. Thus the movable reflective element 100 of Embodiment 5 achieves optimization of the drive frequencies and miniaturization.

The movable reflective element 100 according to Embodiment 5 enables the increased length of the actuator 140, thereby having a length in the Y-axis direction shorter than the length in the X-axis direction. As described below, when the direction of oscillation about the X axis is set to correspond to a vertical scanning direction of beams, the Y-axis direction of the movable reflective element 100 that is incorporated into a device such as a projector or the like is enabled to correspond to the direction of the thickness of the device. Thus use of the movable reflective element 100 according to Embodiment 5 achieves a compact and thinner device, into which the movable reflective element 100 is incorporated, since the Y-axis length of the movable reflective element 100 is reduced.

Since the actuator 140 is connected to the middle point N of the outer side of the movable frame 120, a moment other than moments in the X and Y directions has little effect on the movable frame 120, which prevents the vibration of the movable frame 120 from being unbalanced in either of the directions or twisted. The actuator 150 with a simple configuration achieves a compact movable frame 120.

Embodiment 6

Next, Embodiment 6 of the present disclosure is described.

Figure 19:
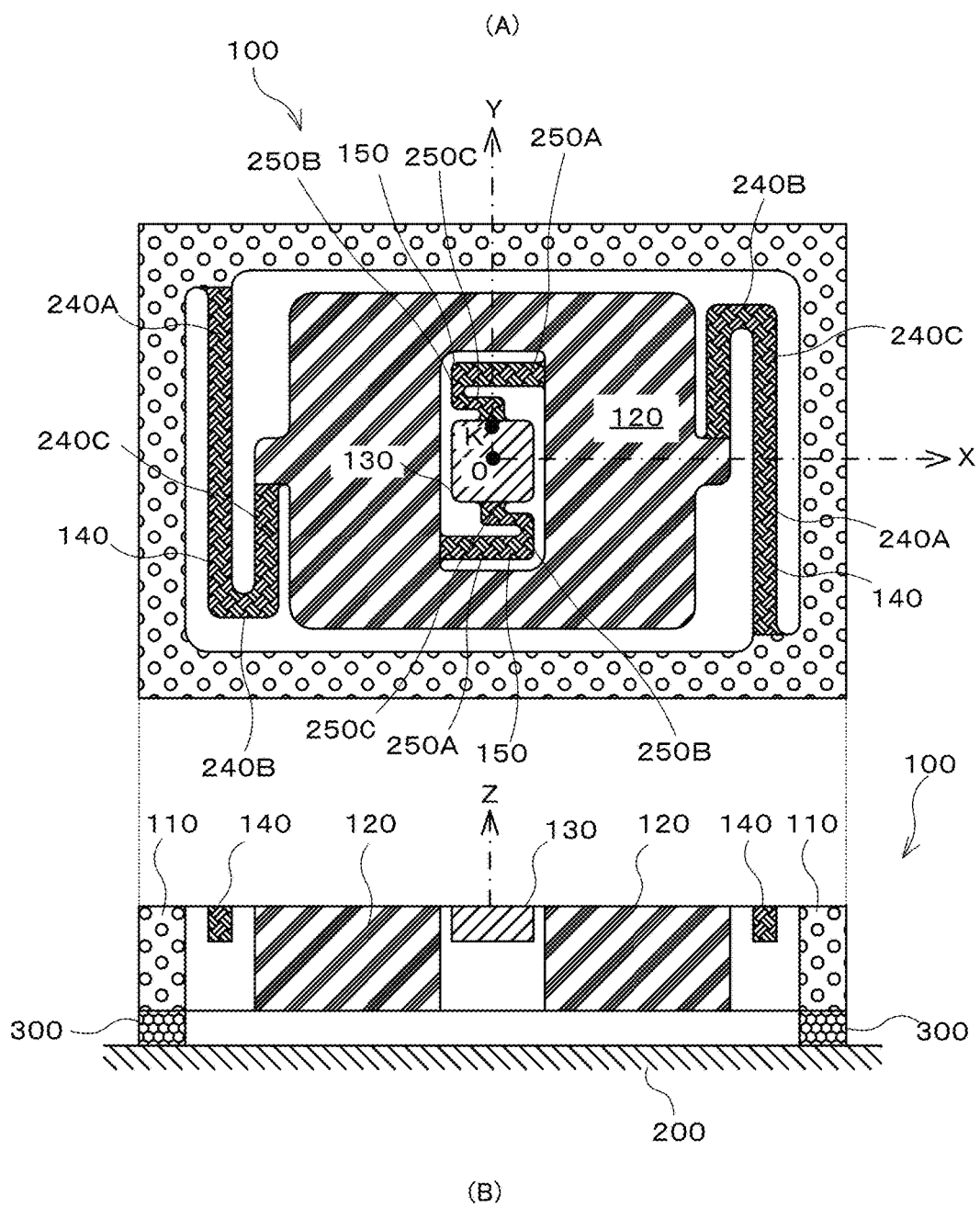
FIG. 19 illustrates a main structure of a movable reflective element according to Embodiment 6 of the present disclosure.
Figure 20:
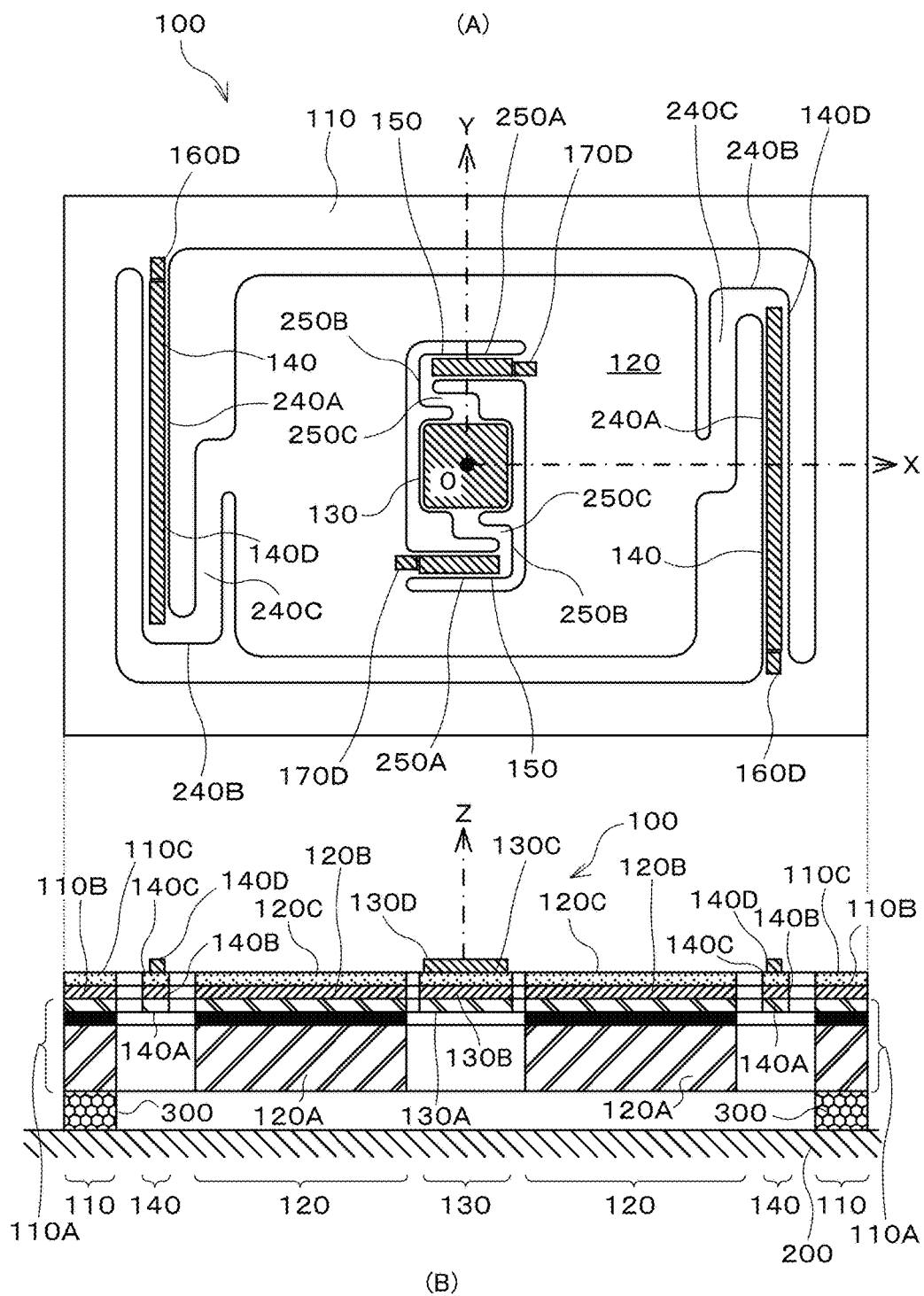
FIG. 20 illustrates the main structure (including a layer D) of a movable reflective element according to Embodiment 6 of the present disclosure.

As illustrated in FIG. 19(A), the movable reflective element 100 according to Embodiment 6 differs from the movable reflective element 100 according to Embodiment 5 in the profiles of the actuators 150. The actuator 150 of the movable reflective element 100 according to Embodiment 6 is substantially S-shaped. The movable reflective elements 100 according to Embodiments 5 and 6 are the same in other respects.

The actuator 150 includes an arm 250A (the fourth arm), an arm 250B (the fifth arm), and an arm 250C (the sixth arm). First, the configuration of the +Y-side actuator 150 (250A, 250B, and 250C) is described.

The +X-side end of the arm 250A is connected to the inner side (portion around the +Y-side corner of the inner side facing toward the −X side) of the movable frame 120. The arm 250A extends in the X-axis direction in a gap between the movable frame 120 and the mirror 130 from the +X side end toward the −X side. The arm 250A has a width that allows the arm 250A to extend in the −X direction with the arms 250A and 250C spaced apart in a gap between the movable frame 120 and the mirror 130. The arm 250A extends beyond the middle point K (on the Y axis) of the outer side of the mirror 130 in the X-axis direction, that is, beyond the Y axis. The arm 250A extends to the vicinity of the inner side facing the +X side of the movable frame 120.

The +Y-side end of the arm 250B is connected to the −X-side end of the arm 250A. The width and thickness of the arm 250B are substantially the same as those of the arm 250A. The arm 250B extends in the Y-axis direction from the +Y-side end toward the mirror 130.

The −X-side end of the arm 250C is connected to the −Y-side end of the arm 250B. The arm 250C extends along the arm 250A so as to turn back from the −Y end of the arm 250B toward the +X side. The width and thickness of the arm 250C are substantially the same as those of the arm 250A. The arm 250C is connected at the +X end thereof to the middle point (on the Y axis) K of the outer side of the mirror 130.

The arm 250A includes piezoelectric elements (150B, 150C, and 150D) formed therein. The piezoelectric elements are formed of the B layer (lower electrode layer) 150B, the C layer (piezoelectric material layer) 150C, and the D layer (upper electrode layer) 150D.

The −Y-side actuator 150 also includes the arms 250A, 250B, and 250C. In the −Y-side actuator 150, the arm 250A extends in the +X direction from the −X-side inner side of the movable frame 120 beyond the middle point of the outer side of the mirror 130, the arm 250B extends in the +Y direction from the +X-side end of the arm 250A, the arm 250C extends in the −X direction from the +Y-side end of the arm 250A and is connected to the middle point K of the outer side of the mirror 130.

Figure 21A:
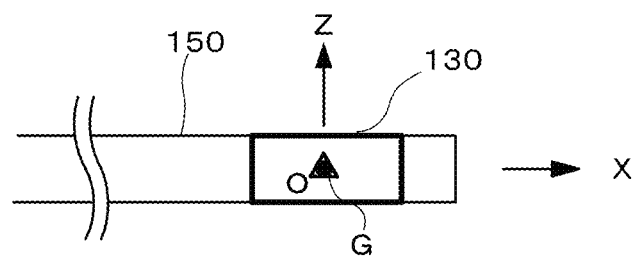
FIG. 21A is a first side view illustrating a state of a mirror tilting relative to the X-axis direction (rotating about the Y axis) in the movable reflective element according to Embodiment 6 of the present disclosure.

When the voltage is not applied across the B layer (lower electrode layer) 150B and the D layer (upper electrode layer) 150D of the piezoelectric elements (150B, 150C, and 150D) of the actuator 150, the mirror 130 is supported by the movable frame 120 and kept horizontally, as illustrated in FIG. 21A. A white triangle indicates the center of gravity G of the mirror 130. The center of gravity G coincides with the origin O of the coordinate system.

Figure 21B:
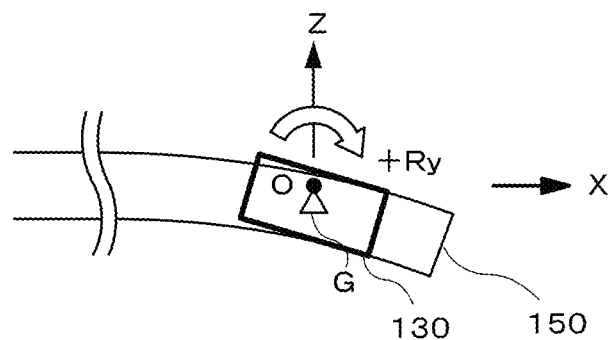
FIG. 21B is a second side view illustrating a state of the mirror tilting relative to the X-axis direction (rotating about the Y axis) in the movable reflective element according to Embodiment 6 of the present disclosure.

When the voltage of such polarity that the D layer (upper electrode layer) 150D side is positive is applied across the B layer (lower electrode layer) 150B and the D layer (upper electrode layer) 150D, the piezoelectric elements having a three-layer structure of the B layer 150B, the C layer 150C, and the D layer 150D of the arm 250A stretch in the longitudinal direction (direction perpendicular to the thickness direction) to cause the flexible A layer 150A to be stressed on the upper surface side in a direction of stretching in the plane direction (direction along the X axis). As a result, the arm 250A bows to become upwardly convex. The upwardly convex bow of the arm 250A causes, via the arm 250B, the +X end of the arm 250C to move downwardly to tilt, and thus the entire actuator 150 tilts with the +X end moving downwardly. As illustrated in FIG. 21B, the mirror 130 thus rotates about the Y axis, and rotation +Ry (the rotation direction of a right-handed screw with respect to the Y axis is positive) about the Y axis occurs. The movable reflective element 100 thereby enables the mirror 130 to tilt with the +X end thereof moving downwardly.

Figure 21C:
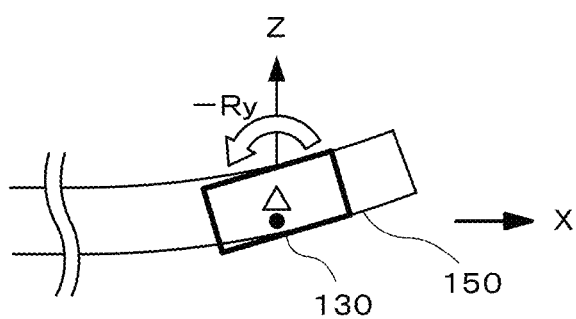
FIG. 21C is a third side view illustrating a state of the mirror tilting relative to the X-axis direction (rotating about the Y axis) in the movable reflective element according to Embodiment 6 of the present disclosure.

Application of the voltage with the reverse polarity across the B layer (lower electrode layer) 150B and the D layer (upper electrode layer) 150D causes the piezoelectric elements (150B, 150C, and 150D) having the three-layer structure of the B layer 100B, the C layer 100C, and the D layer 100D to contract in the longitudinal direction, which causes the A layer 100A of the flexible arm 250A to be stressed on the upper surface side in a direction of contracting in the plane. As a result, the arm 250 bows to become downwardly convex. The downwardly convex bow of the arm 250A causes, via the arm 250B, the +X end of the arm 250C to move upwardly to tilt, and the entire actuator 250 tilts with the +X end moving upwardly. The mirror 130 thereby rotates about the Y axis, and rotation −Ry about the Y axis occurs, as illustrated in FIG. 21C. Thus the movable reflective element 100 enables the mirror 130 to tilt with the +X end thereof moving upwardly.

For the pair of actuators 150, the polarity of the voltage applied to the +Y-side piezoelectric element is opposite to the polarity of the voltage applied to the −Y-side piezoelectric element. This enables the mirror 130 to oscillate about the Y axis relative to the movable frame 120.

The degree of tilt depends on the applied voltage. Thus adjusting the polarity and value of the applied voltage enables any adjustment of tilt angles of the mirror 130 relative to the X-axis direction.

According to the movable reflective element 100 of Embodiment 6 as described above, the length of the actuator 140 in the Y-axis direction is longer than a distance between the inner side of the fixed frame 110 and the middle point of the outer side of the movable frame 120 in the Y-axis direction. This further increases a ratio of the length of the actuator 140 to the length of the actuator 150. This enables the movable frame 120 and the mirror 130 to have a desired ratio of drive frequencies. In addition, the mirror 130 can be oscillated within a range that is sufficient in practice, for example without multiple folding of the actuators 140 and 150. Thus the movable reflective element 100 of Embodiment 6 achieves optimization of the drive frequencies and miniaturization.

In Embodiment 6, the actuators 140, the pair of members, are disposed with two-fold rotational symmetry around the origin O of the mirror 130. The actuators 150 that are the pair of members are also disposed with two-fold rotational symmetry around the mirror 130. In addition, an orientation of the arm 240A from one end connected to the fixed frame 110 toward the other end and an orientation of the arm 250A from one end connected to the movable frame 120 toward the other end are the same with respect to a rotational direction about the center of gravity of the mirror 130.

The actuators 140 and the actuators 150 are both substantially S-shaped. This enables optimization of a ratio of drive frequencies and miniaturization of the movable frame 120. This also enables the mirror 130 to be held without bias and oscillated in balanced manner.

Embodiment 7

Next, Embodiment 7 of the present disclosure is described.

The movable reflective element 100 according to Embodiment 7 is the same as the movable reflective element 100 according to Embodiment 6 except for the orientations of the actuators 150.

Figure 22:
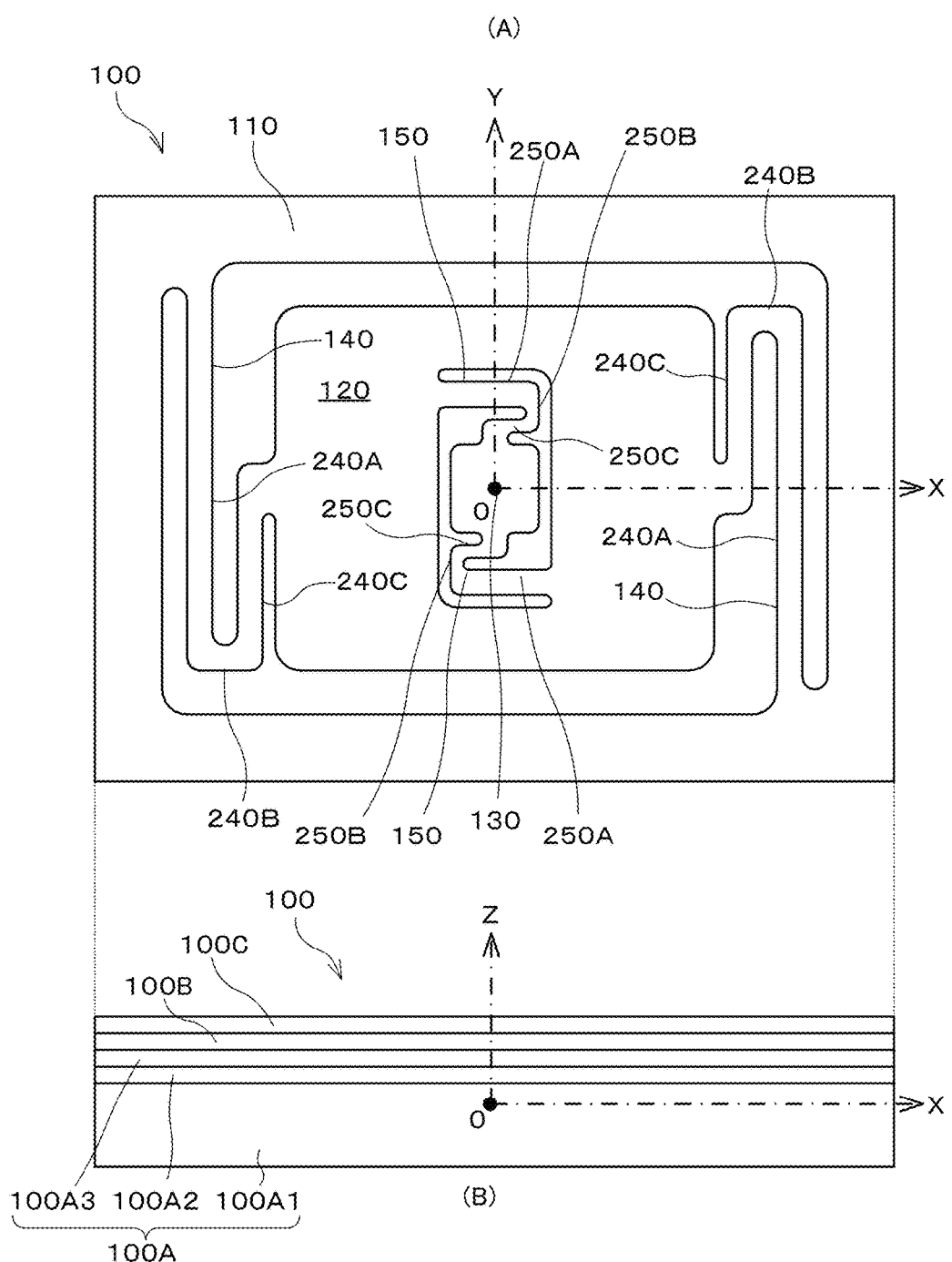
FIG. 22 illustrates a main structure (excluding a layer D) of a movable reflective element according to Embodiment 7 of the present disclosure.

As illustrated in FIG. 22(A), the actuators 140 are disposed with two-fold rotational symmetry around the origin O of the mirror 130. The actuators 150, the pair of members, are disposed with two-fold rotational symmetry around the origin O of the mirror 130. Embodiment 7 differs from Embodiment 6 in that an orientation of an arm 240A from one end connected to the fixed frame 110 toward the other end and an orientation of the arm 250A from one end connected to the movable frame 120 toward the other end are opposite with respect to the rotational direction about the origin O of the mirror 130.

For example, when two-dimensional scanning of beams with the movable reflective element 100 according to Embodiment 6 causes an projected image to be distorted, use of the movable reflective element 100 according to Embodiment 7 instead may result in correction of distortion of the image. In such cases, the movable reflective element 100 according to Embodiment 7 may be used.

According to the movable reflective element 100 of Embodiment 7 as described above, the length of the actuator 140 in the Y-axis direction is longer than a distance between the inner side of the fixed frame 110 and the middle point of the outer side of the movable frame 120 in the Y-axis direction. This further increases a ratio of the length of the actuator 140 to the length of the actuator 150. This enables the movable frame 120 and the mirror 130 to have a desired ratio of drive frequencies. In addition, the mirror 130 can be oscillated within a range that is sufficient in practice, for example without multiple folding of the actuators 140 and 150. Thus the movable reflective element 100 of Embodiment 7 achieves optimization of the drive frequencies and miniaturization.

Figure 23:
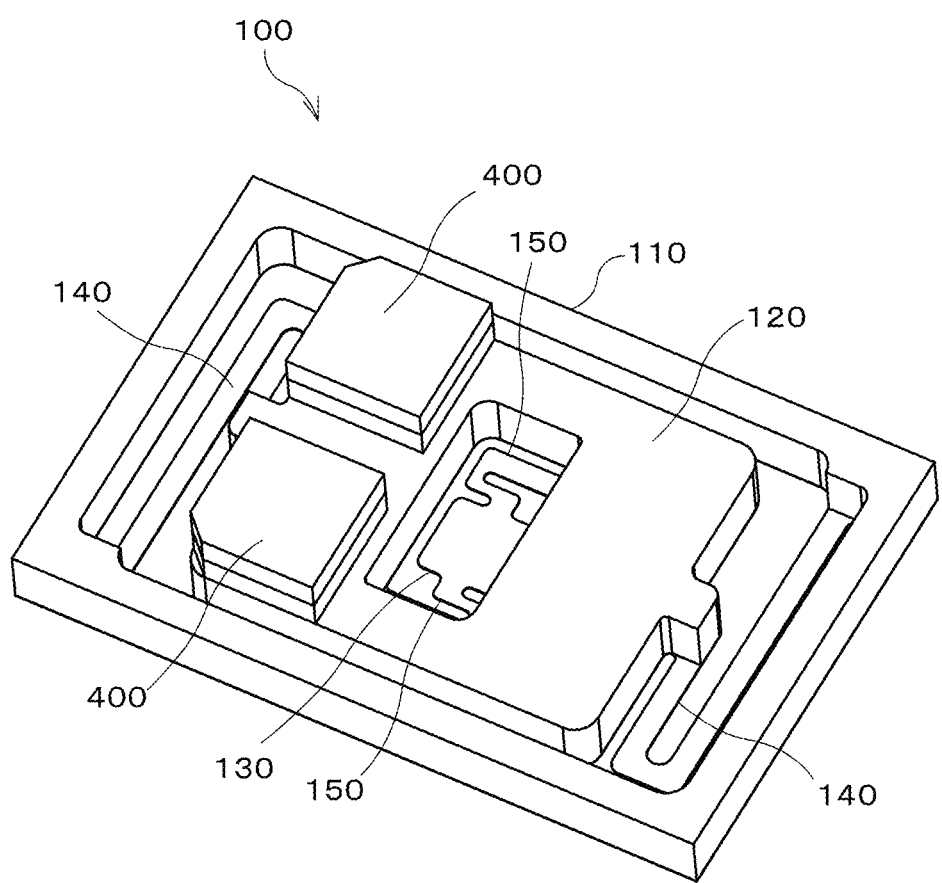
FIG. 23 is a perspective view illustrating a configuration of a movable reflective element in which weights are attached to a movable frame.

There are various other method for correcting distortion of images caused by the above-described two-dimensional scanning. For example, as illustrated in FIG. 23, attachment of weights 400 to the movable frame 120 compensates for distortion of the projected images by correction of axial misalignment of oscillation of the movable frame 120 and the mirror 130.

Places where such weights 400 are attached are not limited to the movable frame 120. The weights 400 may be attached, for example, to the mirror 130. Alternatively, the weights 400 may be attached to the actuators 140 and/or 150.

Embodiment 8

Next, Embodiment 8 of the present disclosure is described. Movable reflective elements 100 of Embodiment 8 and Embodiment 9, which is described below, are designed based on similar ideas and belong to the same group.

Figure 24:
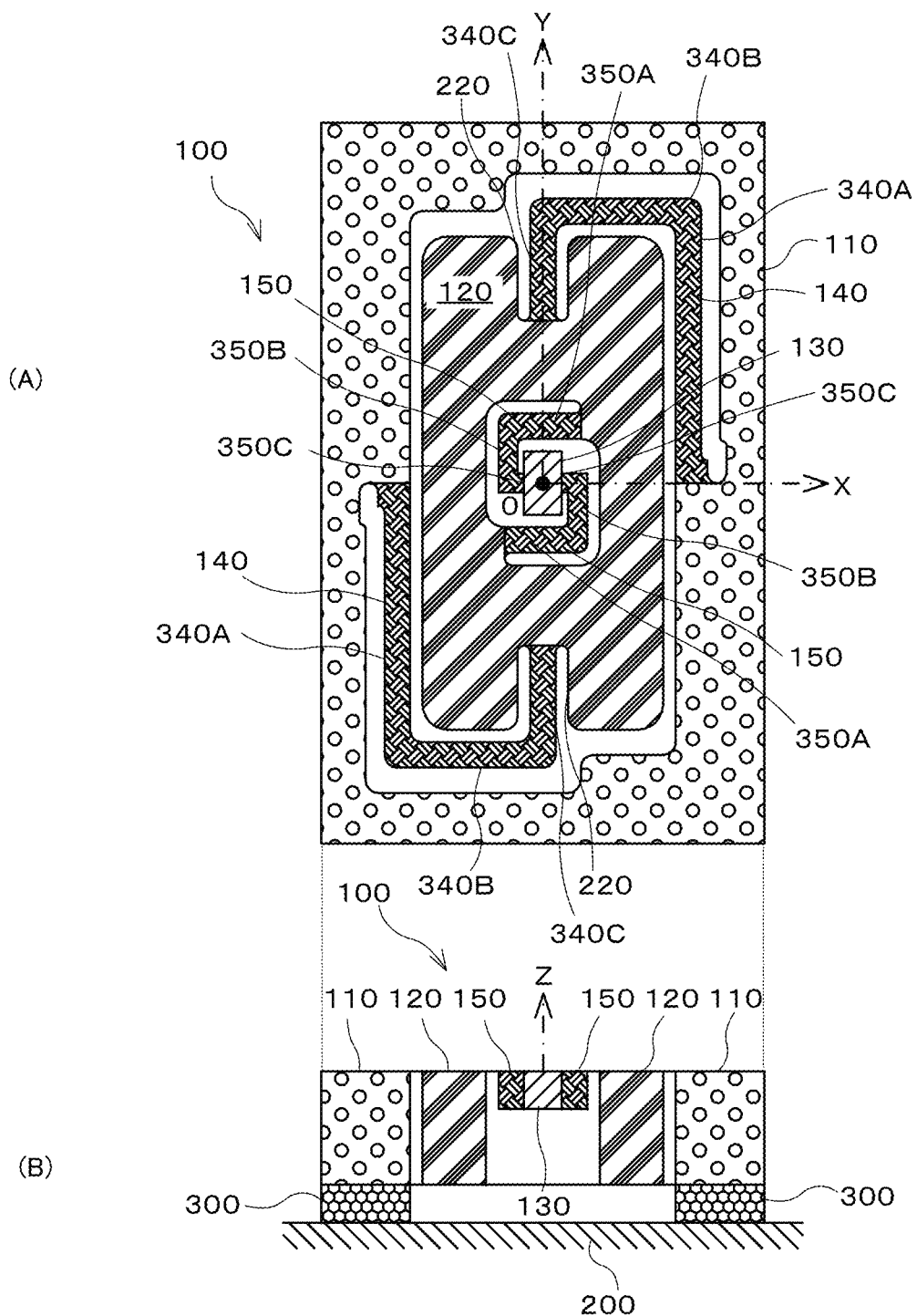
FIG. 24 illustrates a main structure of a movable reflective element according to Embodiment 8 of the present disclosure.

As illustrated in FIGS. 24(A) and 24(B), the movable reflective element 100 according to Embodiment 8 differs from the movable reflective elements 100 according to Embodiments 1 to 7 in the profiles of the movable frame 120 and the actuators 140 and 150.

The movable frame 120 includes recessed portions 220 provided on the middle point of the outer sides of the movable frame 120 on both sides in the Y-axis direction. The recessed portions 220 are provided for piezoelectric elements described below to be disposed in arms 340C. The recessed portions 220 are desirably provided on the middle points of the outer sides of the movable frame 120 on both sides in the Y-axis direction, but the places where the recessed portions are provided are not limited thereto, and any portion on the above-described outer sides is acceptable.

The actuators 140 each includes an arm 340A (the twelfth arm), an arm 340B (the thirteenth arm), and an arm 340C (the fourteenth arm). The actuators 150 each includes an arm 350A (the fifteenth arm), an arm 350B (the sixteenth arm), and an arm 350C (the seventeenth arm).

The arm 340A extends in the Y-axis direction from the inner side of the fixed frame 110, which is located on the middle point of the fixed frame 110 in the Y-axis direction, and extends beyond the outer side of the movable frame 120 in the Y-axis direction. One end of the arm 340B is connected to the other end of the arm 340A. The arm 340B extends in the −X-axis direction from the one end. One end of the arm 340C is connected to the other end of the arm 340B. The arm 340C extends along the arm 340A, and the other end of the arm 340C is connected to the recessed portion 220 of the movable frame 120.

The length of the arm 340A in the Y-axis direction is longer than a distance between the inner side located on the middle point of the fixed frame 110 in the Y-axis direction and the outer side of the movable frame 120 in the Y-axis direction. The distance between the inner side of the fixed frame 110 located on the middle point thereof in the Y-axis direction and the outer side of the movable frame 120 in the Y-axis direction is the same in design as the distance between the inner side of the corner of the fixed frame 110 between the −Y and +X sides (or the inner side of the corner of the fixed frame 110 between the +Y and −X sides) and the middle point of the outer side of the movable frame 120 in the Y-axis direction.

The arm 350A extends in the −X-axis direction from the inner side of the movable frame 120 beyond the middle point of the outer side of the mirror 130 in the X-axis direction, that is, beyond the Y axis. One end of the arm 350B is connected to the other end of the arm 350A. The arm 350B extends in the Y-axis direction from the one end. One end of the arm 350C is connected to the other end of the arm 350B. The other end of the arm 350C extends in the X-axis direction and is connected to the middle point of the outer side of the mirror 130.

Figure 25:
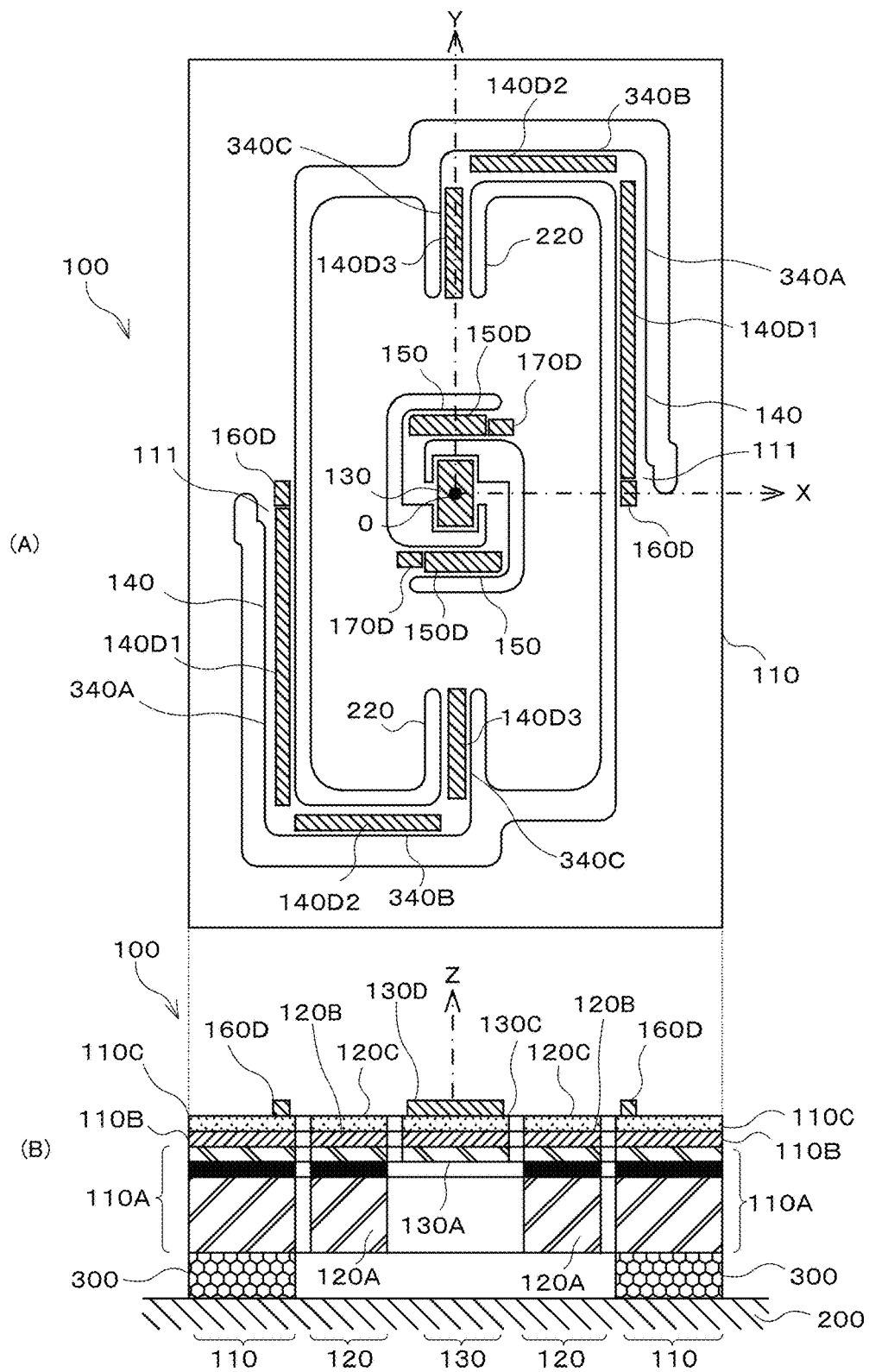
FIG. 25 illustrates a main structure (including a layer D) of a movable reflective element according to Embodiment 8 of the present disclosure.

As illustrated in FIGS. 25(A) and 25(B), the arms 340A, 340B, and 340C included in the actuator 140 include upper electrode layers 140D1, 140D2, and 140D3, respectively. This results in formation of independently movable sets of piezoelectric elements for each of the arms 340A, 340B, and 340C. Application of the voltage with the positive polarity or the negative polarity to the individual set of piezoelectric elements of each of the arms 340A, 340B, and 340C enables the arms 340A, 340B, and 340C to individually bow upwardly or downwardly. As a result, the movable frame 120 oscillates about the X axis.

The arm 350A includes the upper electrode layer 150D formed therein. This results in the piezoelectric elements formed in the arm 350A. Application of the voltage with the positive polarity or the negative polarity to the piezoelectric elements of the arm 350A causes the arm 350A to bow upwardly or downwardly. As a result, the mirror 130 oscillates about the Y axis.

According to the movable reflective element 100 of Embodiment 8 as described above, the individually movable sets of piezoelectric elements are formed in the actuator 140. Combined movement of these sets of piezoelectric elements enables the actuator 140 to finely control the oscillation state of the movable frame 120.

According to the movable reflective element 100 of Embodiment 8, the length of the actuator 140 in the Y-axis direction is longer than a distance between the inner side located on the middle point of the fixed frame 110 in the Y-axis direction and the outer side of the movable frame 120 in the Y-axis direction. This further increases a ratio of the length of the actuator 140 to the length of the actuator 150. This enables the movable frame 120 and the mirror 130 to have a desired ratio of drive frequencies. In addition, the mirror 130 can be oscillated within a range that is sufficient in practice, for example without multiple folding of the actuators 140 and 150. Thus the movable reflective element 100 of Embodiment 8 achieves optimization of the drive frequencies and miniaturization.

The movable reflective element 100 of Embodiment 8 is provided with wide portions 111. The wide portions 111 are provided in portions connecting the actuators 140 to the fixed frame 110 and have a width larger than the width of the actuators 140. The wide portions 111 help reinforce the portions, which fluctuate greatly, connecting the actuators 140 to the fixed frame 110.

Additionally, the portions connecting the actuators 150 to the movable frame 120 may also be provided with wide portions that are wider than the width of the actuators 150. Alternatively, the wide portions may be provided only in the portions connecting the actuators 150 to the movable frame 120, rather than the wide portions 111. Since either connecting portion fluctuates greatly, the wide portions help provide the reinforcement.

Embodiment 9

Next, Embodiment 9 of the present disclosure is described.

Figure 26:
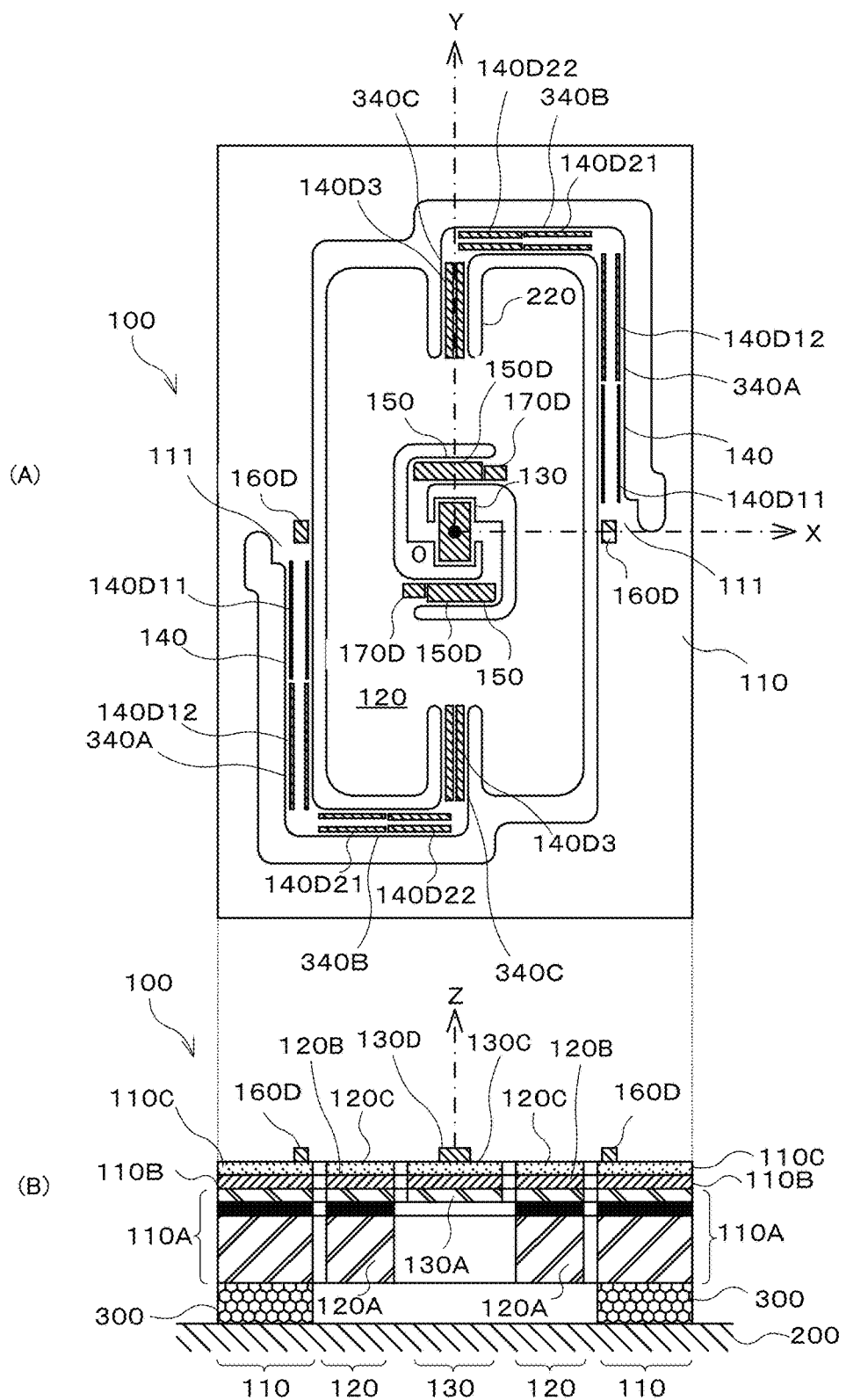
FIG. 26 illustrates a main structure of a movable reflective element of Embodiment 9 of the present disclosure.

Embodiment 9 differs from Embodiment 8 in the configuration of the upper electrode layers formed in the actuators 140. As illustrated in FIGS. 26(A) and 26(B), the arm 340A is provided with upper electrode layers 140D11 and 140D12. The upper electrode layer 140D11 is a pair of electrodes extending from a portion connecting to the fixed frame 110 to the vicinity of the middle point of the arm 340A. The upper electrode layer 140D12 is a pair of electrodes extending from the middle point of the arm 340A to the portion connecting to the arm 340B.

The arm 340B is provided with upper electrode layers 140D21 and 140D22. The upper electrode layer 140D21 is a pair of electrodes extending from the portion connecting to the arm 340A to the vicinity of the middle point of the arm 340B. The upper electrode layer 140D22 is a pair of electrodes extending from the middle point of the arm 340B to the portion connecting to the arm 340C.

The arm 340C is provided with a pair of upper electrode layers 140D3. The pair of upper electrode layers 140D3 is a pair of electrodes extending from the portion connecting to the arm 340B to the recessed portion 220 of the movable frame 120.

As described above, the actuator 140 can include the upper electrode layers formed in the length and width directions of the respective arms 340A, 340B, and 340C. This means that each of the arms 340A, 340B, and 340C includes the individually driven set of piezoelectric elements formed therein. Forming such a set of piezoelectric elements for each of the arms 340A, 340B, and 340C to be individually driven enables movement of each of the arms 340A, 340B, and 340C to be finely controlled, thereby providing more precise two-dimensional scanning of the movable reflective element 100.

The piezoelectric elements may be at least one of the paired actuators 140 or at least one of the paired actuators 150.

The actuator 140 of Embodiment 9 needs a space for forming a circuit pattern for supply of power to the downstream piezoelectric elements, and thus the widths of the sets of upper electrode layers are decreased along the path from the movable frame 120 toward the fixed frame 110.

Figure 27:
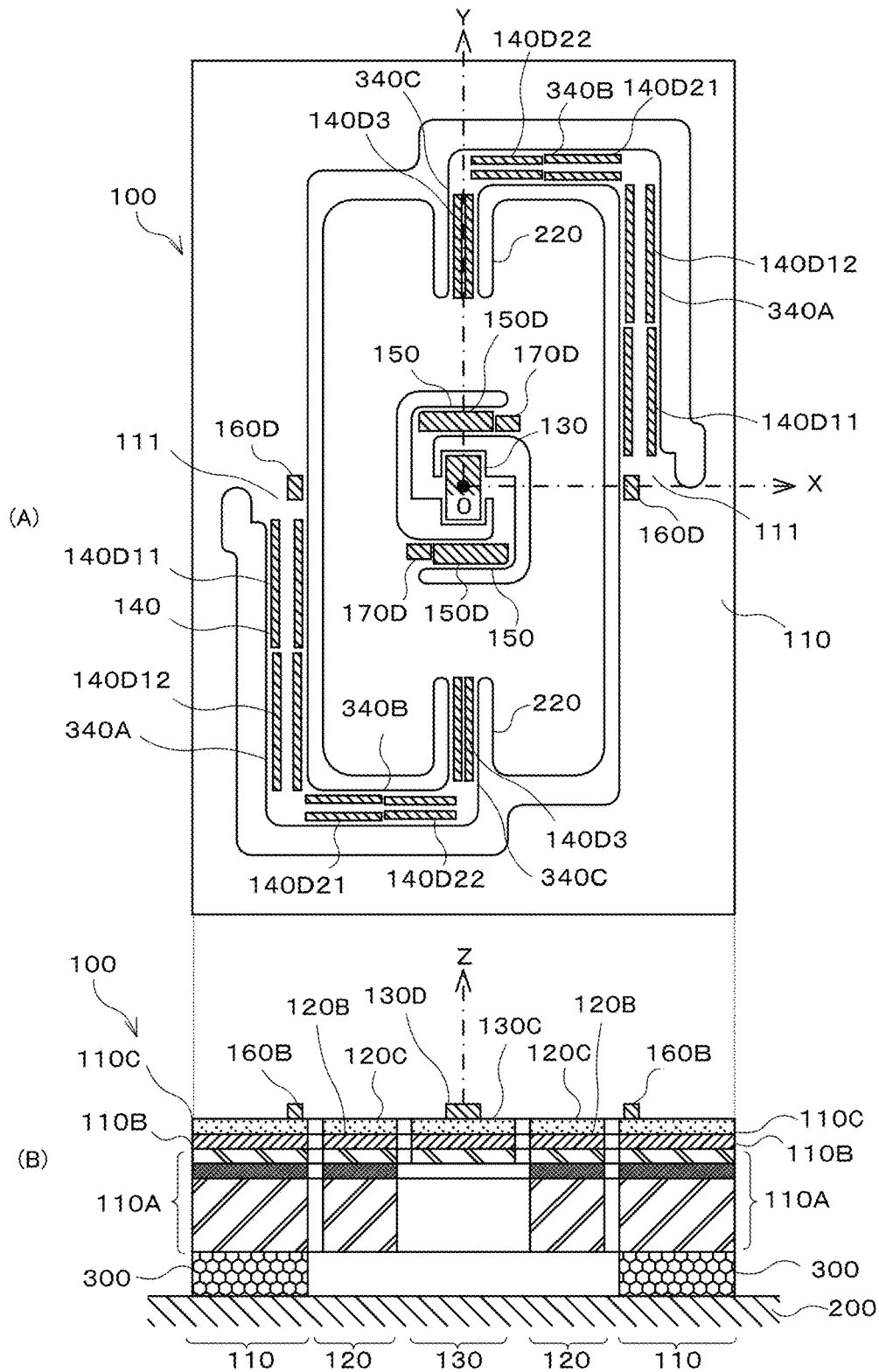
FIG. 27 illustrates a variation of a main structure (including a layer D) of the movable reflective element according to Embodiment 9 of the present disclosure.

In Embodiment 9, as illustrated in FIGS. 27(A) and 27(B), the widths of the actuator 140 may be increased in the path from the movable frame 120 toward the fixed frame 110. This design enables securing of the space for the circuit pattern for supply of power to each upper electrode layer without decreasing the widths of the sets of upper electrode layers of the actuator 140.

In Embodiment 9, the actuator 150 may be configured to have a width increasing in the path from the mirror 130 toward the movable frame 120.

As described above, the uniform width is not required for the actuators 140 and 150. That is, the width may be increased from the movable frame 120 side toward the fixed frame 110 side, or may be increased from the mirror 130 side toward the movable frame 120 side. Alternatively, the widths of the actuators 140 and 150 may be partially varied.

According to the movable reflective element 100 of Embodiment 9 as described above, the length of the actuator 140 in the Y-axis direction is longer than a distance between the inner side located on the middle point of the fixed frame 110 in the Y-axis direction and the outer side of the movable frame 120 in the Y-axis direction. This further increases a ratio of the length of the actuator 140 to the length of the actuator 150. This enables the movable frame 120 and the mirror 130 to have a desired ratio of drive frequencies. In addition, the mirror 130 can be oscillated within a range that is sufficient in practice, for example without multiple folding of the actuators 140 and 150. Thus the movable reflective element 100 of Embodiment 9 achieves optimization of the drive frequencies and miniaturization.

Embodiment 10

Next, Embodiments 10 to 12 of the present disclosure are described.

Figure 28A:
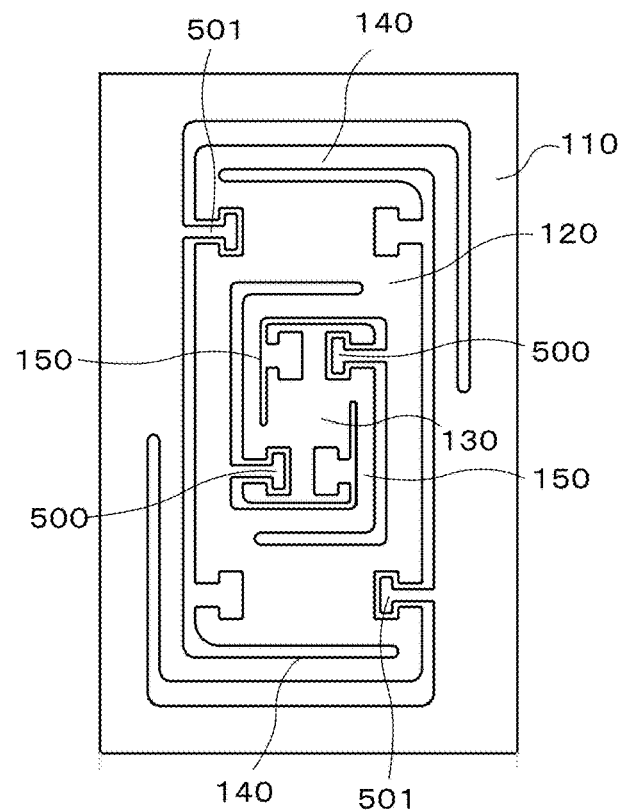
FIG. 28A is a top view of a movable reflective element according to Embodiment 10 of the present disclosure.

The movable reflective element 100 of Embodiment 10 differs from that of Embodiment 4, as illustrated in FIG. 28A, in that the movable reflective element 100 of Embodiment 10 includes restrictions (stoppers) 500 serving as first restrictions and restrictions 501 serving as second restrictions.

The restrictions 500 extend from the inner sides of the movable frame 120 and are disposed in the gaps between the movable frame 120 and the mirror 130 in order to restrict movement of the mirror 130 relative to the movable frame 120.

The restrictions 501 extend from the inner sides of the fixed frame 110 and are disposed in gaps between the fixed frame 110 and the movable frame 120 in order to restrict movement of the movable frame 120 relative to the fixed frame 110.

The movable reflective element 100 illustrated in FIG. 28A additionally includes the restrictions 500 and 501 in addition to components of the movable reflective element 100 of Embodiment 4. Similarly, the movable reflective element 100 of Embodiment 11 illustrated in FIG. 28B additionally includes the restrictions 500 and 501 in addition to components of the movable reflective elements 100 of Embodiment 6. The movable reflective element 100 of Embodiment 12 illustrated in FIG. 28C further includes the restrictions 500 and 501 in addition to components of the movable reflective element 100 of Embodiment 8.

Inclusion of such restrictions 500 and 501 prevents the movable frame 120, the mirror 130, and the like from being damaged due to applied external force.

Specifically, the outer periphery of each of the mirrors 130 of Embodiments 10 and 12 is formed so as to avoid the restrictions 500. Such forming of the outer periphery of each mirror 130 causes the restrictions 500 to abut against the outer periphery of the mirror 130 when external force is applied to the movable reflective element 100. Such configuration thus can prevent damage caused by great movement of the mirror 130 in the X-axis and Y-axis directions when the external force is applied.

Similarly, the outer periphery of each of the movable frames 120 of Embodiments 10 and 12 is formed so as to avoid the restrictions 501. Such forming of the outer periphery of the movable frame 120 causes the restrictions 501 to abut against the outer periphery of the movable frame 120 when external force is applied to the movable reflective element 100. Such configuration thus can prevent damage caused by great movement of the movable frame 120 in the X-axis and Y-axis directions when the external force is applied.

The outer periphery of each of the mirrors 130 of Embodiments 10 and 12 is formed so that the outer periphery avoids the restrictions 500 and the center of gravity of the mirror 130 in the stationary state is the center of the mirror 130. Specifically, the outer periphery of opposing sides of the above-described mirror 130 has a point-symmetrical shape with respect to the center of the mirror 130. This provides dummy cutouts at portions where the mirror has no need to avoid the restrictions 500. Such a shape of the outer periphery causes the center of gravity of the mirror 130 in the stationary state to be the center of the mirror 130, and prevents occurrence of tilt in the stationary state.

Similarly, the outer periphery of each of the movable frames 120 of Embodiments 10 and 12 is formed so that the outer periphery avoids the restrictions 501 and the center of gravity of the movable frame 120 in the stationary state is the center of the movable frame 120. Specifically, the outer periphery of opposing sides of the above-described movable frame 120 has a point-symmetrical shape relative to the center of the movable frame 120. This provides dummy cutouts at portions where the mirror has no need to avoid the restrictions 501. Such a shape of the outer periphery causes the center of gravity of the movable frame 120 in the stationary state to be the center of the movable frame 120, and prevents occurrence of tilt in the stationary state.

Figure 28B:
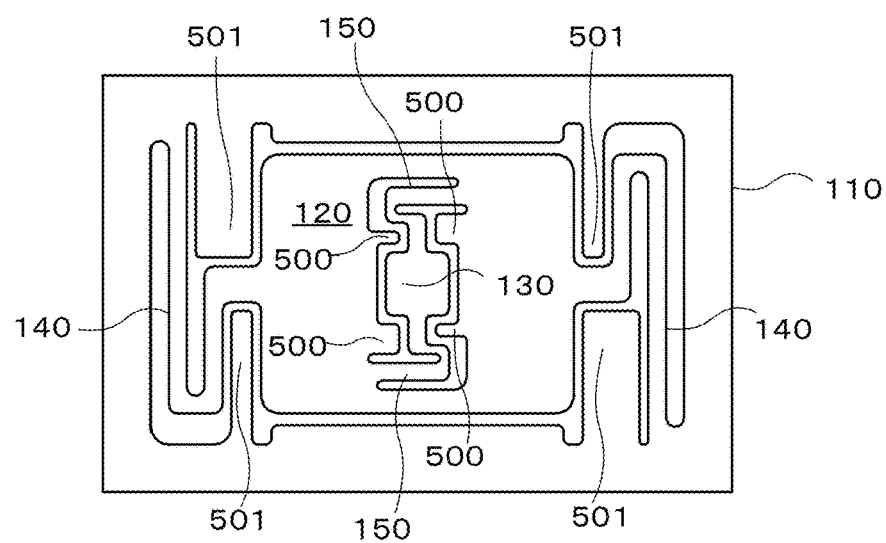
FIG. 28B is a top view of a movable reflective element according to Embodiment 11 of the present disclosure.
Figure 28C:
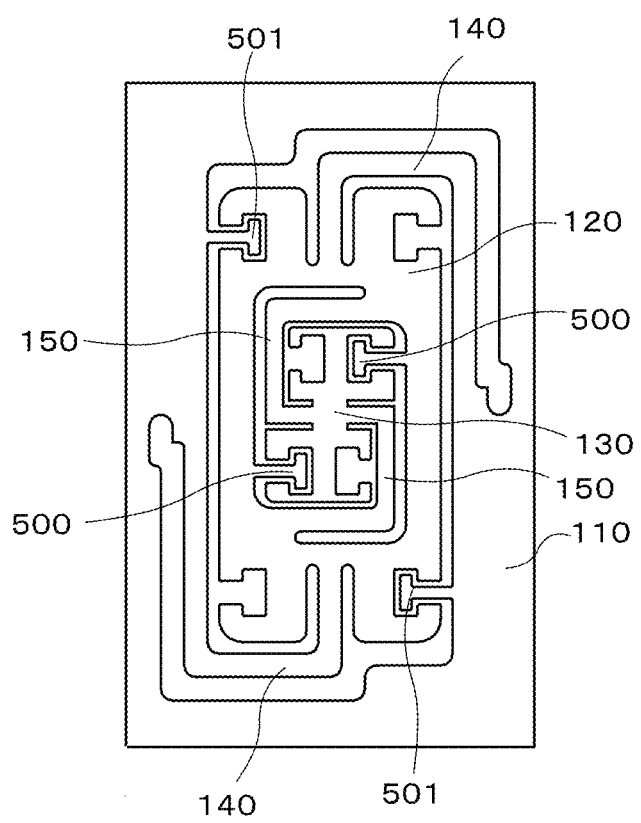
FIG. 28C is a top view of a movable reflective element according to Embodiment 12 of the present disclosure.

Although the shapes of the restrictions 500 and 501 illustrated in FIGS. 28A to 28C are depicted as having T-shapes, the shapes are not limited thereto and may take any form that has a protruding shape. Either of the restrictions 500 or restrictions 501 may be omitted.

The movable reflective elements 100 of Embodiments 1 to 12 as described above can each combine as appropriate the following features of: providing sets of piezoelectric elements in the actuators 140 and 150; having the widths of the detection electrodes smaller than the widths of the actuators; providing detection electrodes in portions connecting the fixed frame 110 to the actuators 140 and in portions connecting the mirror 130 to the actuators 150; forming the movable frame 120 thicker than the mirror 130; varying the widths of the actuators 140 and 150; attaching a weight 400 to the movable frame 120; and providing the restrictions 500 and 501.

Embodiment 13

Next, Embodiment 13 of the present disclosure is described. In the description regarding Embodiment 13, a two-dimensional scanner including the movable reflective element 100 is described.

The movable reflective elements 100 according to Embodiments 1 to 12 are each capable of tilting, with two axes of freedom, the reflective surface formed on the surface of the mirror 130. Thus two-dimensional scanning can be achieved by the two-dimensional scanner, in which the movable reflective element 100 is incorporated, for scanning light beams or directional radio waves two-dimensionally. Scanning of light beams by this two-dimensional scanner achieves a projector for projecting an image on a screen, while scanning of directional radio waves achieves an onboard radar.

Since the movable reflective elements 100 according to Embodiments 1 to 12 are suitable for miniaturization and low current consumption as MEMS elements, the movable reflective elements 100 can be optimally used by incorporation into small devices, such as portable phones, smartphones, tablet electronic terminals, and are suitable for enabling the small devices to have projector capabilities. Radar has recently become an indispensable technique for use in automobiles, and there is a need to radiate a wide range of directional radio waves. Use of the movable reflective elements 100 according to Embodiments 1 to 12 provides a compact in-vehicle device capable of providing a wide range of radar illumination.

The following description is made for a case in which a two-dimensional scanner is configured to drive the movable reflective element 100 according to Embodiments 1 to 12 with alternating-current signals and the two-dimensional scanner is incorporated into a projector. This two-dimensional scanner is also applicable for the above-described in-vehicle radar device.

Figure 29:
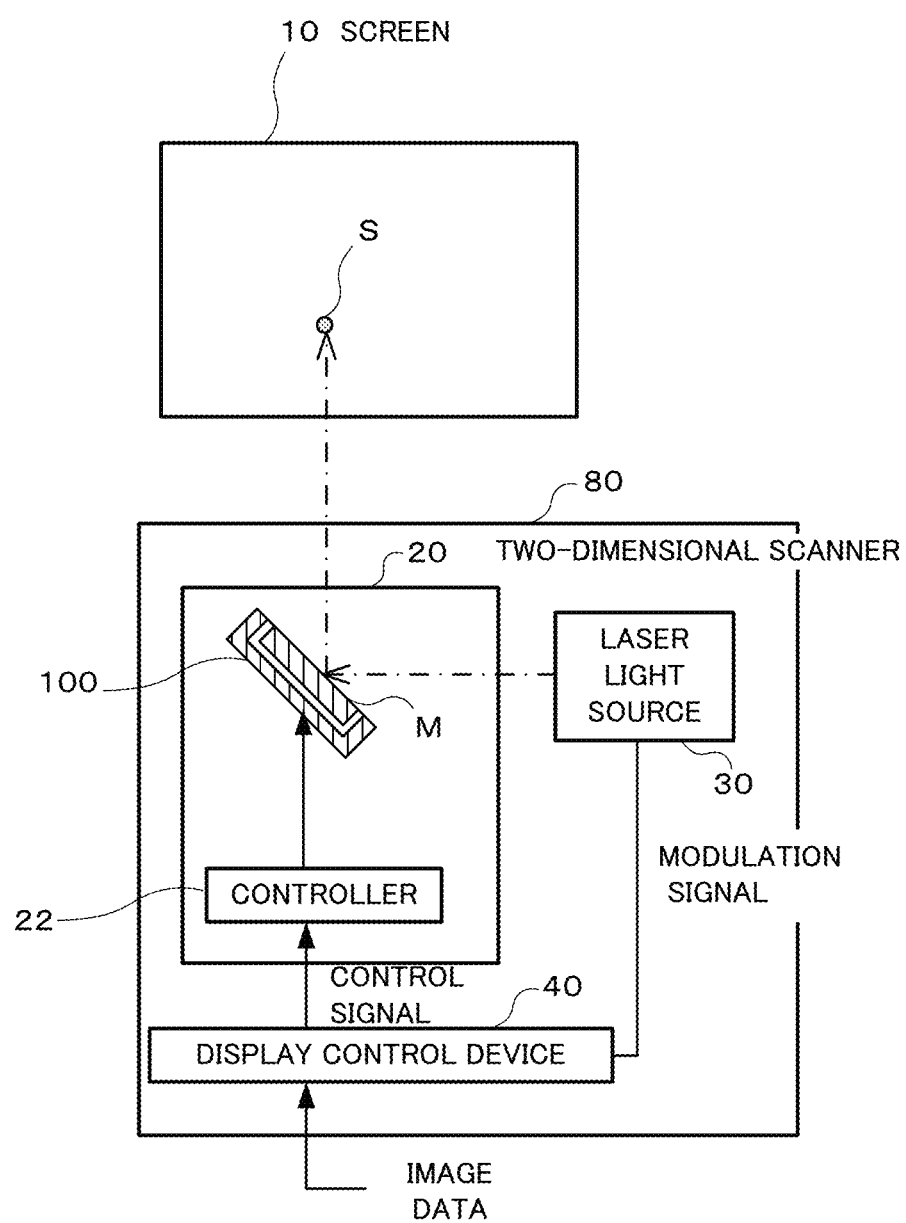
FIG. 29 is a block diagram illustrating a configuration of a projector using a two-dimensional scanner according to Embodiment 13 of the present disclosure.

FIG. 29 is a block diagram illustrating a configuration of a projector 80 using a two-dimensional scanner. The projector 80 has functions to project an image on a screen 10. The projector 80 includes a two-dimensional scanner 20, a laser light source 30, and a display control device 40. For application to the radar device, a radio source (antenna) for generating directional radio waves is included instead of the laser light source 30.

The two-dimensional scanner 20 includes a movable reflective element 100 and a controller 22. The movable reflective element 100 is the movable reflective element 100 according to Embodiments 1 to 12. Application of alternating voltage to piezoelectric elements included in the movable reflective element 100 enables a mirror 130 having a reflective surface M parallel to the XY-plane to tilt relative to the Y-axis direction (about X axis) and relative to the X-axis direction (about Y axis). The controller 22 provides drive signals (alternating voltage) to the piezoelectric elements of the movable reflective element 100.

The movable reflective element 100 includes actuators 140 and 150, as described above. The controller 22 provides a first drive signal having a first period H1 to the piezoelectric elements of the actuators 150 and provides a second drive signal having a second period H2 to the piezoelectric elements of the actuators 140.

The laser light source 30 generates a laser beam, and irradiates with the laser beam a reflective surface M of the movable reflective element 100 in the two-dimensional scanner 20. The laser beam reflected at the reflective surface M forms a spot S in place on the screen 10. Two-dimensional tilting of the reflective surface M of the movable reflective element 100 enables two-dimensional scanning of a position of the spot S formed on the screen 10.

The display control device 40 performs, on the basis of externally provided image data, a display control for displaying an image on the screen 10. Specifically, the display control device 40 provides to the laser light source 30 a modulation signal based on the image data for an image to be displayed, and provides a control signal to the controller 22 of the two-dimensional scanner 20.

The laser light source 30 generates, on the basis of the modulation signal provided by the display control device 40, a laser beam having intensity and/or wavelength modulated, and irradiates with the laser beam the reflective surface M of the mirror 130 of the movable reflective element 100 in the two-dimensional scanner 20. When the image to be displayed is a monochrome image, the intensity of a monochromatic laser beam, which is generated by the laser light source 30, may be modulated. When the image to be displayed is a color image, a complex light source for generating three-primary color (RGB) laser beams may be used as an example of the laser light source 30, and the intensities of the laser beams may be modulated individually for each primary color.

The two-dimensional scanner 20 oscillates the mirror 130 of the movable reflective element 100 on the basis of the control signal received from the display control device 40 so that the spot S formed on the screen 10 by the laser beam reflected on the reflective surface M moves on the screen 10 two-dimensionally.

The control signal provided by the display control device 40 to the two-dimensional scanner 20 is a signal that indicates switching on/off of an oscillation motion of the mirror 130 of the movable reflective element 100 and timing of the oscillation motion. The display control device 40 provides to the two-dimensional scanner 20 a control signal synchronized to the timing of the modulation signal provided to the laser light source 30. As a result, the position of the spot S on the screen 10 is synchronized with modulation content of the laser beam forming the spot S, which results in the image displayed on the screen 10 in accordance with the image data.

Figure 30A:
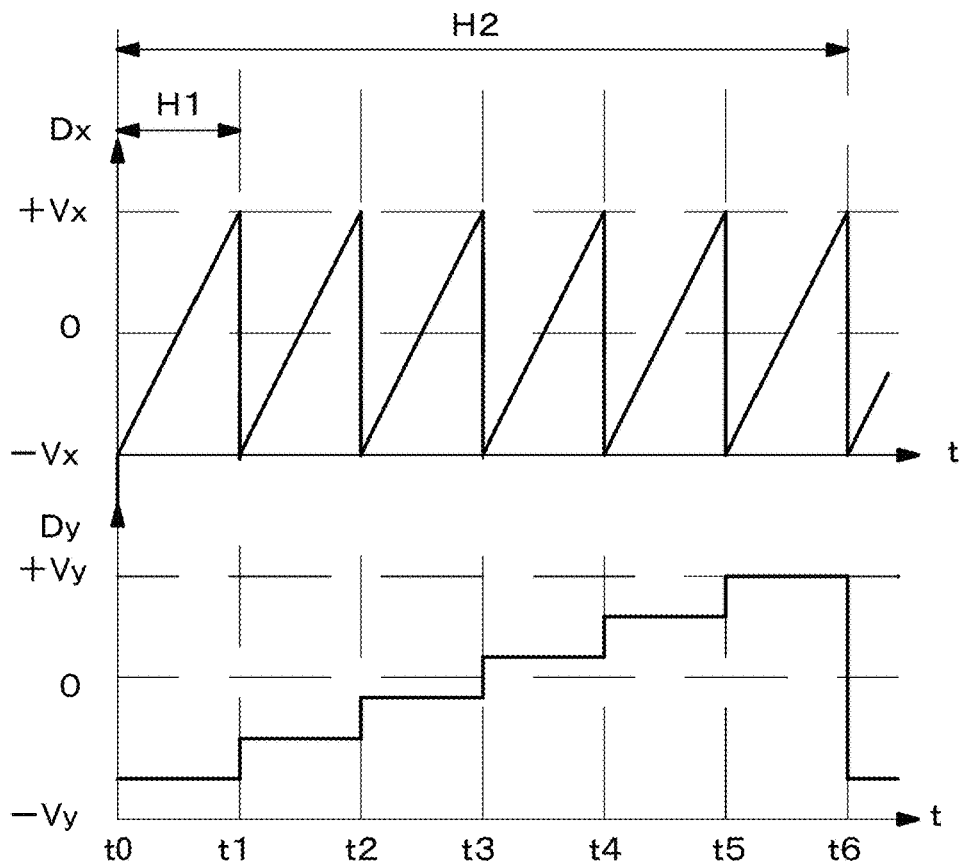
FIG. 30A graphically illustrates signal waveforms of a first drive signal and a second drive signal.
Figure 30B:
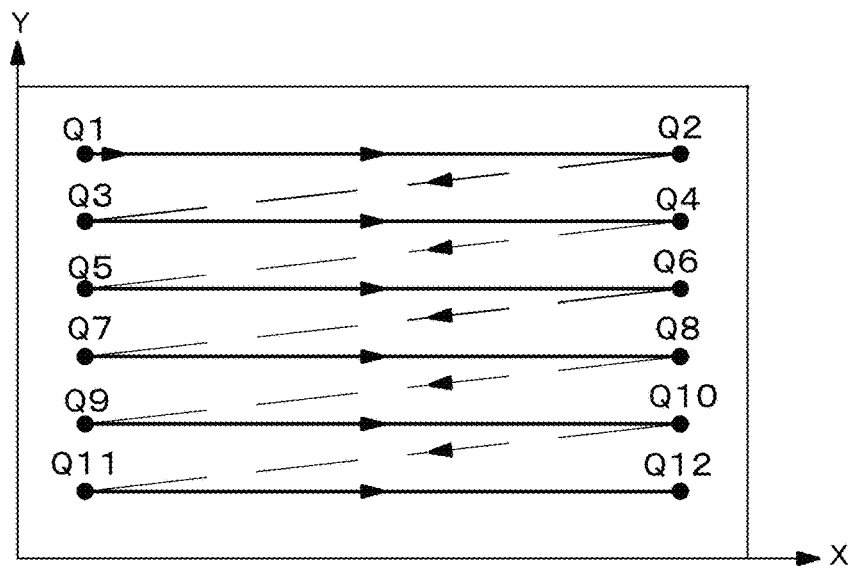
FIG. 30B is a graph illustrating appearance of two-dimensional scanning of a beam on a screen, as obtained when the first and second drive signals are provided to a movable reflective element.

The following is a description of the specific operation of the beam scan by the two-dimensional scanner 20. Here, the description for the movable reflective element 100 embedded in the two-dimensional scanner 20 is made, as an example, using the movable reflective element 100 according to Embodiment 5. FIG. 30A graphically illustrates an example of signal waveforms of drive signals Dx and Dy provided by the controller 22 to the movable reflective element 100 in the projector 80 illustrated in FIG. 29, while FIG. 30B is a graph illustrating how beams are scanned on the screen 10 in two dimensions, which is obtained when such drive signals Dx and Dy are provided to the movable reflective element 100.

The upper graph of FIG. 30A illustrates a first drive signal Dx having a sawtooth signal waveform and a first period H1, while the lower graph of FIG. 30A illustrates a second drive signal Dy having a stepped signal waveform and a second period H2. Here, an example with a relationship, H2=6×H1, is shown, but the ratio is set greater in practice.

As illustrated in FIG. 30A, the voltage value of the first drive signal Dx rises from −Vx to +Vx in the first period of time from t0 to t1 along the time axis t and then falls to −Vx at time t1, and subsequently, rises from −Vx to +Vx in a second period of time from t1 to t2 and then falls to −Vx at time t2, and so on. When such a first drive signal Dx is applied to the piezoelectric elements of the actuators 150 of the movable reflective element 100 illustrated in FIG. 17(A), the mirror 130 oscillates with the period H1 relative to the X-axis direction (about the Y axis).

The voltage value of the second drive signal Dy rises from −Vy to +Vy in steps, each having a unit time corresponding to the period H1, in the period of time from t0 to t6 along the time axis t, and this cycle repeats with the period H2. When such a second drive signal Dy is applied to the piezoelectric elements of the actuators 140 of the movable reflective element 100 illustrated in FIG. 17(A), the movable frame 120 and the mirror 130 oscillate with the period H2 relative to the Y-axis direction (about the X axis).

In practice, the first drive signal Dx may be supplied to the D layer (upper electrode layer) 150D of the actuator 150 with the B layer (lower electrode layer) 100B of the movable reflective element 100 fixed to a ground potential, and the second drive signal Dy may be supplied to the D layer (upper electrode layer) 140D of the actuator 140, thereby achieving drive operation of the two-dimensional scan. FIG. 30B illustrates a scan path of the spot S obtained on the screen 10 when the drive operation of such a two-dimensional scan is performed. Here, the direction of the length of the screen 10 corresponds to the X-axis direction of the movable reflective element 100 illustrated in FIG. 17(A), while the direction of the width of the screen 10 corresponds to the Y-axis direction of the movable reflective element 100 illustrated in FIG. 17(A).

As illustrated in FIG. 30B, the position of the spot S, as illustrated in a solid line, moves from the scan point Q1 at the upper left corner of the screen 10 to the right horizontally and reaches the scan point Q2, and then immediately jumps to the position of the scan point Q3 as illustrated in dashed lines. Repetition of such a scan causes the spot S to move on the screen 10 in a zigzag pattern, and eventually reach the scan point Q12 at the lower right corner. This type of scan is a commonly used raster scan, and the scan from the scan point Q1 to the scan point Q12 provides display of one frame of the image.

Subsequently, the spot S jumps from the scan point Q12 to the scan point Q1, and the zigzag scan from the scan point Q1 to the scan point Q12 is performed again. This means that the next frame of the image is displayed. Here, the horizontal scan period illustrated in solid lines corresponds to the period H1 illustrated in FIG. 30A, while the scan period from the scan point Q1 to the scan point Q12 corresponds to the period H2 illustrated in FIG. 30A. When such a raster scan is performed, the display control device 40 extracts individual pieces of pixel data of the image data in order according to the order of arrangement of the pixels, and the extracted pieces of pixel data are provided to the laser light source 30 as the modulation signal with the timing synchronized with the period H1 of the drive signal Dx and the period H2 of the drive signal Dy.

On the waveform of the drive signal, the scan points Q1, Q3, Q5, Q7, Q9, and Q11 of FIG. 30B correspond to the time t0, t1, t2, t3, t4, and t5 on the time axis t of FIG. 30A, respectively. In actual practice, however, mechanical delay may arise until tilt of the mirror 130 after stretching and contracting of the piezoelectric elements of the movable reflective element 100, even though the drive signals Dx and Dy illustrated in FIG. 30A are supplied from the controller 22 to the movable reflective element 100. This results in a delayed phase of the scan motions of the spot S on the screen 10 with respect to the phases of the drive signals Dx and Dy. In real time, the times when the spot S reaches the scan points Q1, Q3, Q5, Q7, Q9, and Q11 are the times delayed from the respective times t0, t1, t2, t3, t4, and t5.

Figure 31A:
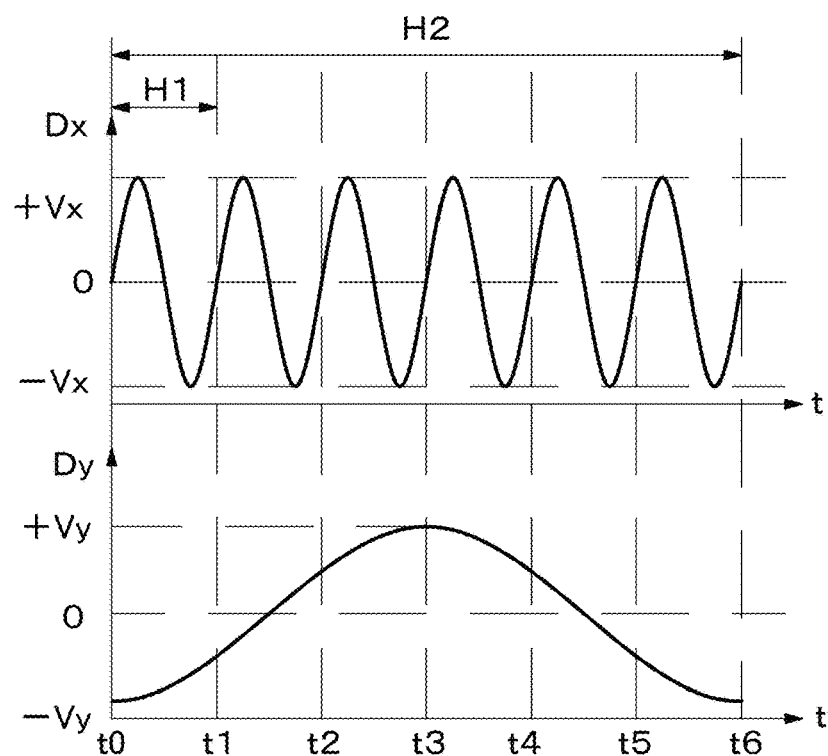
FIG. 31A graphically illustrates another variation of signal waveforms of a first drive signal and a second drive signal.
Figure 31B:
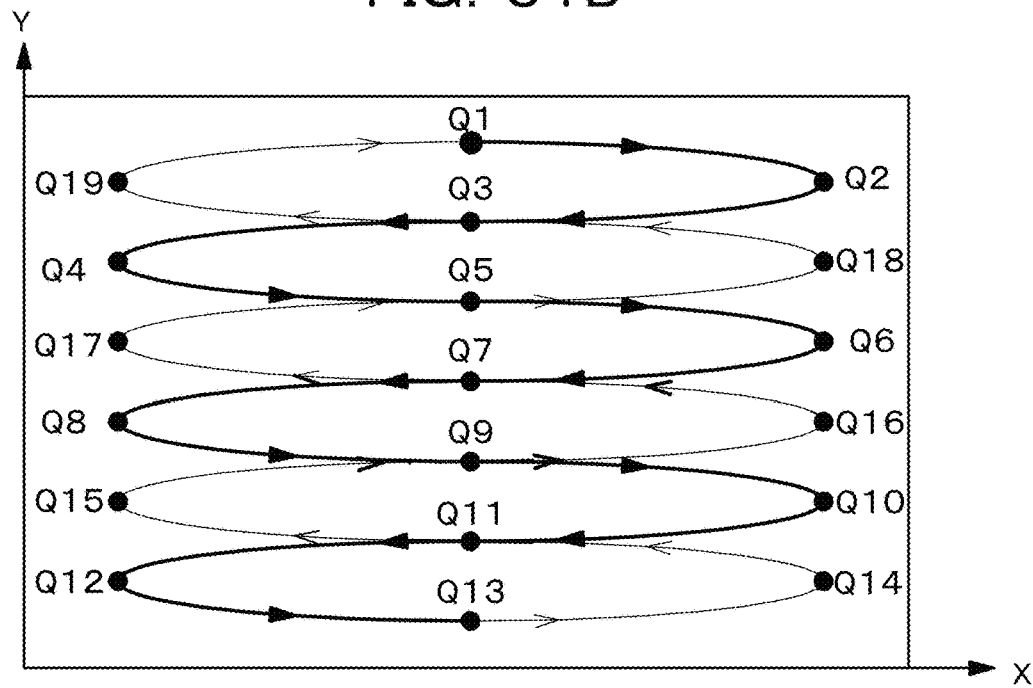
FIG. 31B is a graph illustrating how beams are scanned on a screen in two dimensions, which is obtained when the first and second drive signals are provided to a movable reflective elements.

FIG. 31A illustrates the signal waveforms of the drive signals Dx and Dy used for scanning the spot S in a scanning scheme other than the above-described scanning scheme. FIG. 31B illustrates scan lines of light beams on the screen 10, which are obtained when such drive signal Dx and Dy are supplied to the movable reflective element 100. As illustrated in FIG. 31A, this type of scanning scheme uses a first drive signal Dx having a sine wave and a first period H1, and uses a second drive signal Dy having a sine wave and a second period H2.

When the first drive signal Dx, which is a sine wave having the voltage value ranging from −Vx to +Vx and the period H1, is provided to the piezoelectric elements of the actuator 150 of the movable reflective element 100 illustrated in FIG. 17(A), the mirror 130 oscillates relative to the X-axis direction (about the Y axis), and the spot S on the screen 10 is subjected to a simple harmonic motion with the period H1 relative to the X-axis direction. When the second drive signal Dy, which is a sine wave having the voltage value ranging from −Vy to +Vy and the period H2, provided to the piezoelectric elements of the actuator 140 of the movable reflective element 100 illustrated in FIG. 17(A), the mirror 130 oscillates relative to the Y-axis direction (about the X axis), and the spot S on the screen 10 is subjected to a simple harmonic motion relative to the Y-axis direction.

In practice, the first drive signal Dx may be supplied to the D layer (upper electrode layer) 100D with the B layer (lower electrode layer) 100B of the movable reflective element 100 fixed to a ground potential, and the second drive signal Dy may be supplied to the D layer (upper electrode layer) 100D, thereby achieving the drive operation. FIG. 31B illustrates a scan path of the spot S obtained on the screen 10 when the drive operation of such a two-dimensional scan is performed. Again, the direction of the length of the screen 10 corresponds to the X-axis direction of the movable reflective element 100 illustrated in FIG. 17(A), while the direction of the width of the screen 10 corresponds to the Y-axis direction of the movable reflective element 100 illustrated in FIG. 17(A).

As illustrated in FIG. 31B, the position of the spot S moves along a figure-eight-shaped smooth line illustrated in a solid line. This movement path is a circulation path in one stroke, and, starting from the scan point Q1, cycles in the path from Q1, through Q2, Q3, . . . , and Q19, back to Q1. Here, the scan point Q1 corresponds to time t0, the scan point Q5 (first half) corresponds to the time t1, the scan point Q9 (first half) corresponds to the time t2, the scan point Q13 corresponds to the time t3, the scan point Q9 (second half) corresponds to the time t4, the scan point Q5 (second half) corresponds to the time t5, and the scan point Q1 (second half) corresponds to the time t6. This type of the scanning scheme is hereinafter referred to as a "figure-eight-shaped scanning scheme".

In practice, as described above, mechanical delay may arise until tilt of the mirror 130 after stretching and contracting of the piezoelectric elements of the movable reflective element 100, even though the drive signals Dx and Dy illustrated in FIG. 31A are supplied from the controller 22 to the movable reflective element 100. This results in a delayed phase of the scan motions of the spot S on the screen 10 with respect to the phases of the drive signals Dx and Dy. Thus on the waveform of the drive signal, the scan points Q1, Q5, Q9, Q13, Q9, Q5, and Q1 of FIG. 31B correspond to the time t0, t1, t2, t3, t4, t5, and t6 on the time axis t of FIG. 31A, respectively. In real time, the times when the spot S reaches the scan points Q1, Q5, Q9, Q13, Q9, Q5, and Q1 are the time delayed from the respective times t0, t1, t2, t3, t4, t5, and t6.

In the "figure-eight-shaped scanning scheme", the movement path of the spot S, which differs from that of the commonly used raster scanning, is not a path along the pixel arrangement (two-dimensional matrix of rows and columns) of a typical image. When the "figure-eight-shaped scanning scheme" is used in the projector 80 illustrated in FIG. 29, the display control device 40 needs to predict the position of the spot S on the screen 10, extract data corresponding to pixels at the predicted positions from the image data, and provide the extracted data to the laser light source 30.

However, when the two-dimensional scanner is used as, for example, backlight illumination for liquid crystal display elements instead of the projector, the image data is not need, thus dispensing with the modulation process associated with the laser light source 30. Thus in the application to such backlight illumination, use of the "figure-eight-shaped scanning scheme" capable of providing the smooth scan path is preferable compared with the use of the raster scan.

Adjustment of Resonance Frequency

When the two-dimensional scanner 20 according to Embodiment 13 is applied to the projector 80 or the like, the reflective surface M of the movable reflective element 100 has preferably the widest possible range of tilt angle. An increase in the tilt angle of the reflective surface M needs an increase in an amplitude of the oscillatory motion of the mirror 130. The increase in the amplitude needs an increase in the voltage to be supplied to the piezoelectric elements. However, even when the alternating signals with the same voltage are supplied, the amplitude of the oscillatory motion of the mirror 130 varies depending on the frequency. This is because the energy efficiency in the oscillating system is typically highest when the mirror 130 is vibrated at a resonance frequency inherent to the oscillating system.

For example, the resonance frequency f of the mirror 130 of the movable reflective element 100 having a structure as illustrated in FIG. 17(A) is a unique physical value that is uniquely determined by materials of components and dimensions or shapes of the actuators. Vibration of the mirror 130 at this resonance frequency f provides the most improved energy efficiency. In other words, the supply voltage necessary for the same amplitude is the lowest when the mirror 130 is vibrated at the resonance frequency f.

When the mirror 130 is vibrated at the resonance frequency f, supply of the alternating drive signal with a voltage on the order of 5 V to the piezoelectric elements is sufficient, although when the mirror 130 is vibrated at a particular non-resonance frequency, the alternating drive signal with a voltage of 500 to 1000 V may be needed in some cases. When the movable reflective element 100 is formed as a fine semiconductor element such as a MEMS element, drive of the movable reflective element 100 at such a high voltage may cause dielectric breakdown.

In light of the above, the vibration of the mirror 130 of the movable reflective element 100 at the resonance frequency f is preferable for practical operation. In other words, when the movable reflective element 100 has a predetermined application, the mechanical structure of the movable reflective element 100 is preferably designed so that the oscillation frequency suitable for the application coincides with the resonance frequency f.

For example, consider that the two-dimensional scanner 20 according to Embodiment 13 is used for the projector 80 as illustrated in FIG. 29. In this projector 80, as described above, for example, the drive signals Dx and Dy as illustrated in FIG. 30A are supplied from the controller 22 to the movable reflective element 100, and the scan of the spot S as illustrated in FIG. 30B is performed on the screen 10.

Here, it is assumed in the projector 80 that, for example, the frequency fx of the drive signal Dx in the direction along the X axis direction is set to fx=10 kHz (period H1=$\frac{1}{10000}$ sec), and the frequency fy of the drive signal Dy in the direction along the Y axis is set to fy=100 Hz (period H1=$\frac{1}{100}$ sec). Such settings of the drive signals correspond to the settings in which the horizontal scan time between the scan points Q1 and Q2 in FIG. 30A is set to $\frac{1}{10000}$ sec, a single screen is made up of 100 horizontal scan lines, and the vertical scan time from the scan point Q1 to the scan point Q12 in FIG. 30B is set to $\frac{1}{100}$ sec.

Thus, when the movable reflective element 100 is previously determined to be used in the application in which the vibration in the direction along the X axis is set at the frequency fx=10 kHz and the vibration in the direction along the Y axis is set at the frequency fy=100 Hz, care may be preferably taken at the design phase of the movable reflective element 100 such that these frequencies fx and fy are the resonance frequencies. The projector 80 into which such designed movable reflective element 100 is incorporated operates highly efficiently because the mirror 130 is vibrated at the natural resonance frequencies.

As described above, when the two-dimensional scanner 20 is used by incorporation into the projector 80, a large difference typically occurs between the horizontal scan time and the vertical scan time. Thus a large difference also occurs between the resonance frequency fx for the direction along the X axis and the resonance frequency fy for the direction along the Y axis, both of which frequencies are required for the movable reflective element 100. In fact, in the example above, fx=10 kHz while fy=100 Hz, in which a significant 100-fold difference occurs between both the frequencies. Thus the movable reflective element 100 for such a projector 80 is required to have different resonance frequencies fx and fy in the respective directions along the X axis and the Y axis of the mirror 130.

In general, there are multiple resonance frequencies f for an oscillating system, and the resonance frequencies are referred to as a first-order resonance frequency, a second-order resonance frequency, and so on, in order of increasing frequency. Thus, when the movable reflective element is designed such that the resonance frequency for the direction along the X axis is fx and the resonance frequency for the direction along the Y axis is fy, the designing may be performed such that a certain-order resonance frequency for the direction along the X axis is fx and a certain-order resonance frequency for the direction along the Y axis is fy.

However, if any of the resonance frequencies for the direction along the X axis coincides with any of the resonance frequency for the direction along the Y axis, some disadvantageous interference may occur between the vibration in the direction along the X axis and the vibration in the direction along the Y axis. Thus, in practice, the designing is preferably performed such that none of the resonance frequencies for the direction along the X axis coincides with any of the resonance frequencies for the direction along the Y axis.

Although various forms of designs to produce different resonance frequencies fx and fy can be contemplated, the form that the inventors consider as being the most practical adjusts the resonance frequencies fx and fy in accordance with the length, width or thickness of each of the actuators 140 and 150. The following description is made for a specific method of design to produce different resonance frequencies fx and fy on the basis of the structure of the movable reflective element 100 illustrated in FIG. 8(A).

In general, designing the width W1 of the actuator 140 to be narrower than the width W2 of the actuator 150 achieves the effect of making the resonance frequency of the direction in the X axis of the mirror 130 higher than the resonance frequency of the direction in the Y axis of the mirror 130. Conversely, of course, when the resonance frequency of the direction along the Y axis is set higher than the resonance frequency of the direction along the X axis, the width W1 of the actuator 140 may be designed to be greater than the width W2 of the actuator 150.

Figure 32:
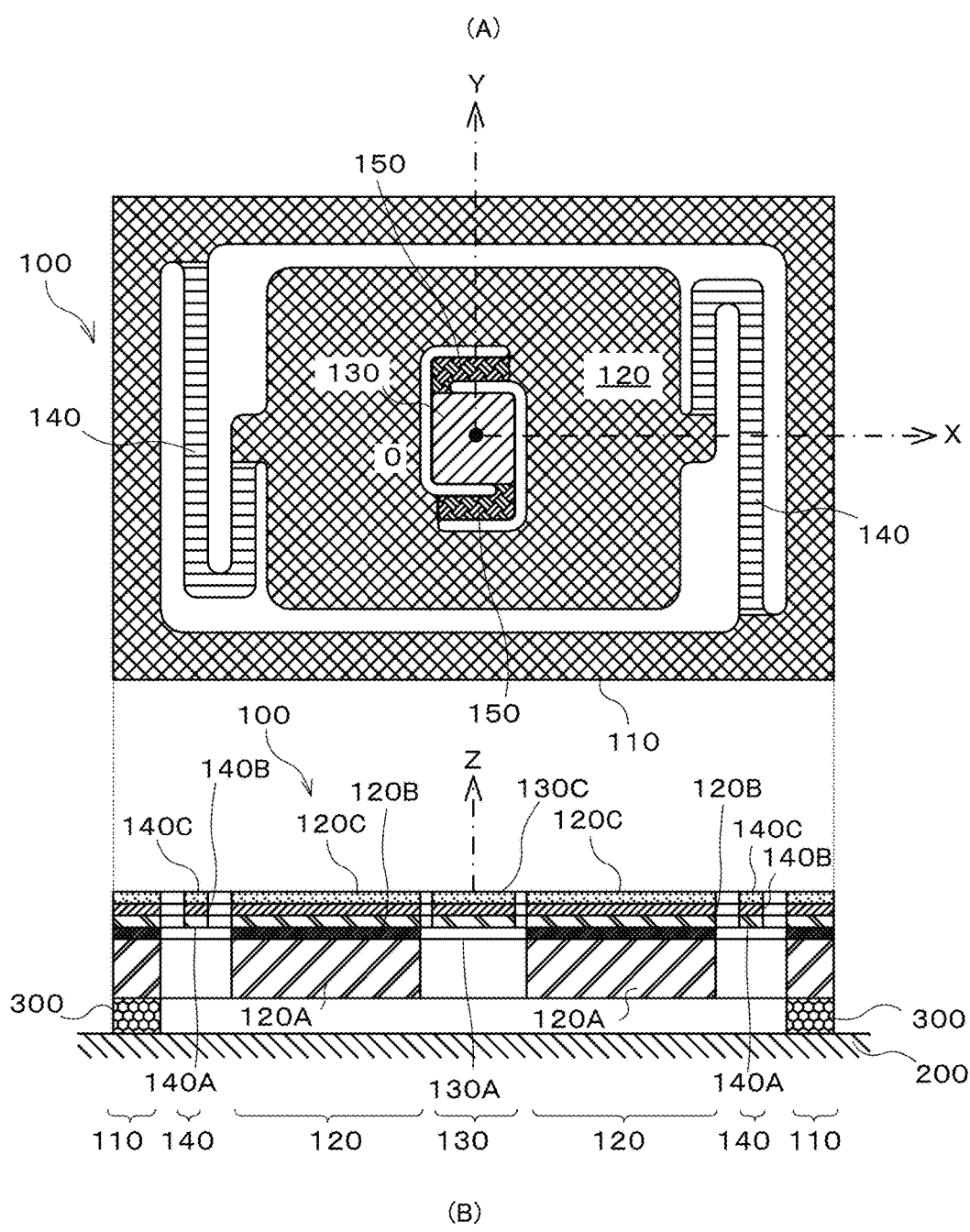
FIG. 32 illustrates a main structure (excluding a layer D) of a movable reflective element with an actuator having a thickness adjusted.

FIG. 32(A) is a top view of the movable reflective element 100 with each of the actuators 140 and 150 having adjusted thickness, while FIG. 32(B) is a side cross-sectional view of the movable reflective element 100 taken along the XZ plane. The movable reflective element 100 also has a four-layer structure of the A layer, the B layer, the C layer, and the D layer, but the D layer is not depicted in FIGS. 32(A) and (B). The hatch patterns in FIG. 32(A) are not intended to indicate the cross-sections but rather the region having the same thickness.

As illustrated in FIG. 32(A), the movable reflective element 100 has the fixed frame 110, the movable frame 120, the mirror 130, the actuators 140, and the actuators 150. FIG. 32(A) illustrates a layer structure of each component illustrated in the top view of FIG. 32(B).

When the thickness of the actuator 140 is defined as T1 and the thickness of the actuator 150 is defined as T2 in the movable reflective element 100 illustrated in FIGS. 32(A) and 32(B), the thickness T1 and the thickness T2 are set to be different values. Specifically, the thickness T1 of the actuator 140 is less than the thickness T2 of the actuator 150. The thickness T3 of the movable frame 120 is greater than the thickness T2 of the mirror 130 because the mirror 130 is supported in the suspended state inside the movable frame 120.

For convenience, in FIGS. 32(A) and 32(B), the region (portion of the actuator 140) having the thickness T1 is depicted with a striped hatch pattern, the regions (portion of the actuator 150, portion of the mirror 130) having the thickness T2 are depicted with a basket-weave hatch pattern and a hatch pattern of equally spaced oblique lines, and the region (portion of the fixed frame 110) having the thickness T3 is depicted with a checked hatch pattern.

For the thickness T1 and T2, when T1 is set less than T2, the relationship between the k-order resonance frequency fx(k) for the direction along the X axis of the mirror 130 and the k-order resonance frequency fy(k) for the direction along the Y axis of the mirror 130 can be expressed as fx(k)>fy(k). Thus, implementation is easier of the structure in which, as in the example above, the resonance frequency for the direction along the X axis is 10 kHz and the resonance frequency for the direction along the Y axis is 100 Hz. In fact, it suffices that assuming k=1, the relationship between the first-order resonance frequency fx(1) for the direction along the X axis of the mirror 130 and the first-order resonance frequency fy(1) for the direction along the Y axis of the mirror 130 is set to fx(1)>fy(1).

The same applies to the movable reflective elements 100 according to the other embodiments. In general, designing the thickness T1 of the actuator 140 to be smaller than the thickness T2 of the actuator 150 achieves the effect of making the resonance frequency of the direction along the X axis of the mirror 130 higher than the resonance frequency of the direction in the Y axis of the mirror 130. Conversely, of course, setting of T2 less than T1 may be performed in the case of setting the resonance frequency in the direction along the Y axis to be higher than the resonance frequency along the X axis.

Although the method for adjusting the width of each of the actuators 140 and 150 and the method for adjusting the thickness of each of the actuators 140 and 150 (FIGS. 32(A) and 32(B)) have been described as the adjustment method for making the resonance frequencies fx and fy different, a method for adjusting the length of each of the actuators 140 and 150 can be alternatively used. Of course, any combination of these methods can be selected for adjustment. In the actual designing process, a structure having desired resonance frequencies may be determined by determining the resonance frequency in each coordinate axis through simulations based on three-dimensional design data and repeating changes of design through trial-and-error.

Feedback Control

Figure 33:
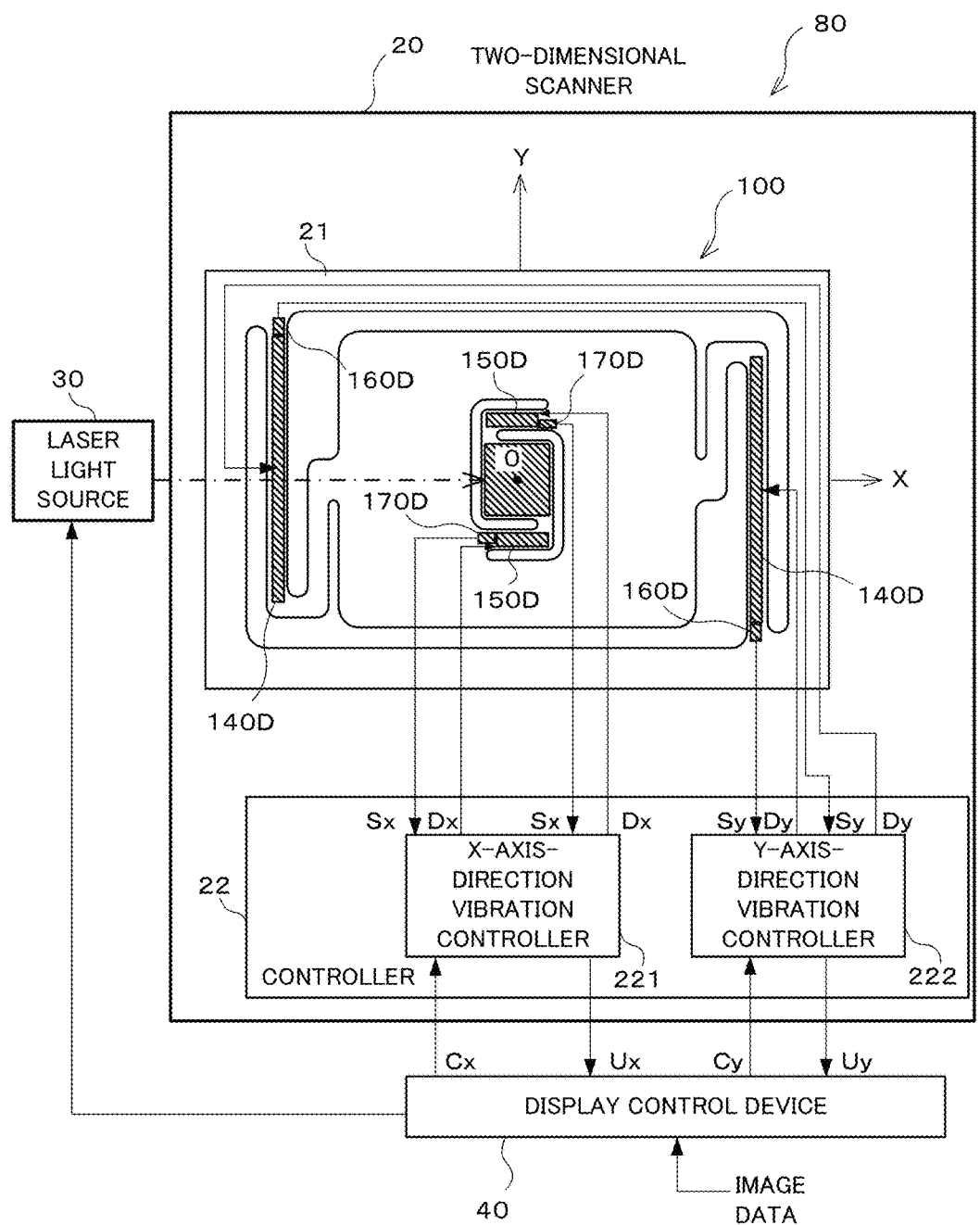
FIG. 33 is a schematic diagram of a projector with feedback control functions.

As described above, the controller 22 included in the projector 80 illustrated in FIG. 29 has a function of driving the reflective surface M of the movable reflective element 100 to vibrate in the X-axis direction and the Y-axis direction, but in practice, the controller 22 further may have a feedback control function for proper drive of the reflective surface M. FIG. 33 is a schematic diagram of the projector 80 with such a feedback control function. The hatching in the top view of the movable reflective element 100 is not intended to indicate the cross-section, but rather to clearly indicate a pattern of planar view shape of the D layer.

The two-dimensional scanner 20 includes the movable reflective element 100 and the controller 22. The movable reflective element 100 has, for example, a structure similar to the movable reflective element 100 illustrated in FIG. 17(A).

The movable reflective element 100 illustrated in FIG. 17(A) includes the pair of actuators 140 and the pair of actuators 150. Each actuator 140 includes two piezoelectric elements (one for the D layer (upper electrode layer) 140D and the other for the D layer (upper electrode layer) 160D) formed therein, while each actuator 150 includes two piezoelectric elements (one for the D layer (upper electrode layer) 150D and the other for the D layer (upper electrode layer) 170D) formed therein.

That is, the actuator 140 and the actuator 150 have a total of four piezoelectric elements. A part of the four piezoelectric elements functions as a drive piezoelectric element, and another part functions as a detection piezoelectric element. Specifically, the piezoelectric elements formed in regions of the D layers (upper electrode layer) 140D and 150D function as drive piezoelectric elements, and the piezoelectric elements formed in regions in the D layer (upper electrode layer) 160D and 170D function as detection piezoelectric elements.

The four piezoelectric elements have the same basic layer structure, and thus have no difference in the physical configuration or the basic functions. Here, the distinction made by referring to the piezoelectric elements as the "drive piezoelectric elements" and the "detection piezoelectric elements" is made for distinction of the functions as viewed from the controller 22 side. The B layer (lower electrode layer) 100B of each piezoelectric element is fixed to the ground potential, and each of the D layers (upper electrode layer) 140D, 150D, 160D, and 170D are connected to an X-axis-direction vibration controller 221 or a Y-axis-direction vibration controller 222 included in the controller 22 illustrated in FIG. 33.

Here, the X-axis-direction vibration controller 221 provides an X-axis-direction drive signal Dx to the D layer (upper electrode layer) 150D, while the Y-axis-direction vibration controller 222 provides a Y-axis-direction drive signal Dy to the D layer (upper electrode layer) 140D. These drive signals Dx and Dy are, for example, drive signals illustrated in FIG. 30A or 31A. Conversely, a signal indicating the voltage of the D layer (upper electrode layer) 170D is fed back to the X-axis-direction vibration controller 221 as an X-axis-direction detection signal Sx, while a signal indicating the voltage of the D layer (upper electrode layer) 160D is fed back to the Y-axis-direction vibration controller 222 as a Y-axis-direction detection signal Sy.

The X-axis-direction vibration controller 221 performs feedback control by generating the X-axis-direction drive signal Dx by referencing this X-axis-direction detection signal Sx as a feedback signal, and the Y-axis-direction vibration controller 222 performs feedback control by generating the Y-axis-direction drive signal Dy by referencing the Y-axis-direction detection signal Sy as a feedback signal.

Here, the C layer (piezoelectric material layer) 100C included in the piezoelectric elements formed in the actuators 140 and 150 has the property of stretching and contracting elastically in the longitudinal direction as illustrated in FIGS. 5B and 5C upon application of the voltage with the predetermined polarity across the D layer (upper electrode layer) 100D and the B layer (lower electrode layer) 100B, as mentioned above. In light of this property, when the piezoelectric element is taken to be a drive element, the piezoelectric element can be an element that causes mechanical deformation (stress) upon application of the voltage, but conversely, when the piezoelectric element is taken to be a detection element, the piezoelectric element can be an element that detects the caused mechanical deformation (stress) as an electrical signal.

Specifically, the piezoelectric elements illustrated in FIG. 5A have a polarization effect that causes a positive charge at the D layer (upper electrode layer) 100D side and a negative charge at the B layer (lower electrode layer) 100B side upon deformation caused as illustrated in FIG. 5B by the external force, and also have a polarization effect that causes a negative charge at the D layer (upper electrode layer) 100D side and a positive charge at the B layer (lower electrode layer) 100B side upon deformation caused as illustrated in FIG. 5(C) by the external force. The above-described X-axis-direction detection signal Sx is a signal indicating charge generated on the D layer (upper electrode layer) 170D due to the deformation of the actuator 150, and indicates a degree of stretching and contracting of the upper surface of the actuator 150 in the deformed state as illustrated in FIGS. 7B and 7C. Similarly, the above-described Y-axis-direction detection signal Sy is a signal indicating charge generated on the D layer (upper electrode layer) 160D due to the deformation of the actuator 140, and indicates a degree of stretching and contracting of the upper surface of the actuator 140 in the deformed state as illustrated in FIGS. 18B and 18C.

Upon supply of the drive signals as the X-axis-direction drive signals Dx and the Y-axis-direction drive signals Dy, the drive piezoelectric element formed on each of the actuators 140 and 150 repeats an stretching and contracting motion at a given cycle, which also causes an stretching and contracting motion at a given cycle on the detection piezoelectric element formed on each of the actuators 140 and 150. The X-axis-direction detection signal Sx and the Y-axis-direction detection signal Sy that are returned to the controller 22 as the feedback signals are signals indicating such a cyclic stretching and contracting motion of each of the actuators 140 and 150, and thus are signals indicating the vibration in the X-axis direction and the Y-axis direction of the mirror 130.

As mentioned above, the laser beam irradiated by the laser light source 30 reflects at the reflective surface M of the mirror 130 to form the spot S at a predetermined position on the screen 10. Thus the X-axis-direction detection signal Sx corresponds to the signal indicating the position of the spot S in the X-axis direction, while the Y-axis-direction detection signal Sy corresponds to the signal indicating the position of the spot S in the Y-axis direction. The X-axis-direction vibration controller 221 can perform feedback control to generate the X-axis-direction drive signal Dx for scan of the spot S on the screen 10 in the direction along the X axis on the basis of the signal Sx indicating the position of the spot S on the screen 10 in the X-axis direction. Similarly, the Y-axis-direction vibration controller 222 can perform feedback control to generate the Y-axis-direction drive signal Dy for scan of the spot S on the screen 10 in the direction along the Y axis on the basis of the signal Sy indicating the position of the spot S on the screen 10 in the direction along the Y axis.

Although the feedback controls provided for the movable reflective element 100 illustrated in FIG. 33 have been described, it can generally be stated that for a plurality of piezoelectric elements that is provided in the respective one or more actuators 140 and 150 of the movable reflective element 100, a part of the plurality of piezoelectric elements is caused to function as the drive piezoelectric element, and another part is caused to function as the detection piezoelectric element. Here, the drive piezoelectric element functions to cause the mirror 130 to oscillate in accordance with the drive signal supplied by the controller 22, and the detection piezoelectric element functions to feed back to the controller 22 the detection signal indicating charge generated due to the oscillation of the mirror 130. In this way, the controller 22 can perform feedback control with respect to the drive signals on the basis of the detection signals.

Specifically, the controller 22 is provided with the X-axis-direction vibration controller 221 and the Y-axis-direction vibration controller 222. Here, the X-axis-direction vibration controller 221 may generate the X-axis-direction drive signal Dx supplied to the drive piezoelectric element provided in the actuator 150 on the basis of the X-axis-direction detection signal Sx that is fed back from the detection piezoelectric element provided in the actuator 150 extending along the X axis. The Y-axis-direction vibration controller 222 may generate the Y-axis-direction drive signal Dy supplied to the drive piezoelectric element provided in the actuator 140 on the basis of the Y-axis-direction detection signal Sy that is fed back from the detection piezoelectric element provided in the actuator 140 extending along the Y axis.

In this way, with the controller 22 having the feedback control functions, the controller 22 can monitor whether the mirror 130 oscillates properly, and if not, performs control automatic correction of the improper oscillating motion.

The display control device 40 illustrated in FIG. 33 is a device for causing an image to be displayed on the screen 10 on the basis of externally provided image data. The display control device 40 provides to the laser light source 30 a modulation signal based on the image data (data indicating pixel values of individual pixels) at a predetermined timing, and provides an X-axis-direction scan control signal Cx to the X-axis-direction vibration controller 221 and a Y-axis-direction scan control signal Cy to the Y-axis-direction vibration controller 222.

In this example case, the X-axis-direction scan control signal Cx contains information indicating a predetermined amplitude Gx and a predetermined frequency φx for the direction along the X axis, and the Y-axis-direction scan control signal Cy contains information indicating a predetermined amplitude Gy and a predetermined frequency φy for the direction along the Y axis. The display control device 40 can set the amplitude and the frequency of the oscillatory motion of the mirror 130 to a desired value using these scan control signals Cx and Cy. The larger image is displayed on the screen 10 with the amplitudes Gx and Gy set to greater values, and the image is displayed on the screen 10 at a higher frame rate with the frequencies φx and φy set to higher values.

In practice, as mentioned above, it is preferable to enable efficient vibration that the predetermined frequency φx for the direction along the X axis is set to the X-axis-direction resonance frequency fx unique to the movable reflective element 100, while the predetermined frequency φy for the direction along the Y axis is set to the Y-axis-direction resonance frequency fy unique to the movable reflective element 100.

The X-axis-direction vibration controller 221 provides a feedback control to increase and decrease the amplitude and the frequency of the X-axis-direction drive signal Dx so that the amplitude and the frequency of the fed-back X-axis-direction detection signal Sx is a value that is in accordance with the predetermined amplitude Gx and the predetermined frequency φx indicated by the X-axis-direction scan control signal Cx. Similarly, the Y-axis-direction vibration controller 222 provides a feedback control to increase and decrease the amplitude and the frequency of the Y-axis-direction drive signal Dy so that the amplitude and the frequency of the fed-back Y-axis-direction detection signal Sy is a value that is in accordance with the predetermined amplitude Gy and the predetermined frequency φy indicated by the Y-axis-direction scan control signal Cy.

The X-axis-direction vibration controller 221 provides an X-axis-direction scan position signal Ux to the display control device 40, while the Y-axis-direction vibration controller 222 provides a Y-axis-direction scan position signal Uy to the display control device 40. Here, the X-axis-direction scan position signal Ux is a signal indicating the current position (phase) of the spot S on the screen 10 for the direction along the X axis, while the Y-axis-direction scan position signal Uy is a signal indicating the current position (phase) of the spot S on the screen 10 for the direction along the Y axis. These scan position signals Ux and Uy can be generated on the basis of the respective phases of the X-axis-direction detection signal Sx and the Y-axis-direction detection signal Sy.

Since the display control device 40 can recognize the current position of the spot S on the screen 10 on the basis of these scan position signals Ux and Uy, the display control device 40 provides, as a modulation signal to the laser light source 30, the data indicating pixel value of pixel in accordance with the position, based on the image data. The laser light source 30 can modulate the intensity of the generated laser beam on the basis of the provided modulation signal. Thus, the pixel that is proper in accordance with the position can be displayed at the position of the spot S on the screen 10 even when the "figure-eight-shaped scanning scheme" as illustrated in FIG. 31B is used.

Self-Excited Vibration Control

In the above description, the mirror 130 oscillating at the resonance frequencies inherent to the individual axial directions when the mirror 130 is caused to oscillate is described as obtaining good energy efficiency, and designing the natural resonance frequencies to be frequencies of the intended drive signals is described as preferable if the movable reflective element 100 has a predetermined application. In addition, commanding of the vibration at the unique resonance frequencies fx and fy by the control signals Cx and Cy provided from the display control device 40 to the controller 22 is described above as preferable.

In fact, however, there may be some difficulties in indicating the accurate resonance frequencies fx and fy of the movable reflective element 100 by the display control device 40. This may occur because mass-produced products based on the same design drawing do not have all the same natural resonance frequency of the movable reflective element 100. A first factor is the occurrence of the dimensional variations among the individual products due to variations in the mass production line. Even industrial products produced in accordance with the same specification inevitably have slight dimensional variations among the individual products.

A second factor is the occurrence of stress distortion unique to the movable reflective element 100 due to the manner of mounting when the movable reflective element 100 is mounted in the projector. For the projector 80 illustrated in FIG. 29, for example, the movable reflective element 100 is required to be mounted inside the body of the projector 80 as a component of the two-dimensional scanner 20. In the mounting, fixing the fixed frame 110 using screws, soldering, adhesives, or the like may cause the stress distortion unique to the fixed frame 110 in accordance with the manner of mounting, which may be a cause of variations in resonance frequencies.

A third factor is variations of the external environment, such as temperature, in use. For example, the resonance frequencies vary greatly because the temperatures in the environment of use are greatly different in summer versus winter. In addition, in use with the movable reflective element 100 embedded in the projector, the temperature in the environment of use varies minute by minute because the temperature of the light source gradually increases after start-up.

Since the variations in the resonance frequencies are in fact inevitable due to such various factors, the projector 80 with the feedback control functions illustrated in FIG. 33 may suffer from difficulties in that the accurate indication of the resonance frequencies fx and fy inherent to the movable reflective element 100 cannot be provided by the control signals Cx and Cy from the display control device 40 side to the controller 22.

An example variation is described below that enables the mirror 130 to vibrate at the accurate resonance frequencies fx and fy even if the resonance frequencies vary due to the above-described various factors. The basic principle is to provide the X-axis-direction vibration controller 221 and the Y-axis-direction vibration controller 222 with self-excited vibration control functions. That is, the X-axis-direction vibration controller 221 performs X-axis-direction self-excited vibration control causing the mirror 130 to vibrate at a predetermined amplitude Gx and the resonance frequency fx for the direction along the X axis, while the Y-axis-direction vibration controller 222 performs Y-axis-direction self-excited vibration control causing the mirror 130 to vibrate at a predetermined amplitude Gy and the resonance frequency fy for the direction along the Y axis.

The X-axis-direction scan control signal Cx provided by the display control device 40 to the two-dimensional scanner 20 is a signal for scan instruction indicating that the scan is to be made at the predetermined amplitude Gx for the direction along the X axis, and does not contain information for specifying the frequency. Similarly, the Y-axis-direction scan control signal Cy provided by the display control device 40 to the two-dimensional scanner 20 is a signal for scan instruction indicating that the scan is to be made at the predetermined amplitude Gy for the direction along the Y axis, and does not contain information for specifying the frequency.

The two-dimensional scanner 20 drives the mirror 130 in an oscillatory motion on the basis of the scan instructions to cause the spot S, which is formed on the screen 10 by the laser beams reflected on the mirror 130, to move on the screen 10 in two dimensions. During this oscillatory motion, the amplitudes are controlled to be in accordance with the predetermined amplitudes Gx and Gy as instructed by the display control device 40, but the frequencies are self-determined by the two-dimensional scanner 20 without being externally specified.

Specifically, when the display control device 40 provides the X-axis-direction scan control signal Cx, which indicates the vibration at the predetermined amplitude Gx, to the X-axis-direction vibration controller 221 in the two-dimensional scanner 20, the X-axis-direction vibration controller 221 performs self-excited vibration control in the direction along the X axis on the basis of this X-axis-direction scan control signal Cx. Similarly, when the display control device 40 provides the Y-axis-direction scan control signal Cy, which indicates the vibration at the predetermined amplitude Gy, to the Y-axis-direction vibration controller 222 in the two-dimensional scanner 20, the Y-axis-direction vibration controller 222 performs self-excited vibration control in the direction along the Y axis on the basis of this Y-axis-direction scan control signal Cy.

Such self-excited vibration control can be provided by detection of phases of the X-axis-direction detection signal Sx and the Y-axis-direction detection signal Sy provided as the feedback signals. The can be achieved with the use of the basic principle that, in general, in a state in which a predetermined drive signal D is provided to an oscillating system to cause an oscillator to oscillate, when the actual movement of the oscillator is detected as a detection signal S, the phase difference between the drive signal D and the detection signal S is $\pi/2$ if the oscillator oscillates at the natural resonance frequency of the oscillator.

As illustrated in FIG. 33, the X-axis-direction drive signals Dx are provided from the X-axis-direction vibration controller 221 to the movable reflective element 100, and the X-axis-direction detection signals Sx are fed back to the X-axis-direction vibration controller 221 as the feedback signal. The detection signals Sx have slightly delayed phases with respect to the phases of the drive signals Dx. This phase delay results from the occurrence of delay time occurring from the mechanical deformation of the piezoelectric elements based on the drive signal Dx to the actual displacement thereof. According to the above-described basic principle, if the oscillation frequency in the direction along the X axis is the resonance frequency fx, the phase difference between the drive signal Dx and the detection signal Sx is $\pi/2$. Thus the X-axis-direction vibration controller 221 may perform feedback control to adjust the phase of the drive signal Dx so as to maintain a $\pi/2$ phase difference.

Similarly, the Y-axis-direction drive signals Dy are provided from the Y-axis-direction vibration controller 222 to the movable reflective element 100, and the Y-axis-direction detection signals Sy are fed back to the Y-axis-direction vibration controller 222 as the feedback signals. Here again, if the oscillation frequency in the direction along the Y axis is the resonance frequency fy, the phase difference between the drive signal Dy and the detection signal Sy is $\pi/2$. Thus the Y-axis-direction vibration controller 222 may perform feedback control to adjust the phase of the drive signal Dy so as to maintain a $\pi/2$ phase difference.

The X-axis-direction vibration controller 221 may incorporate a self-excited vibration circuit for performing feedback control that increases or decreases the amplitude of the X-axis-direction drive signal Dx on the basis of the amplitude of the fed-back X-axis-direction detection signal Sx so that the amplitude for the direction along the X axis of the mirror 130 is maintained at the predetermined amplitude Gx, and that maintains the $\pi/2$ phase difference between the X-axis-direction drive signal Dx and the X-axis-direction detection signal Sx so that the oscillation frequency for the direction along the X axis of the mirror 130 is maintained at the resonance frequency fx.

Similarly, the Y-axis-direction vibration controller 222 may incorporate a self-excited vibration circuit for performing feedback control that increases or decreases the amplitude of the Y-axis-direction drive signal Dy on the basis of the amplitude of the fed-back Y-axis-direction detection signal Sy so that the amplitude for the direction along the Y axis of the mirror 130 is maintained at the predetermined amplitude Gy, and that maintains the $\pi/2$ phase difference between the Y-axis-direction drive signal Dy and the Y-axis-direction detection signal Sy so that the oscillation frequency for the direction along the Y axis of the mirror 130 is maintained at the resonance frequency fy.

With the controller 22 having such self-excited vibration control functions, the two-dimensional scanner 20 can oscillate the mirror 130 autonomously at the accurate resonance frequencies without frequencies externally specified. That is, even when the resonance frequencies are different for individual products or vary in time depending on the temperature environment or the like, the mirror 130 can be vibrated at the correct resonance frequency and can maintain movement that has good energy efficiency.

The beam scanning scheme that the typical self-excited vibration circuit uses is the "figure-eight-shaped scanning scheme" as illustrated in FIG. 31B because the sine wave signals as illustrated in FIG. 31A need to be used as the drive signals Dx and Dy. This requires the display control device 40 to know the scan position of the spot S and provide to the laser light source 30 a modulation signal corresponding to the pixel in accordance with the position, in order to display the image properly on the screen 10. The X-axis-direction scan position signal Ux and the Y-axis-direction scan position signal Uy illustrated in FIG. 33 are signals provided to the display control device 40 to facilitate such display.

That is, the X-axis-direction vibration controller 221 provides to the display control device 40 the X-axis-direction scan position signal Ux indicating that the phase of the X-axis-direction detection signal Sx reaches a predetermined value, while the Y-axis-direction vibration controller 222 provides to the display control device 40 the Y-axis-direction scan position signal Uy indicating that the phase of the Y-axis-direction detection signal Sy reaches a predetermined value. The display control device 40 refers to the timing indicated by the X-axis-direction scan position signal Ux and the Y-axis-direction scan position signal Uy, and provides to the laser light source 30 the modulation signal corresponding to the individual pixel included in the image data at the proper timing (timing at which the spot S is positioned on the screen 10 in place corresponding to the pixel).

For example, if a signal indicating the points of time when the phase of the X-axis-direction detection signal Sx reaches 0, π/2, π, and 3π/2 is used as the X-axis-direction scan position signal Ux, the display control device 40 is notified of the timing of the spot S on the screen 10 reaching each of the scan points Q1, Q2, Q3, ..., Q19 in FIG. 31B. Similarly, if a signal indicating the points of time when the phase of the Y-axis-direction detection signal Sy reaches 0, π/2, π, 3π/2 is used as the Y-axis-direction scan position signal Uy, the display control device 40 is notified of the timing of the spot S on the screen 10 reaching each of the scan points Q1, Q7 (first half), Q13, Q7 (second half) in FIG. 31B.

Of course, if a specific signal for notification of the points of time when the phase reaches 0, π/4, π/2, 3π/4, π, 5π/4, 3π/2, and 7π/4 is, for example, used as the scan position signals Ux and Uy, more accurate position information of the spot S can be provided.

In the above-described embodiments, both the X-axis-direction vibration controller 221 and the Y-axis-direction vibration controller 222 have the self-excited vibration control functions, although a configuration may be used in which only one of the controllers has the self-excited control function. For example, if only the X-axis-direction vibration controller 221 has the self-excited vibration control function, while the Y-axis-direction vibration controller 222 is provided with the Y-axis-direction scan control signal Cy having information that specifies the predetermined oscillation frequency φy, the self-excited vibration based on the resonance frequency fx occurs for the direction along the X axis, and an excited vibration based on the externally specified frequency φy occurs for the direction along the Y axis.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

This application claims the benefit of Japanese patent Application No. 2015-116270, filed on Jun. 9, 2015, the entire disclosure of which is incorporated by reference herein.

REFERENCE SIGNS LIST

10 Screen
20 Two-dimensional scanner
22 Controller
30 Laser light source
40 Display control device
80 Projector
100 Movable reflective element
100A A layer (substrate layer)
100A1 Support layer
100A2 BOX layer
100A3 Active layer
100B B layer
100C C layer
100D D layer
110 Fixed frame
110A A layer
110B B layer
110C C layer
111 Wide portion
120 Movable frame
120A A layer
120B B layer
120C C layer
130 Mirror
130A A layer
130B B layer
130C C layer
130D D layer (reflective layer)
140 Actuator (first actuator)
140A A layer (substrate layer, actuator body)
140B B layer (lower electrode layer)
140C C layer (piezoelectric material layer)
140D D layer (upper electrode layer)
140D1, 140D2, 140D11, 140D12, 140D21, 140D22, and 140D3 Upper electrode layer
150 Actuator (second actuator)
150A A layer (substrate layer, actuator body)
150B B layer (lower electrode layer)
150C C layer (piezoelectric material layer)
150D D layer (upper electrode layer)
160D, 170D D layer (detection electrode)
200 Base plate
220 Recessed portion
221 X-axis-direction vibration controller
222 Y-axis-direction vibration controller
240A, 240B, 240C, 250, 250A, 250B, and 250C Arm
300 Spacer
340A, 340B, 340C, 350A, 350B, and 350C Arm
400 Weight
500 Restriction
501 Restriction
S Spot

The invention claimed is:

1. A movable reflective element, comprising:
a plate-like fixed frame;
a plate-like movable frame disposed within the fixed frame to define a gap between the movable frame and the fixed frame;
a plate-like mirror including a reflective surface and disposed within the movable frame to define a gap between the mirror and the movable frame;
first actuators that are a pair of linear flexible members, each first actuator connecting the fixed frame to the movable frame and including piezoelectric elements formed in an extension extending in a first direction from an inner side of the fixed frame, the piezoelectric elements stretching and contracting in the first direction, the first actuators being disposed one on either side of the movable frame in a second direction that intersects the first direction, wherein deformation of the first actuators caused by stretching and contracting of the piezoelectric elements oscillates the movable frame about a first rotation axis in relation to the fixed frame; and
second actuators that are a pair of linear flexible members, each second actuator connecting the movable frame to the mirror and including piezoelectric elements formed in an extension extending in the second direction from an inner side of the movable frame, the piezoelectric elements stretching and contracting in the second direction, the second actuators are disposed one on either side of the mirror in the first direction, wherein deformation of the second actuators caused by stretching and contracting of the piezoelectric elements oscillates the mirror about a second rotation axis in relation to the movable frame, the second rotation axis intersecting the first rotation axis, wherein the extension of each first actuator in the first direction has a length that is longer than a distance between the inner side of the fixed frame to which the first actuator is connected and a middle point of an outer side of the movable frame in the first direction.

2. The movable reflective element according to claim 1, wherein each first actuator comprises:

a first arm including the piezoelectric elements and having one end connected to the inner side of the fixed frame, the first arm linearly extending in the first direction in the gap between the fixed frame and the movable frame from the one end beyond the middle point of the outer side of the movable frame;

a second arm having one end connected to another end of the first arm, the second arm extending in the second direction; and a third arm having one end connected to another end of the second arm and another end connected to the middle point of the outer side of the movable frame, the third arm extending along the first arm from the other end of the second arm in a direction opposite to a direction extending from the one end to the other end of the first arm.

3. The movable reflective element according to claim 2, wherein each second actuator comprises:

a fourth arm including the piezoelectric elements and having one end connected to the inner side of the movable frame, the fourth arm linearly extending in the second direction in the gap between the movable frame and the mirror from the one end beyond a middle point of an outer side of the mirror;

a fifth arm having one end connected to another end of the fourth arm, the fifth arm extending in the first direction; and a sixth arm having one end connected to another end of the fifth arm and another end connected to the middle point of the outer side of the mirror in the second direction, the sixth arm extending along the fourth arm from the other end of the fifth arm in a direction opposite to a direction extending from the one end to the other end of the fourth arm.

4. The movable reflective element according to claim 3, wherein the first actuators that are the pair of members are disposed with two-fold rotational symmetry around the mirror, the second actuators that are the pair of members are disposed with two-fold rotational symmetry around the mirror, and an orientation of the first arm from the one end to the other end and an orientation of the fourth arm from the one end to the other end are the same with respect to a rotational direction about the mirror.

5. The movable reflective element according to claim 3, wherein the first actuators that are the pair of members are disposed with two-fold rotational symmetry around the mirror, the second actuators that are the pair of members are disposed with two-fold rotational symmetry around the mirror, and an orientation of the first arm from the one end to the other end and an orientation of the fourth arm from the one end to the other end are opposite with respect to a rotational direction about the mirror.

6. The movable reflective element according to claim 2, wherein each second actuator comprises a seventh arm including the piezoelectric elements and having one end connected to the inner side of the movable frame and another end connected to a corner portion of the mirror, the seventh arm extending linearly in the second direction in the gap between the movable frame and the mirror from the one end beyond a middle point of an outer side of the mirror.

7. The movable reflective element according to claim 1, wherein each first actuator comprises an eighth arm including the piezoelectric elements and having one end connected to the inner side of the fixed frame and extending linearly in the first direction in the gap between the fixed frame and the movable frame from the one end beyond the middle point of the outer side of the movable frame, and each first actuator is connected to the movable frame at a portion other than the middle point of the outer side of the movable frame without turning back at another end of the eighth arm.

8. The movable reflective element according to claim 7, wherein each first actuator comprises a ninth arm extending in the second direction in the gap between the fixed frame and the movable frame from the other end of the eighth arm beyond the middle point of the outer side of the movable frame in the second direction and connected to a corner portion of the movable frame.

9. The movable reflective element according to claim 7, wherein each second actuator comprises a tenth arm including the piezoelectric elements and having one end connected to the inner side of the movable frame and extending linearly in the second direction in the gap between the movable frame and the mirror from the one end beyond the middle point of the outer side of the mirror, and each second actuator is connected to the mirror at a portion other than the middle point of the outer side of the mirror along the second direction without turning back at another end of the tenth arm.

10. The movable reflective element according to claim 9, wherein each second actuator comprises an eleventh arm extending in the first direction from the other end of the tenth arm beyond a middle point of the outer side of the mirror in the first direction and connected to a corner portion of the mirror.

11. The movable reflective element according to claim 1, wherein the movable frame includes recessed portions provided on two outer sides in the second direction, and each first actuator comprises:

a twelfth arm including the piezoelectric elements and having one end connected to the inner side of the fixed frame, the twelfth arm extending linearly in the first direction in the gap between the fixed frame and the movable frame from the one end beyond the middle point of the outer side of the movable frame;

a thirteenth arm extending in the second direction from another end of the twelfth arm to a middle point of the outer side of the movable frame; and a fourteenth arm having one end connected to the other end of the twelfth arm and another end connected to the recessed portion.

12. The movable reflective element according to claim 11, wherein each second actuator comprises:

a fifteenth arm including the piezoelectric elements and having one end connected to the movable frame, the fifteenth arm extending linearly in the second direction in the gap between the movable frame and the mirror from the one end beyond the middle point of the outer side of the mirror;

a sixteenth arm extending in the first direction in the gap between the movable frame and the mirror from another end of the fifteenth arm to the middle point of the outer side of the movable frame; and a seventeenth arm having one end connected to another end of the sixteenth arm and another end connected to the middle point of the outer side of the mirror.

13. The movable reflective element according to claim 11, further comprising at least one of:

a first wide portion provided in a portion connecting each first actuator to the fixed frame, the first wide portion having a width larger than a width of the first actuator; or a second wide portion provided in a portion connecting each second actuator to the movable frame, the second wide portion having a width larger than a width of the second actuator.

14. The movable reflective element according to claim 1, wherein independently driven sets of the piezoelectric elements are included in at least one of the first actuator or the second actuator.

15. The movable reflective element according to claim 1, further comprising at least one of:

first detection electrodes each having a width smaller than a width of the first actuator, the first detection electrodes detecting displacement of the respective first actuators; or second detection electrodes each having a width smaller than a width of the second actuator, the second detection electrodes detecting displacement of the respective second actuators.

16. The movable reflective element according to claim 15, wherein each first detection electrode is provided in a portion connecting the corresponding first actuator to the fixed frame, and each second detection electrode is provided in a portion connecting the corresponding second actuator to the movable frame.

17. The movable reflective element according to claim 1, wherein the movable frame is formed thicker than the mirror.

18. The movable reflective element according to claim 1, wherein at least one of the first actuator or the second actuator has a width that varies from the fixed frame toward the movable frame or from the movable frame toward the mirror.

19. The movable reflective element according to claim 1, wherein the movable frame further includes a weight attached thereto.

20. The movable reflective element according to claim 1, further comprising at least one of:

a first restriction extending from the inner side of the movable frame and disposed in the gap between the movable frame and the mirror, the first restriction restricting movement of the mirror to the movable frame; or a second restriction extending from the inner side of the fixed frame and disposed in the gap between the fixed frame and the movable frame, the second restriction restricting movement of the movable frame to the fixed frame.

21. The movable reflective element according to claim 20, wherein the mirror has an outer periphery formed to avoid the first restriction and to have the center of gravity of the mirror in a stationary state to be the center of the mirror, and the movable frame has an outer periphery formed to avoid the second restriction and to have the center of gravity of the movable frame in a stationary state to be the center of the movable frame.

22. A two-dimensional scanner, comprising:

the movable reflective element according to claim 1; and a controller for causing the movable reflective element to be driven two-dimensionally to perform two-dimensional scanning.

* * * * *